(12) United States Patent
Fujimori

(10) Patent No.: US 12,403,692 B2
(45) Date of Patent: Sep. 2, 2025

(54) INKJET PRINT HEAD

(71) Applicant: ROHM CO., LTD.

(72) Inventor: Yoshikazu Fujimori, Koto (JP)

(73) Assignee: ROHM CO., LTD., Kyoto (JP)

( * ) Notice: Subject to any disclaimer, the term of this patent is extended or adjusted under 35 U.S.C. 154(b) by 192 days.

(21) Appl. No.: 18/253,310

(22) PCT Filed: Oct. 21, 2021

(86) PCT No.: PCT/JP2021/039019
§ 371 (c)(1),
(2) Date: May 17, 2023

(87) PCT Pub. No.: WO2022/107546
PCT Pub. Date: May 27, 2022

(65) Prior Publication Data
US 2024/0009999 A1    Jan. 11, 2024

(30) Foreign Application Priority Data

Nov. 20, 2020   (JP) ................. 2020 193728

(51) Int. Cl.
*B41J 2/14*     (2006.01)
*H10N 30/00*     (2023.01)
(Continued)

(52) U.S. Cl.
CPC ........ *B41J 2/14274* (2013.01); *H10N 30/708* (2024.05); *H10N 30/875* (2023.02); *H10N 30/883* (2023.02); *H10N 30/2023* (2023.02)

(58) Field of Classification Search
CPC ............... B41J 2/14274; B41J 2/14233; B41J 2202/18; B41J 2002/14241;
(Continued)

(56) References Cited

U.S. PATENT DOCUMENTS

| | | |
|---|---|---|
| 2010/0141713 A1 | 6/2010 | Hoisington et al. |
| 2016/0043299 A1 | 2/2016 | Fujimori et al. |
| 2019/0255850 A1 | 8/2019 | Kato et al. |

FOREIGN PATENT DOCUMENTS

JP     2018069685 A     5/2018

OTHER PUBLICATIONS

International Search Report issued for International Patent Application No. PCT/JP2021/039019, Date of mailing: Jan. 11, 2022, 5 pages including English translation.
(Continued)

*Primary Examiner* — Kristal Feggins
(74) *Attorney, Agent, or Firm* — HSML P.C.

(57) ABSTRACT

An inkjet print head includes an actuator substrate that has an ink flow passage including a pressure chamber, a movable film formation layer that includes a movable film disposed on the pressure chamber and demarcating a top surface portion of the pressure chamber, a piezoelectric element that includes a lower electrode disposed on the movable film, a piezoelectric film formed on the lower electrode, and an upper electrode formed on the piezoelectric film, a hydrogen barrier film that covers at least entire side surfaces of the upper electrode and the piezoelectric film among surfaces of the piezoelectric element, an interlayer insulating film that is formed on the movable film formation layer such as to cover the hydrogen barrier film, and a wiring that is formed on the interlayer insulating film and is connected to the piezoelectric element and a fuse is inserted in an intermediate portion of the wiring.

13 Claims, 82 Drawing Sheets

(51) Int. Cl.
*H10N 30/87* (2023.01)
*H10N 30/88* (2023.01)
*H10N 30/20* (2023.01)

(58) Field of Classification Search
CPC ........... B41J 2002/14491; B41J 2/1623; B41J 2/161; B41J 2/1626; B41J 2/1631; B41J 2/1632; B41J 2/1635; B41J 2/1646; H10N 30/708; H10N 30/875; H10N 30/883; H10N 30/2023
See application file for complete search history.

(56) References Cited

OTHER PUBLICATIONS

Written Opinion issued for International Patent Application No. PCT/JP2021/039019, Date of mailing: Jan. 11, 2022, 5 pages including English machine translation.

Office Action issued for German Patent Application No. 11 2021 005 565.8, dated Nov. 7, 2023, 12 pages including informal English translation.

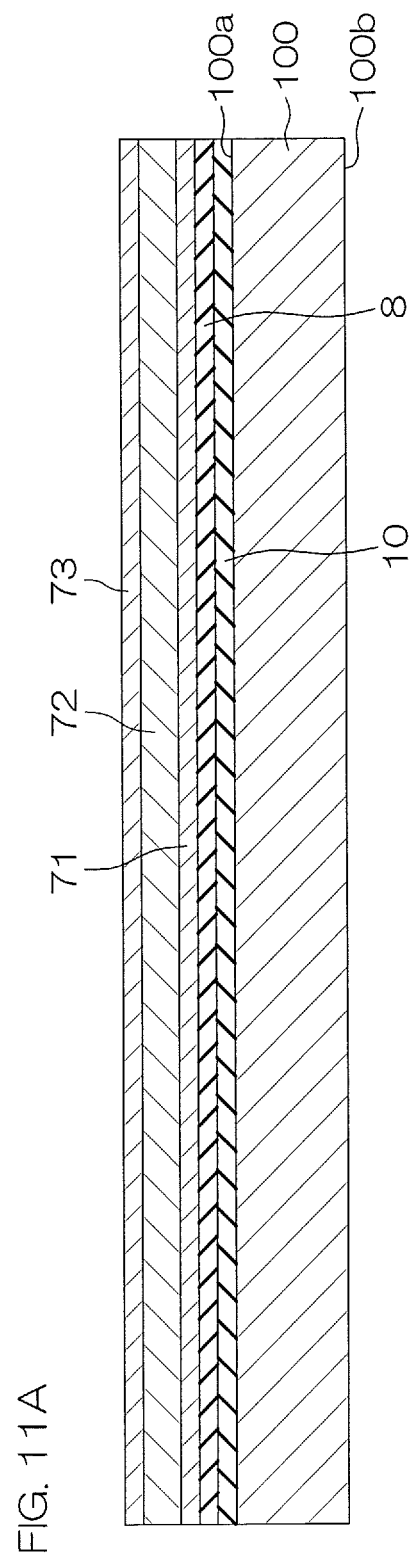

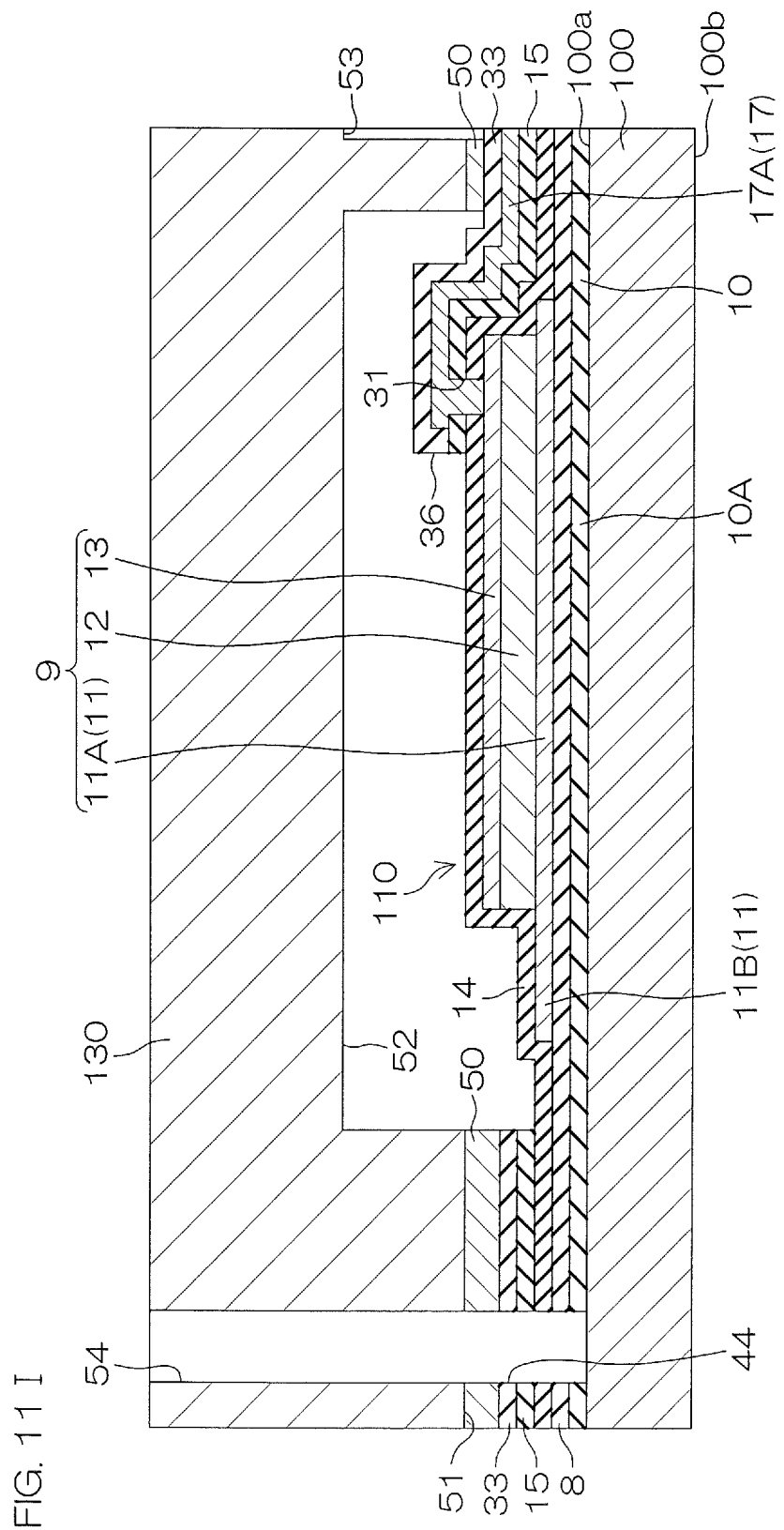

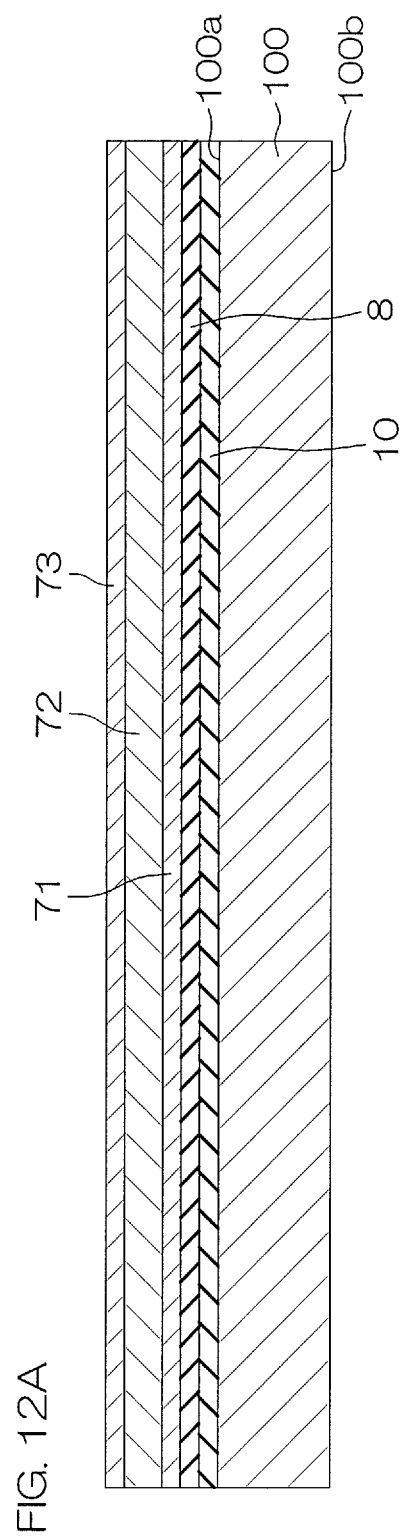

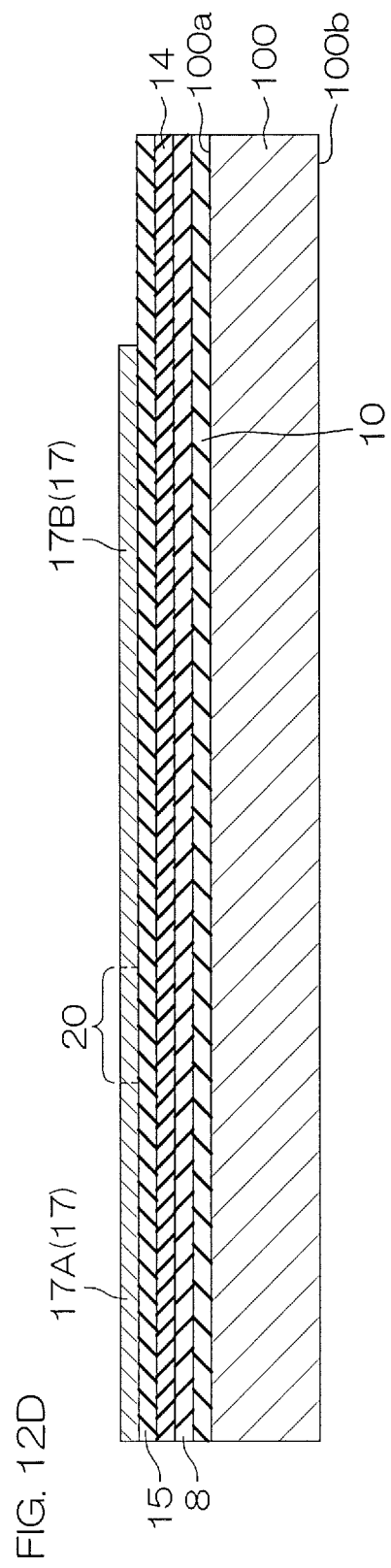

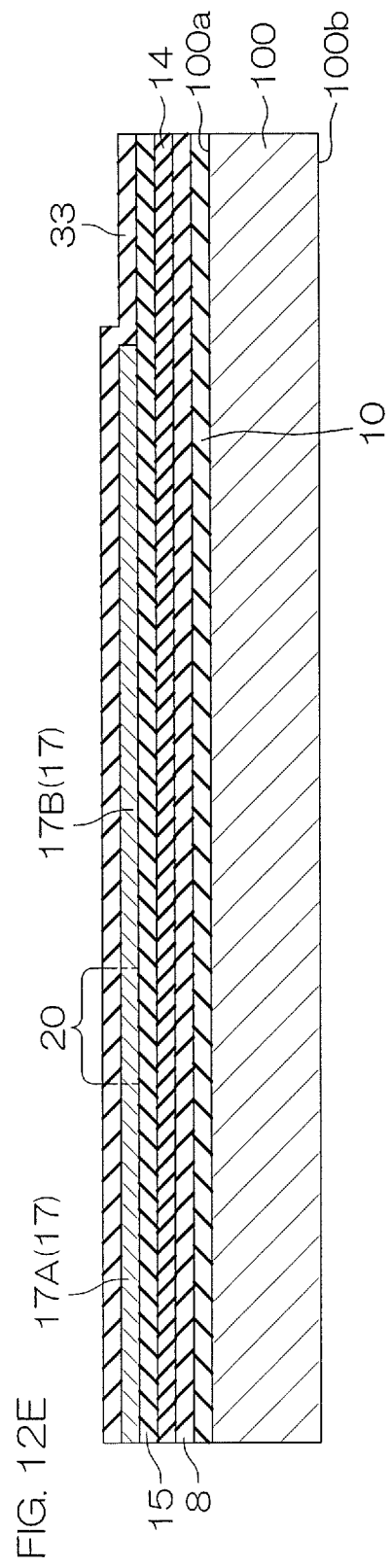

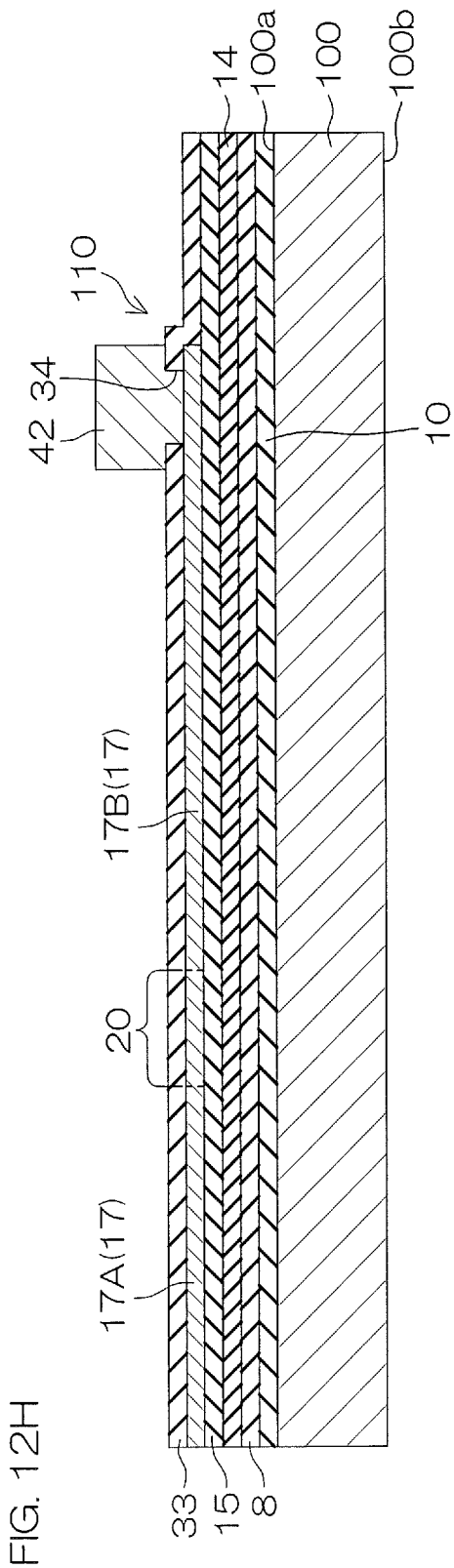

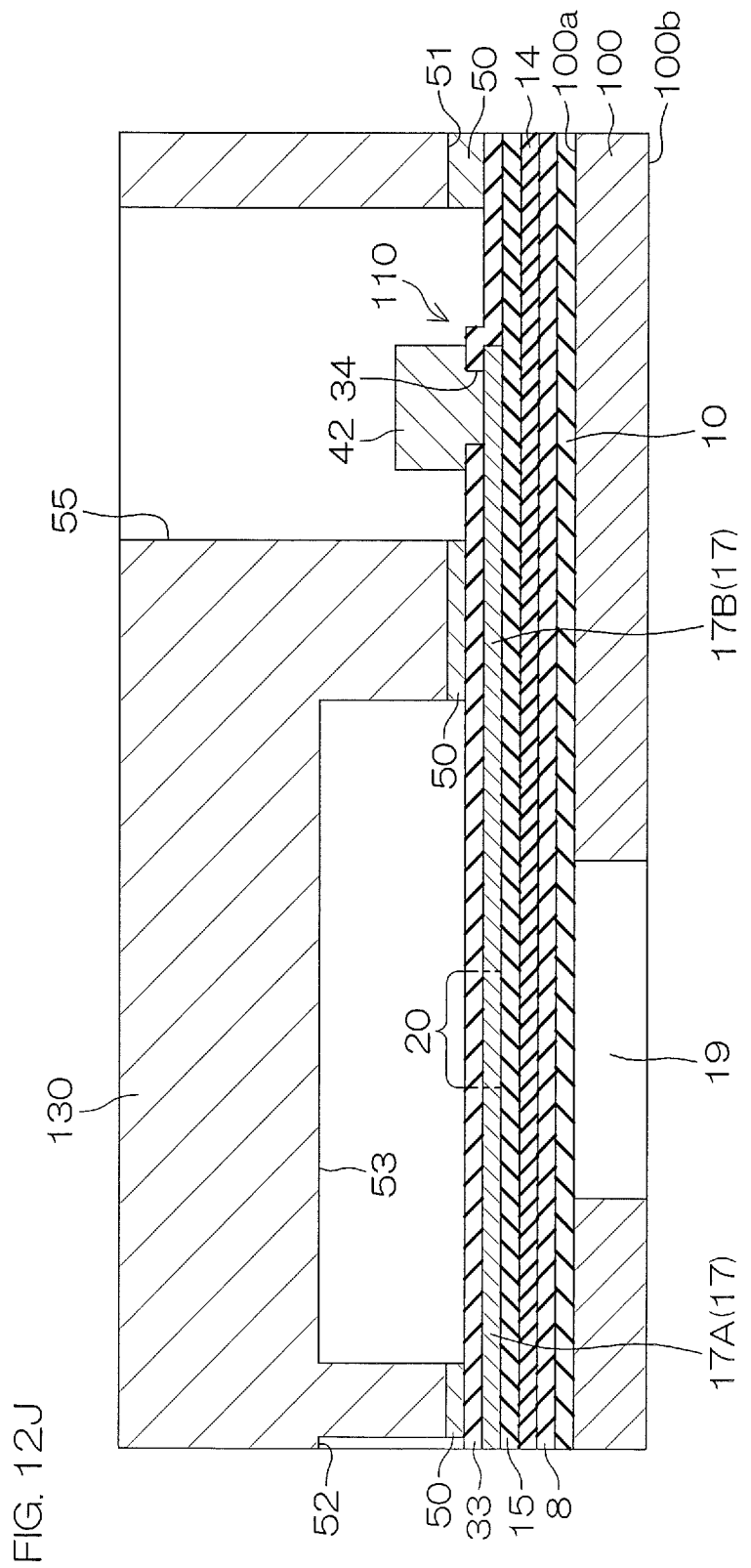

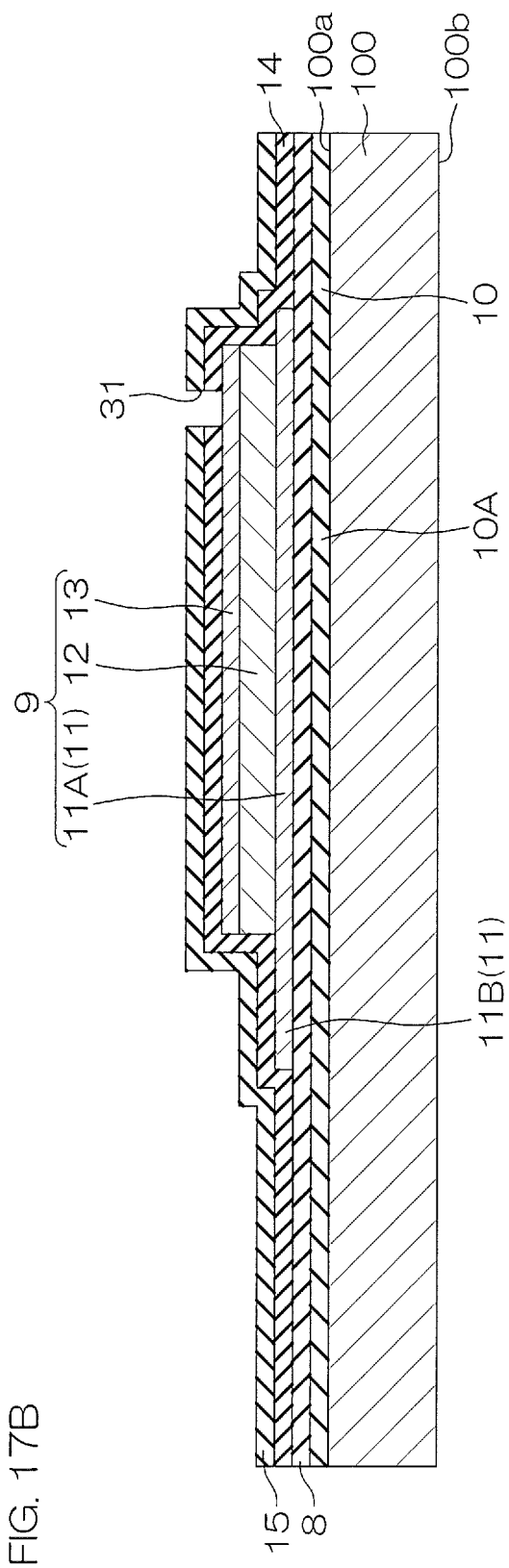

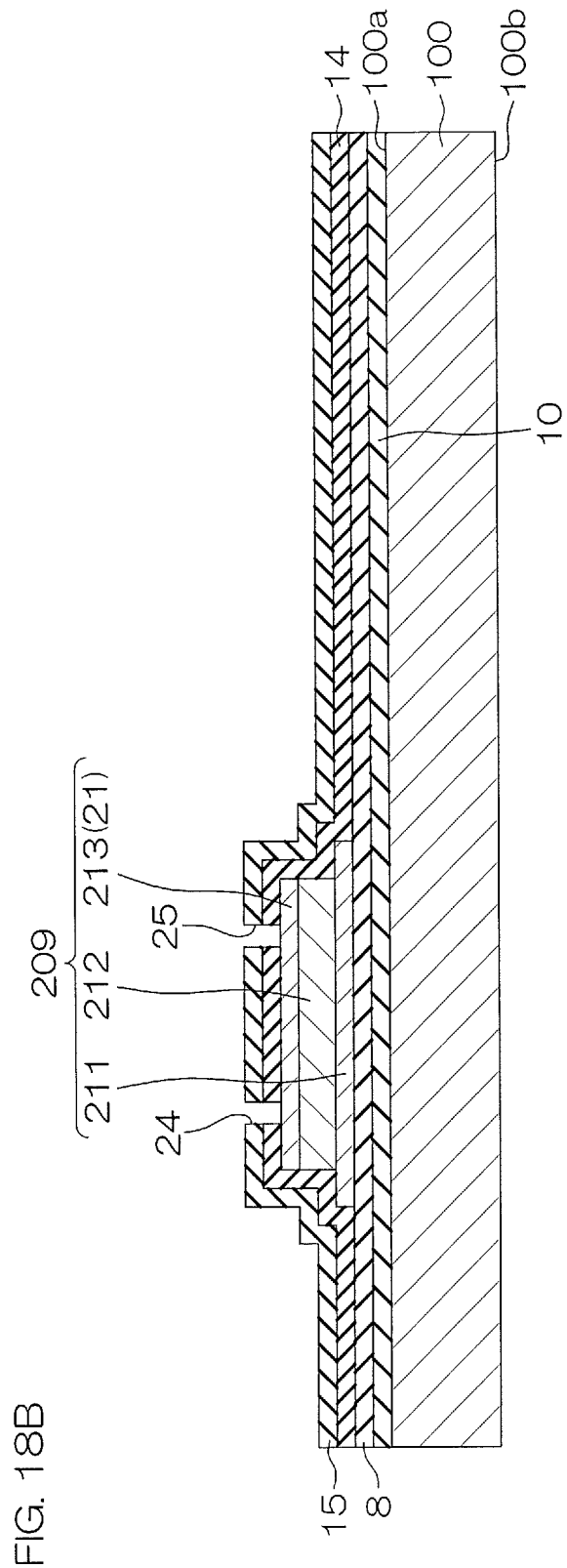

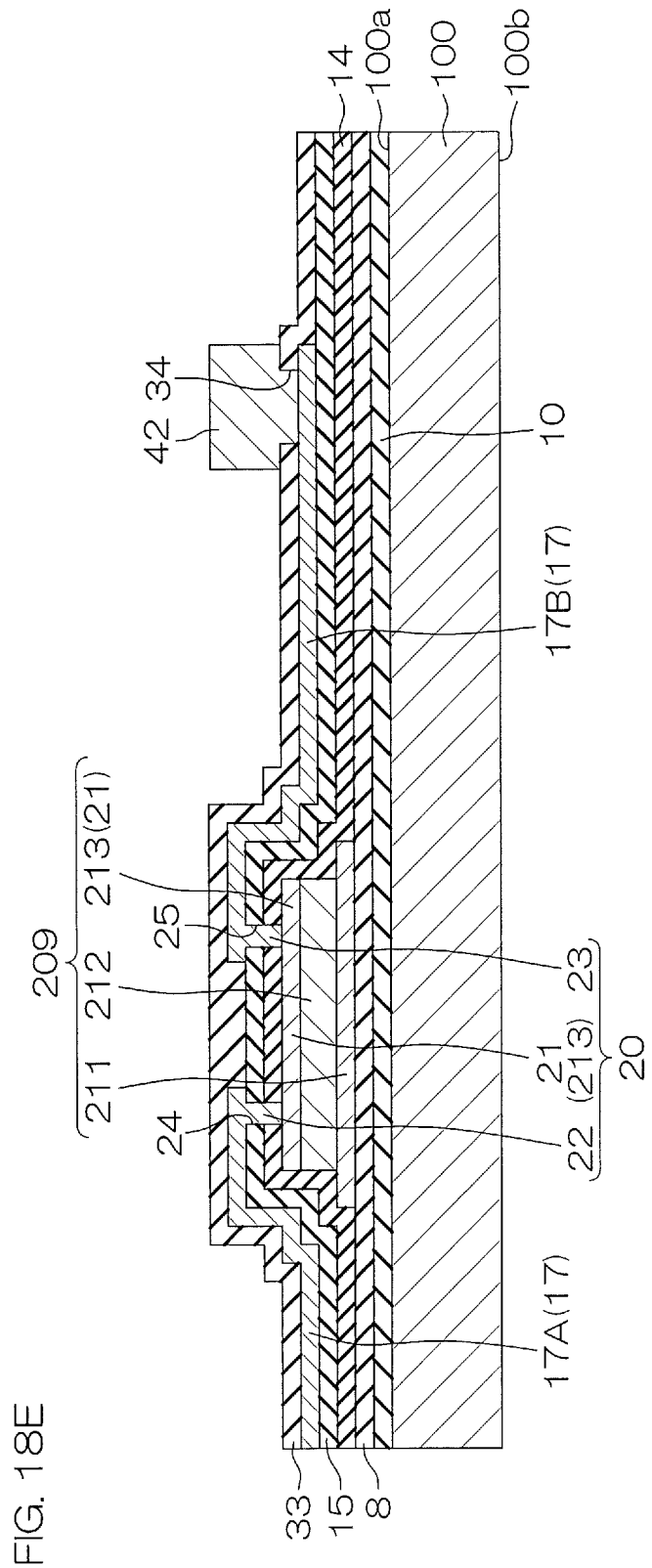

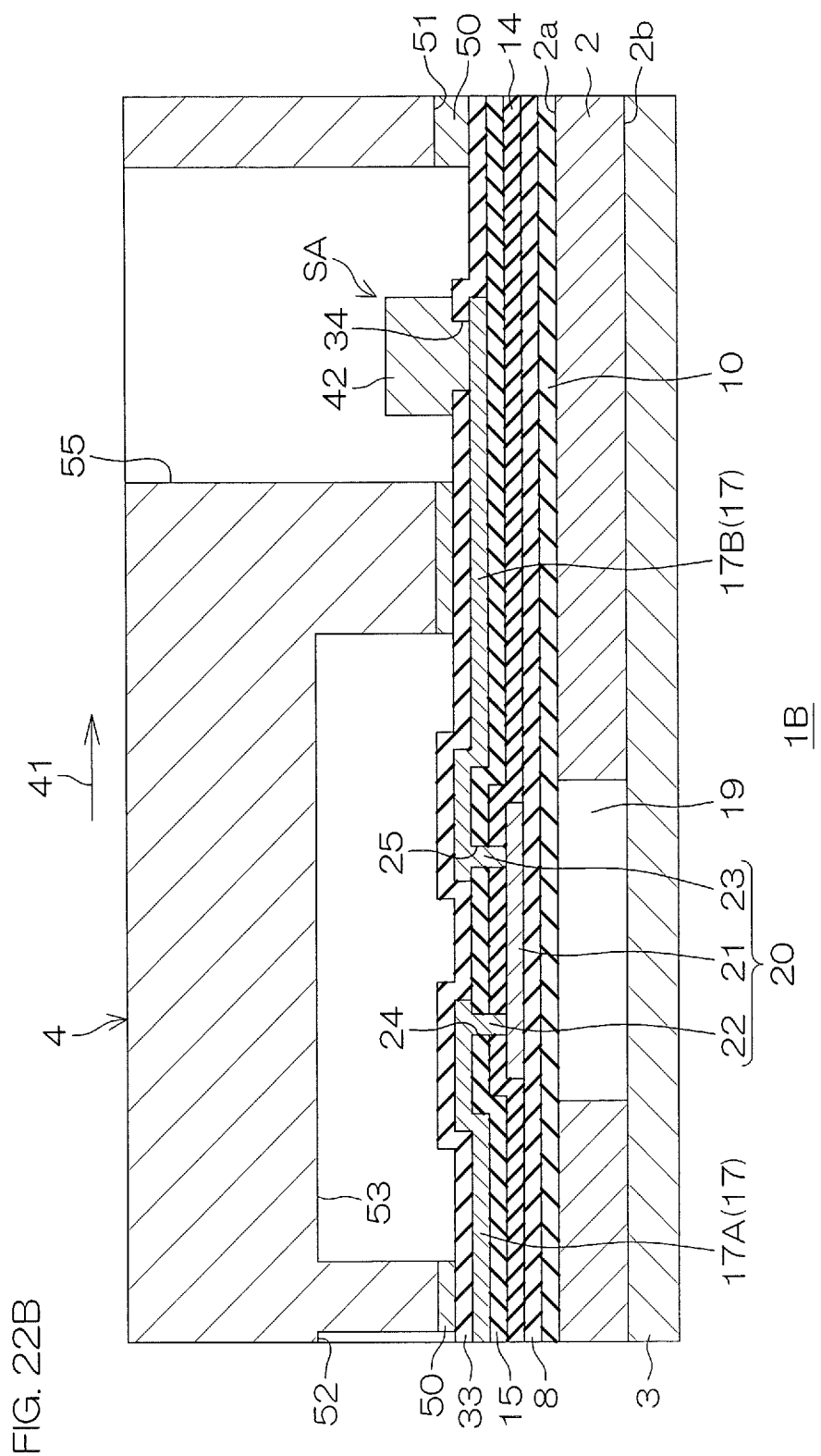

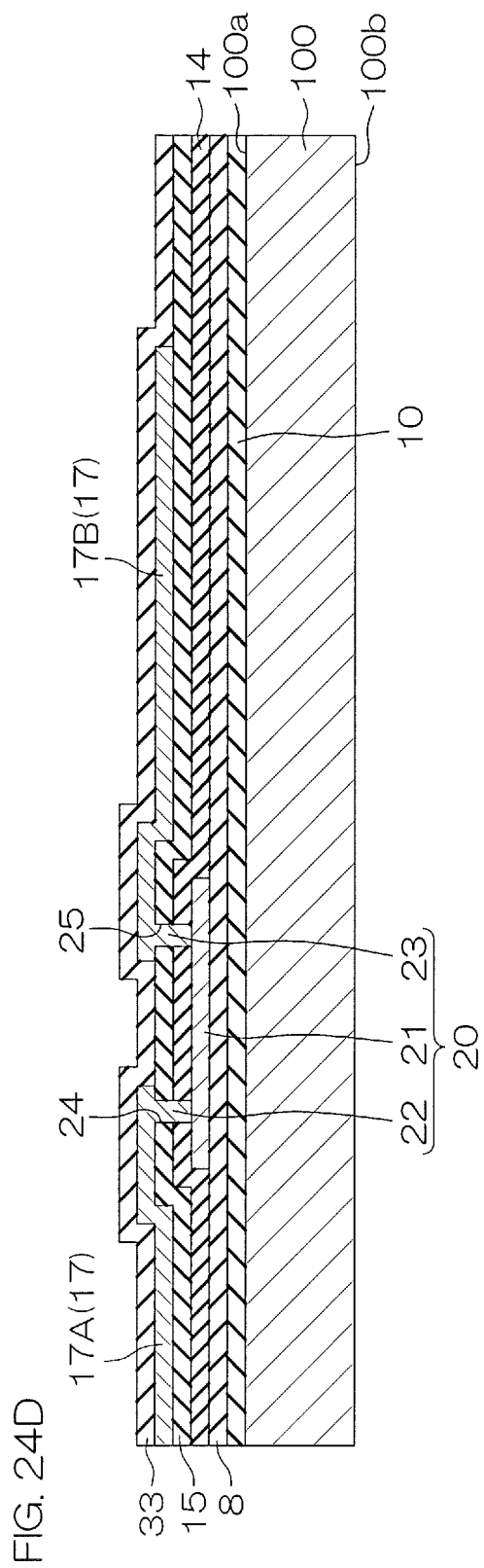

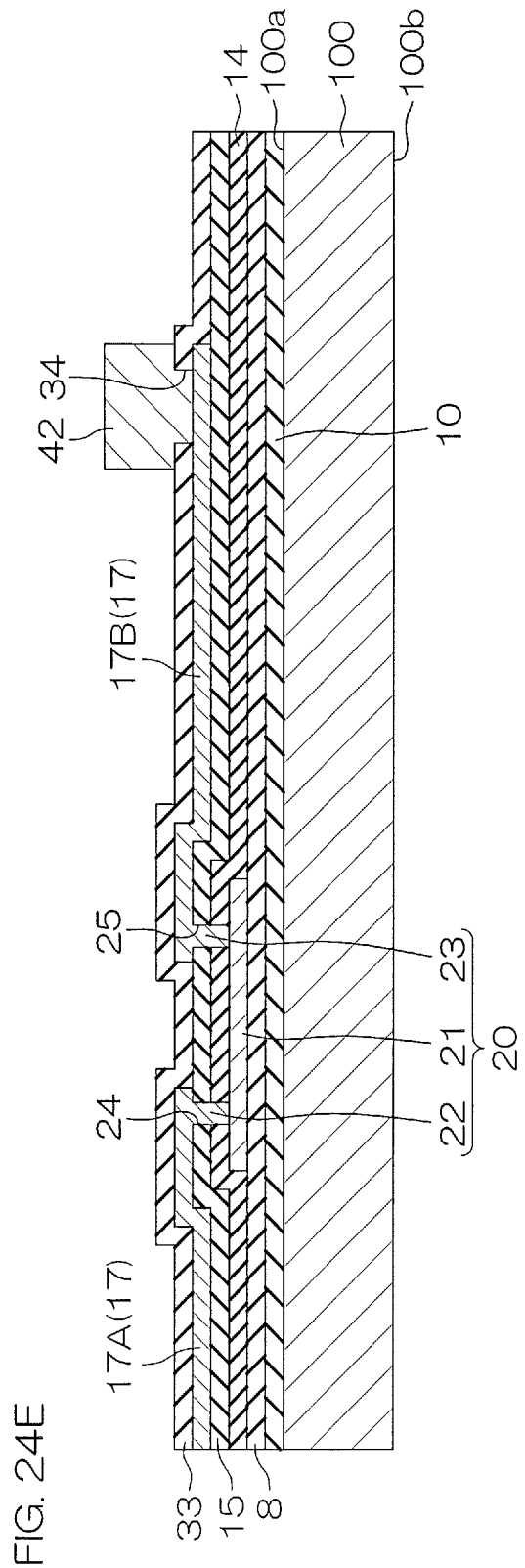

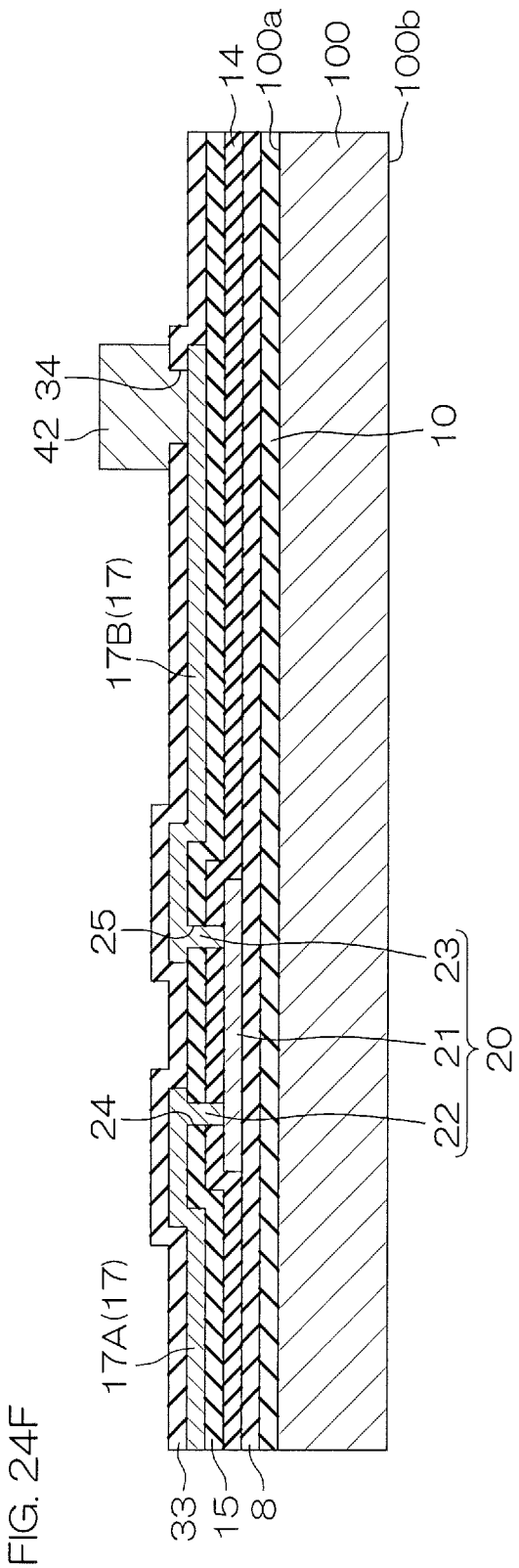

INKJET PRINT HEAD

TECHNICAL FIELD

The present disclosure relates to an inkjet print head.

BACKGROUND ART

Patent Literature 1 discloses an inkjet print head. The inkjet print head of Patent Literature 1 includes an actuator substrate having a pressure chamber as an ink flow passage, a movable film formed on the actuator substrate, and a piezoelectric element disposed on the movable film. The inkjet print head of Patent Literature 1 further includes a nozzle substrate bonded to a lower surface of the actuator substrate and having a nozzle hole in communication with the pressure chamber and a protective substrate bonded to an upper surface of the actuator substrate and covering the piezoelectric element. The piezoelectric element is constituted of a lower electrode formed on the movable film, an upper electrode disposed on the lower electrode, and a piezoelectric film sandwiched between the two. One end portion of a wiring is connected to the upper electrode.

CITATION LIST

Patent Literature

Patent Literature 1: Japanese Patent Application Publication No. 2018-69685

SUMMARY OF INVENTION

Technical Problem

With the inkjet print head described in Patent Literature 1, when the piezoelectric element undergoes dielectric breakdown, an excessive current flows through the wiring and Joule heat is generated in the wiring. Due to the Joule heat, the movable film may become damaged and ink may leak. The inkjet print head includes a plurality of piezoelectric elements and there is thus a problem that if an ink leakage occurs due to dielectric breakdown of one piezoelectric element, wirings connected to other adjacent piezoelectric elements degrade and a fault range spreads.

An object of the present disclosure is to provide an inkjet print head with which, when a piezoelectric element undergoes dielectric breakdown, etc., continuous flow of an excessive current through a wiring can be prevented and damage of a movable film due to Joule heat generated in the wiring can be suppressed.

Solution to Problem

A preferred embodiment of the present disclosure provides an inkjet print head including an actuator substrate that has an ink flow passage including a pressure chamber, a movable film formation layer that includes a movable film disposed on the pressure chamber and demarcating a top surface portion of the pressure chamber, a piezoelectric element that includes a lower electrode disposed on the movable film, a piezoelectric film formed on the lower electrode, and an upper electrode formed on the piezoelectric film, a hydrogen barrier film that covers at least entire side surfaces of the upper electrode and the piezoelectric film among surfaces of the piezoelectric element, an interlayer insulating film that is formed on the movable film formation layer such as to cover the hydrogen barrier film, and a wiring that is formed on the interlayer insulating film and is connected to the piezoelectric element and where a fuse is inserted in an intermediate portion of the wiring.

With this arrangement, when the piezoelectric element undergoes dielectric breakdown, etc., continuous flow of an excessive current through the wiring can be prevented and damage of the movable film due to Joule heat generated in the wiring can be suppressed.

In the preferred embodiment of the present disclosure, the actuator substrate has a cavity below the fuse.

In the preferred embodiment of the present disclosure, the fuse is constituted of a conductor constituted of the same material as the wiring and being less in width than the wiring.

In the preferred embodiment of the present disclosure, the wiring has a first wiring portion and a second wiring portion that are electrically connected via the fuse, the first wiring portion has a first end portion that is connected to the piezoelectric element and a second end portion that is connected to the fuse, the second wiring portion has a first end portion that is connected to the fuse and a second end portion at an opposite side thereof, and the fuse is arranged from a conductor, a first contact that connects the second end portion of the first wiring portion and a first end portion of the conductor and a second contact that connects the first end portion of the second wiring portion and a second end portion at an opposite side to the first end portion of the conductor.

In the preferred embodiment of the present disclosure, the wiring is an upper wiring with one end connected to the upper electrode of the piezoelectric element, a dummy piezoelectric element that is of the same structure as the piezoelectric element but does not operate as a piezoelectric element is formed on the movable film formation layer, and the conductor is an upper electrode of the dummy piezoelectric element.

In the preferred embodiment of the present disclosure, the hydrogen barrier film and the interlayer insulating film cover a surface of the dummy piezoelectric element.

In the preferred embodiment of the present disclosure, the hydrogen barrier film and the interlayer insulating film are formed at least on a portion of an upper surface of the upper electrode of the piezoelectric element, an upper contact hole that exposes a portion of the upper surface of the upper electrode of the piezoelectric element is formed in the hydrogen barrier film and the interlayer insulating film formed on the upper surface of the upper electrode of the piezoelectric element, the first end portion of the first wiring portion enters into the upper contact hole and is connected to the upper electrode inside the upper contact hole, a first contact hole that exposes a portion of the first end portion of the conductor and a second contact hole that exposes a portion of the second end portion of the conductor are formed in the hydrogen barrier film and the interlayer insulating film formed on the upper surface of the conductor constituted of the upper electrode of the dummy piezoelectric element, the first contact connects the second end portion of the first wiring portion and the first end portion of the conductor via the first contact hole, and the second contact connects the first end portion of the second wiring portion and the second end portion of the conductor via the second contact hole.

In the preferred embodiment of the present disclosure, if a portion of the first wiring portion that is connected to the upper electrode via the upper contact hole is an upper contact, a transverse cross-sectional area of at least one of the first contact and the second contact is less than a transverse cross-sectional area of the upper contact.

In the preferred embodiment of the present disclosure, a width of the conductor is less than a width of the upper wiring.

In the preferred embodiment of the present disclosure, the wiring is an upper wiring with one end connected to the upper electrode of the piezoelectric element and the conductor is constituted of a metal film that is formed on the movable film formation layer and is constituted of the same material as the lower electrode.

In the preferred embodiment of the present disclosure, the hydrogen barrier film and the interlayer insulating film cover a surface of the conductor.

In the preferred embodiment of the present disclosure, the hydrogen barrier film and the interlayer insulating film are formed at least on a portion of an upper surface of the upper electrode of the piezoelectric element, an upper contact hole that exposes a portion of the upper surface of the upper electrode of the piezoelectric element is formed in the hydrogen barrier film and the interlayer insulating film formed on the upper surface of the upper electrode of the piezoelectric element, the first end portion of the first wiring portion enters into the upper contact hole and is connected to the upper electrode inside the upper contact hole, a first contact hole that exposes a portion of the first end portion of the conductor and a second contact hole that exposes a portion of the second end portion of the conductor are formed in the hydrogen barrier film and the interlayer insulating film formed on the upper surface of the conductor, the first contact connects the second end portion of the first wiring portion and the first end portion of the conductor via the first contact hole, and the second contact connects the first end portion of the second wiring portion and the second end portion of the conductor via the second contact hole.

In the preferred embodiment of the present disclosure, if a portion of the first wiring portion that is connected to the upper electrode via the upper contact hole is an upper contact, a transverse cross-sectional area of at least one of the first contact and the second contact is less than a transverse cross-sectional area of the upper contact.

In the preferred embodiment of the present disclosure, a width of the conductor is less than a width of the upper wiring.

In the preferred embodiment of the present disclosure, a passivation film that is formed on the interlayer insulating film and covers the wiring is included.

In the preferred embodiment of the present disclosure, a plurality of the pressure chambers are provided, the piezoelectric element is provided according to each of the pressure chambers, and, in the actuator substrate, a plurality of pressure chamber columns, each constituted of a plurality of the pressure chambers that are disposed at intervals in a predetermined first direction, are formed at intervals in a second direction orthogonal to the first direction in plan view.

The aforementioned as well as yet other objects, features, and effects of the present disclosure will be made clear by the following description of the preferred embodiments made with reference to the accompanying drawings.

BRIEF DESCRIPTION OF DRAWINGS

FIG. 11A is a sectional view of an example of a manufacturing process of the inkjet print head of FIG. 1.

FIG. 11I is a sectional view of a step subsequent to that of FIG. 11H.

FIG. 17B is a sectional view of a step subsequent to that of FIG. 17A.

FIG. 22B is an illustrative sectional view taken along line B-B of FIG. 20.

DESCRIPTION OF EMBODIMENTS

[1] First Preferred Embodiment

Figure 1:
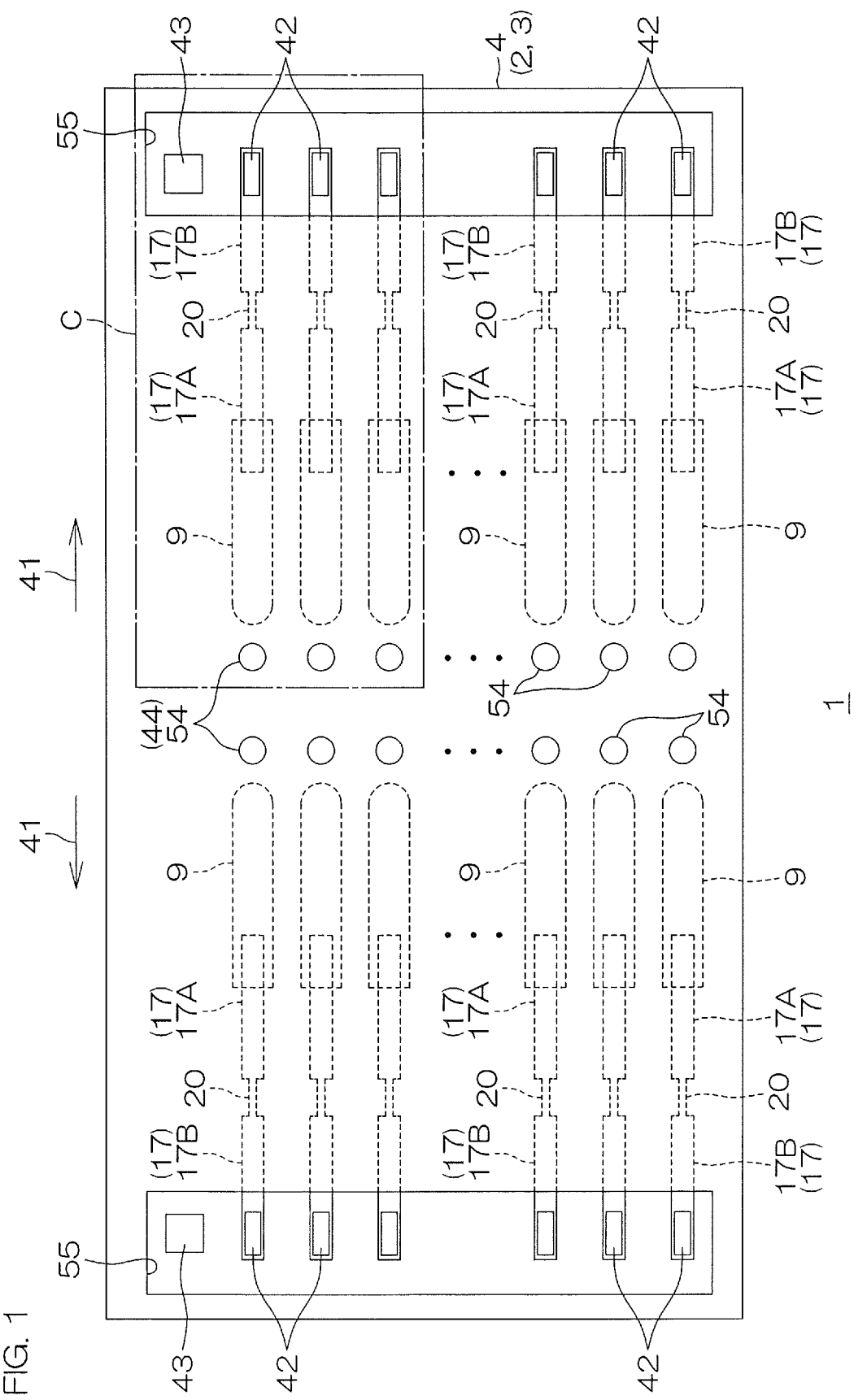
FIG. 1 is an illustrative plan view for describing the arrangement of an inkjet print head according to a first preferred embodiment of the present disclosure.
Figure 2:
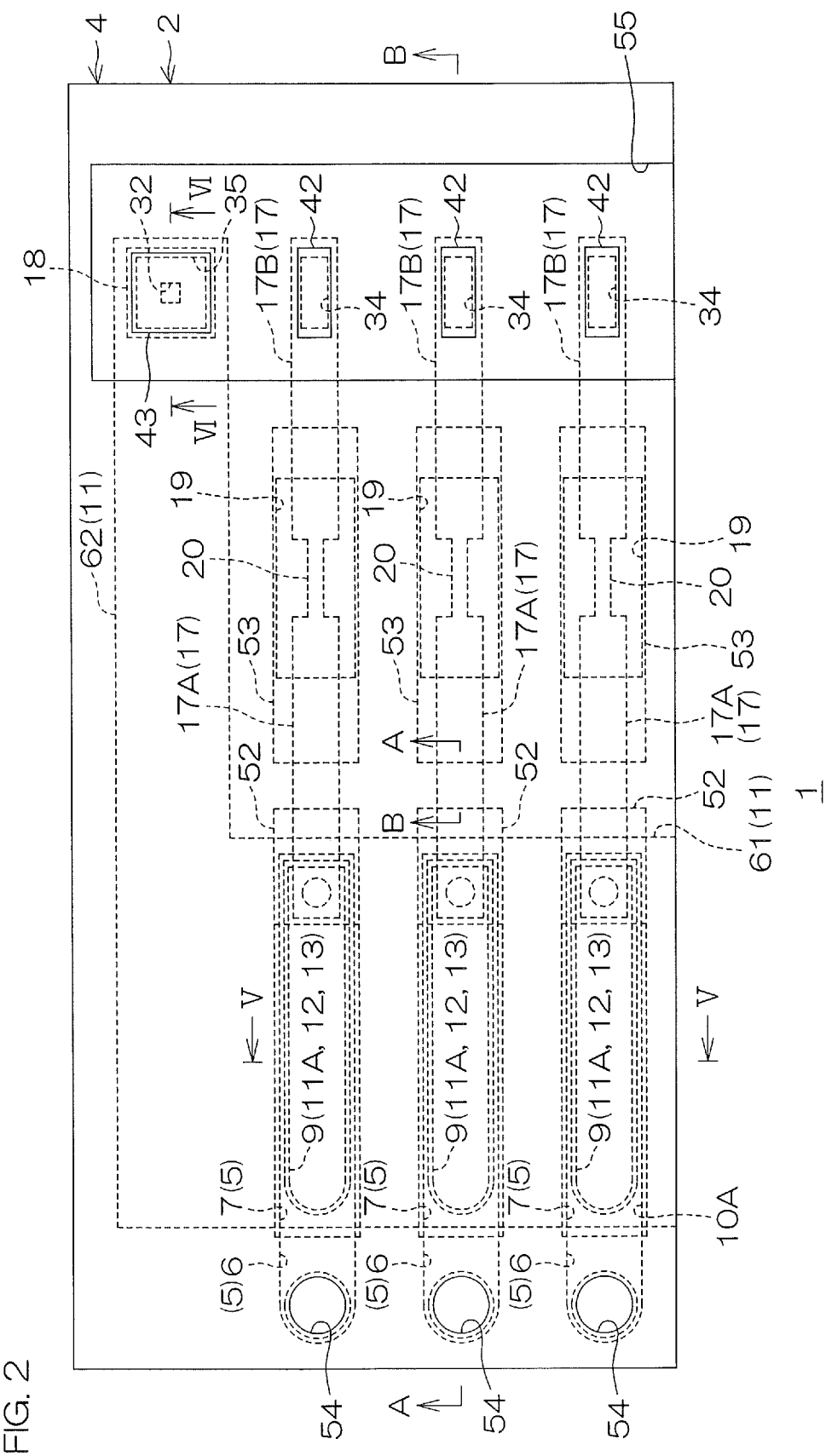
FIG. 2 is an illustrative partially enlarged plan view showing a portion C of FIG. 1 in enlarged manner and is a plan view including a protective substrate.
Figure 3:
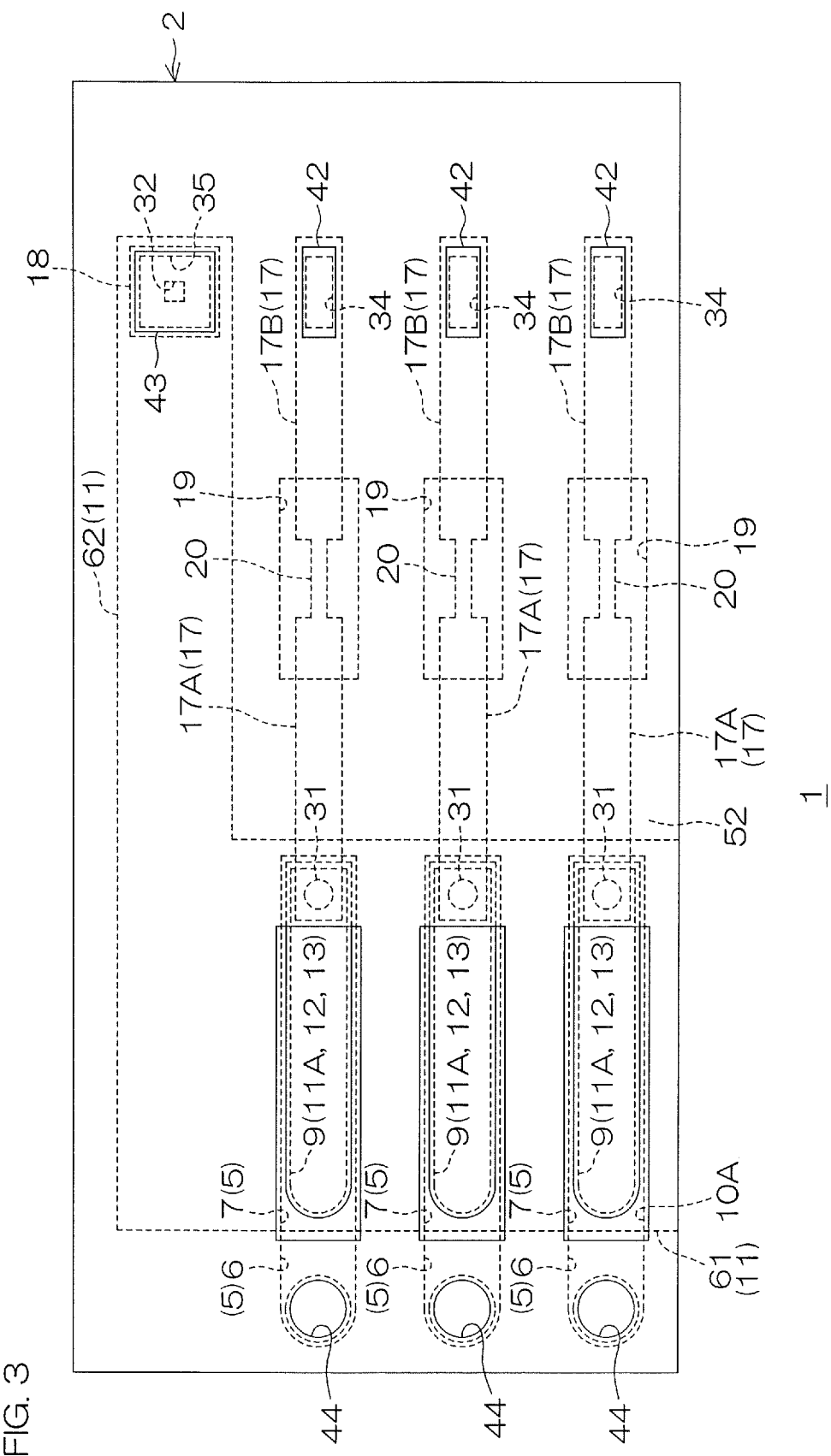
FIG. 3 is an illustrative partially enlarged plan view showing the portion C of FIG. 1 in enlarged manner and is a plan view with the protective substrate omitted.
Figure 4A:
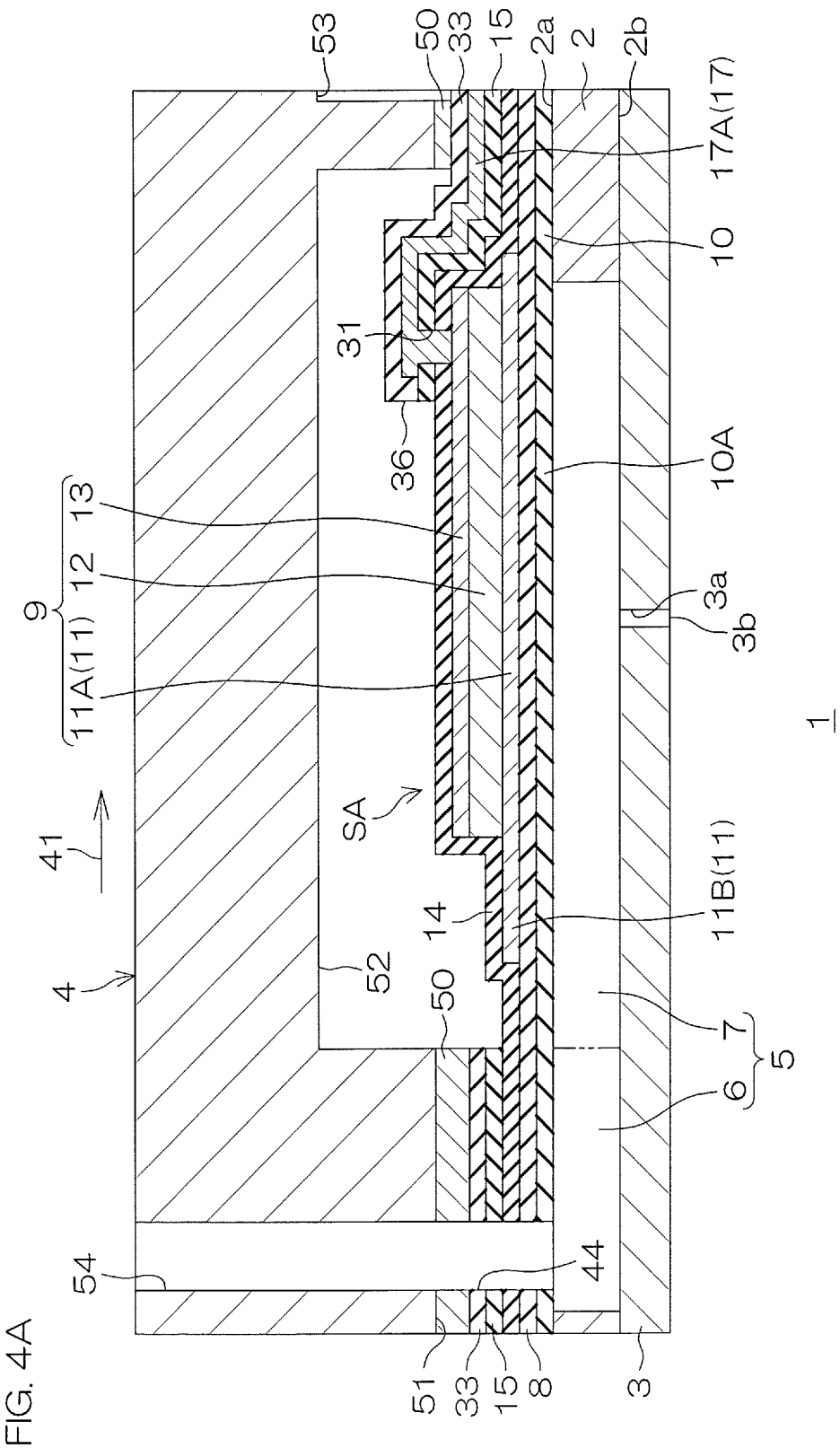
FIG. 4A is an illustrative sectional view taken along line A-A of FIG. 2.
Figure 4B:
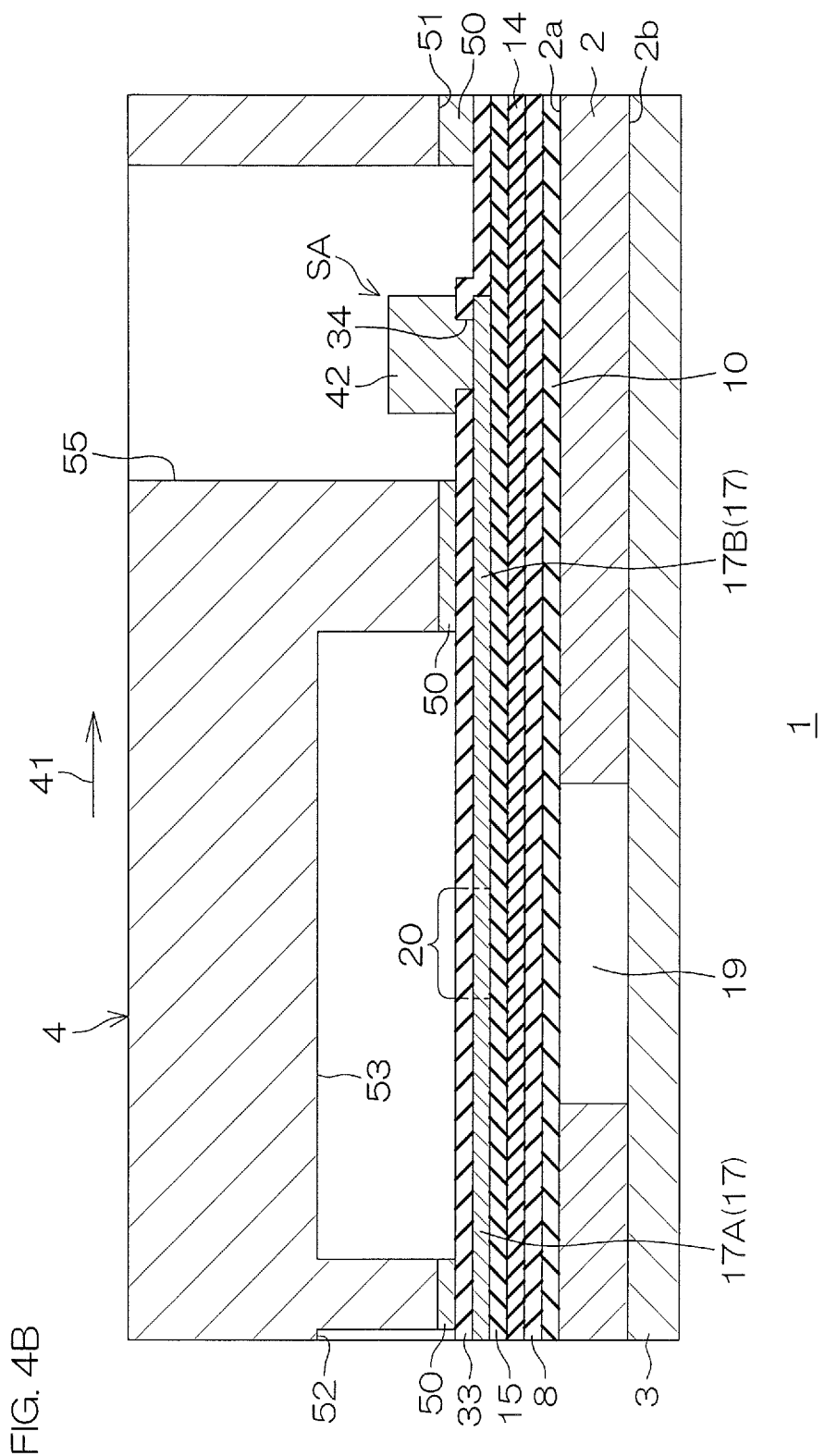
FIG. 4B is an illustrative sectional view taken along line B-B of FIG. 2.
Figure 5:
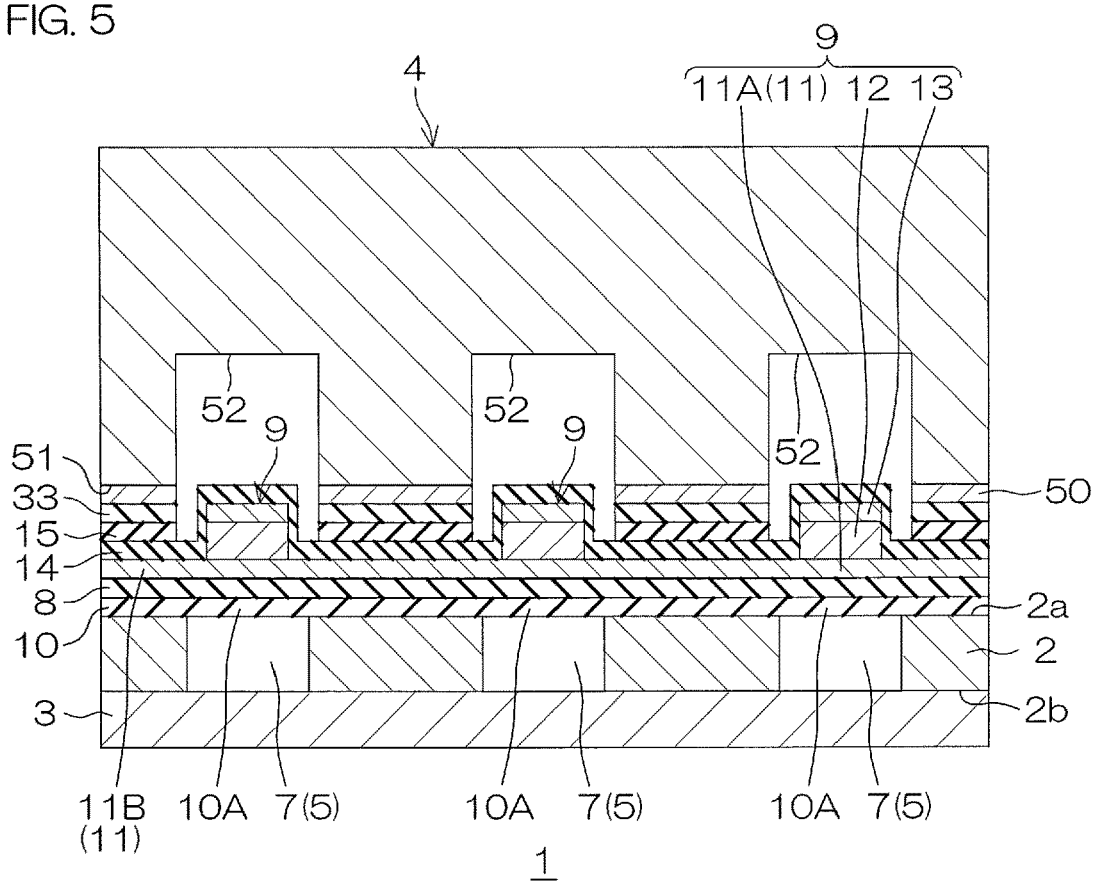
FIG. 5 is an illustrative sectional view taken along line V-V of FIG. 2.
Figure 6:
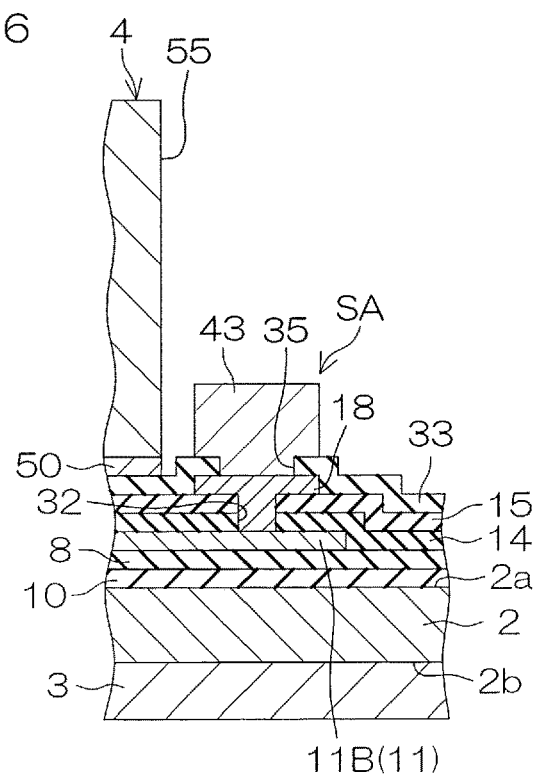
FIG. 6 is an illustrative sectional view taken along line VI-VI of FIG. 2.

FIG. 1 is an illustrative plan view for describing the arrangement of an inkjet print head according to a first preferred embodiment of the present disclosure. FIG. 2 is an illustrative partially enlarged plan view showing a portion C of FIG. 1 in enlarged manner and is a plan view including a protective substrate. FIG. 3 is an illustrative partially enlarged plan view showing the portion C of FIG. 1 in enlarged manner and is a plan view with the protective substrate omitted. FIG. 4A is an illustrative sectional view taken along line A-A of FIG. 2. FIG. 4B is an illustrative sectional view taken along line B-B of FIG. 2. FIG. 5 is an illustrative sectional view taken along line V-V of FIG. 2. FIG. 6 is an illustrative sectional view taken along line VI-VI of FIG. 2.

The arrangement of the inkjet print head 1 shall now be described in outline with reference to FIG. 4A and FIG. 4B.

The inkjet print head 1 includes an actuator substrate assembly SA including an actuator substrate 2 and piezoelectric elements 9, a nozzle substrate 3, and a protective substrate 4. In the following, the actuator substrate assembly SA shall be referred to as the "substrate assembly SA."

The actuator substrate 2 is constituted, for example, of a silicon (Si) substrate. A movable film formation layer 10 is laminated on a front surface 2a of the actuator substrate 2. Ink flow passages (ink reservoirs) 5 and cavities 19 are formed in the actuator substrate 2. In this preferred embodiment, the ink flow passages 5 are formed such as to penetrate through the actuator substrate 2. Each ink flow passage 5 is formed such as to be thinly elongate along an ink flow direction 41 indicated by arrows in FIG. 4A and FIG. 4B. The ink flow passage 5 is constituted of an ink inflow portion 6 at an upstream side end portion (the left end portion in FIG. 4A) in the ink flow direction 41 and a pressure chamber 7 that is in communication with the ink inflow portion 6. In FIG. 4A, a boundary between the ink inflow portion 6 and the pressure chamber 7 is indicated by an alternate long and two short dashed line.

The cavities 19 are disposed at a downstream side in the ink flow direction 41 with respect to the ink flow passages 5. In this preferred embodiment, the cavities 19 are formed such as to penetrate through the actuator substrate 2. The cavities 19 are formed such as to extend along the ink flow direction 41. Each cavity 19 is formed below a region that includes a fuse 20 to be described below and a vicinity thereof.

The nozzle substrate 3 is constituted, for example, of a silicon (Si) substrate. The nozzle substrate 3 is bonded to a rear surface 2b of the actuator substrate 2. Together with the actuator substrate 2 and the movable film formation layer 10, the nozzle substrate 3 demarcates the ink flow passages 5. More specifically, the nozzle substrate 3 demarcates bottom surface portions of the ink flow passages 5. Also, together with the actuator substrate 2 and the movable film formation layer 10, the nozzle substrate 3 demarcates the cavities 19. More specifically, the nozzle substrate 3 demarcates bottom surface portions of the cavities 19. Nozzle holes 3a are formed in the nozzle substrate 3. Each nozzle hole 3a has an ink discharge port 3b at an opposite side to the pressure chamber 7.

Portions of the movable film formation layer 10 that are top wall portions of the pressure chambers 7 constitute movable films 10A. The movable films 10A (movable film formation layer 10) are constituted, for example, of a silicon oxide ($SiO_2$) film formed on the actuator substrate 2. In this description, the movable films 10A refer to top wall portions of the movable film formation layer 10 that demarcate top surfaces of the pressure chambers 7. Therefore, a portion of the movable film formation layer 10 other than the top wall portions of the pressure chambers 7 does not constitute a movable film 10A.

A thickness of each movable film 10A is, for example, 0.4 μm to 2 μm. The thickness of the movable film 10A may be approximately 1.2 μm.

The pressure chambers 7 are demarcated by the movable films 10A, the actuator substrate 2, and the nozzle substrate 3 and, in this preferred embodiment, are formed to substantially rectangular parallelepiped shapes that are long in the ink flow direction 41. A length of each pressure chamber 7 may, for example, be approximately 800 μm and a width thereof may be approximately 55 μm. The ink inflow portion 6 is in communication with one end portion in a long direction of the pressure chamber 7.

A first hydrogen barrier film 8 is formed on a front surface of the movable film formation layer 10. The first hydrogen barrier film 8 is constituted, for example, of $Al_2O_3$ (alumina). A thickness of the first hydrogen barrier film 8 is approximately 50 nm to 100 nm. On a front surface of the first hydrogen barrier film 8, the piezoelectric elements 9 are disposed at positions above the movable films 10A. Each piezoelectric element 9 includes a lower electrode 11 formed on the first hydrogen barrier film 8, a piezoelectric film 12 formed on the lower electrode 11, and an upper electrode 13 formed on the piezoelectric film 12. In other words, the piezoelectric element 9 is arranged by sandwiching the piezoelectric film 12 from above and below with the upper electrode 13 and the lower electrode 11.

The upper electrode 13 may be a single film of platinum (Pt) or may have a laminated structure with which, for example, a conductive oxide film (for example, an $IrO_2$ (iridium oxide) film) and a metal film (for example, an Ir (iridium) film) are laminated. A thickness of the upper electrode 13 may, for example, be approximately 0.2 μm.

As the piezoelectric film 12, for example, a PZT ($PbZr_xTi_{1-x}O_3$: lead zirconate titanate) film formed by a sol-gel method or a sputtering method can be applied. Such a piezoelectric film 12 is constituted of a sintered body of a metal oxide crystal. The piezoelectric film 12 is formed to be of the same shape as the upper electrode 13 in plan view. A thickness of the piezoelectric film 12 is approximately 1 μm. An overall thickness of the movable film 10A is preferably approximately the same as the thickness of the piezoelectric film 12 or approximately ⅔ the thickness of the piezoelectric film 12.

The first hydrogen barrier film 8 mentioned above prevents degradation of characteristics due to hydrogen reduction of the piezoelectric films 12. Further, the first hydrogen barrier film 8 prevents metal elements (Pb, Zr, and Ti in the case where the piezoelectric films 12 are of PZT) from escaping from the piezoelectric films 12, keeps piezoelectric properties of the piezoelectric films 12 satisfactory, and prevents diffusion of metals into the movable films 10A during forming of the piezoelectric films 12.

Each lower electrode 11 has, for example, a two-layer structure with which a Ti (titanium) film and a Pt (platinum) film are laminated successively from the first hydrogen barrier film 8 side. Besides this, the lower electrode 11 can be formed with a single film, such an Au (gold) film, a Cr (chromium) layer, an Ni (nickel) layer, etc. The lower electrode 11 has main electrode portions 11A in contact with lower surfaces of the piezoelectric films 12 and an extension portion 11B extending to a region outside the piezoelectric films 12. A thickness of the lower electrode 11 may, for example, be approximately 0.2 μm.

A second hydrogen barrier film 14 is formed on the piezoelectric elements 9, on the extension portions 11B of the lower electrodes 11, and on the first hydrogen barrier film 8. The second hydrogen barrier film 14 is constituted, for example, of $Al_2O_3$ (alumina). A thickness of the second hydrogen barrier film 14 is approximately 50 nm to 100 nm. The second hydrogen barrier film 14 is provided to prevent degradation of characteristics due to hydrogen reduction of the piezoelectric films 12. The second hydrogen barrier film 14 is an example of a "hydrogen barrier film" in the present disclosure.

An insulating film 15 is laminated on the second hydrogen barrier film 14. The insulating film 15 is constituted, for example, of $SiO_2$, SiN of low hydrogen, etc. A thickness of the insulating film 15 is approximately 500 nm. Upper wirings 17 and lower wirings 18 (see FIG. 2 and FIG. 6) are formed on the insulating film 15. These wirings may be constituted of a metal material including Al (aluminum). A thickness of these wirings is, for example, approximately 1000 nm (1 μm).

In an intermediate portion of each upper wiring 17 is inserted a fuse 20 that is cut by fusion when an excessive current flows through the upper wiring 17. The upper wiring 17 has a first wiring portion 17A and a second wiring portion 17B that are connected via the fuse 20. Referring to FIG. 2 and FIG. 3, the fuse 20, in plan view, is of an oblong shape that is long in the ink flow direction 41. The fuse 20 is constituted of the same material as the upper wiring and is arranged from a conductor with a thickness that is the same as the thickness of the upper wiring 17 and with a width narrower than the upper wiring 17. The first wiring portion 17A, the fuse 20, and the second wiring portion 17B are formed integrally.

As mentioned above, in the actuator substrate 2, each cavity 19 is formed below the region that includes the fuse 20 and the vicinity thereof. The cavity 19 is disposed at the downstream side in the ink flow direction 41 with respect to the ink flow passage 5. The cavity 19 is of substantially rectangular parallelepiped shape that is long in the ink flow direction 41. In plan view, the cavity 19 has an oblong shape that is elongate along the ink flow direction 41. That is, a top surface portion of the cavity 19 has two side edges oriented along the ink flow direction 41 and two end edges oriented along a direction orthogonal to the ink flow direction 41.

A width of the cavity 19 is greater than the width of the fuse 20 and greater than the width of the upper wiring 17. In this preferred embodiment, the width of the cavity 19 is substantially equal to the width of the pressure chamber 7. A length of the cavity 19 is longer than a length of the fuse 20. In this preferred embodiment, the length of the cavity 19 is shorter than the length of the pressure chamber 7. In plan view, both side edges oriented along a long direction of the fuse 20 are receded further inward than corresponding both side edges of the cavity 19. In plan view, both end edges oriented along a short direction of the fuse 20 are receded further inward than corresponding both end edges of the cavity 19.

The reason for the cavity 19 being formed in the actuator substrate 2 is as follows. If the cavity 19 is not provided, even when an excessive current flows through the upper wiring 17 and the fuse 20 becomes heated, the heat escapes by being transmitted to the actuator substrate 2 that is constituted of the Si substrate and the fuse 20 is unlikely to be cut by fusion. The cavity 19 is thus formed to suppress the heat, generated in the fuse 20 when an excessive current flows through the upper wiring 17, from escaping by being transmitted to the actuator substrate 2.

One end portion (first end portion) of the first wiring portion 17A is disposed above one end portion (end portion at the downstream side in the ink flow direction 41) of the upper electrode 13. A contact hole 31 that penetrates continuously through the second hydrogen barrier film 14 and the insulating film 15 is formed between the first wiring portion 17A and the upper electrode 13. The one end portion of the first wiring portion 17A enters into the contact hole 31 and is connected to the upper electrode 13 inside the contact hole 31.

The first wiring portion 17A extends from an upper side of the upper electrode 13 to an outer side of the pressure chamber 7 upon crossing an outer edge of the pressure chamber 7. Another end portion (second end portion) of the first wiring portion 17A is connected to one end portion (first end portion) of the fuse 20. More specifically, the one end portion of the fuse 20 is connected to a width intermediate portion of the other end portion of the first wiring portion 17A. One end portion (first end portion) of the second wiring portion 17B is connected to another end portion (second end portion) of the fuse 20. More specifically, the other end portion of the fuse 20 is connected to a width intermediate portion of the one end portion of the second wiring portion 17B. The second wiring portion 17B extends along an extension line of the first wiring portion 17A. The lower wirings 18 shall be described later.

A passivation film 33 that covers the upper wirings 17, the lower wirings 18, the fuses 20, and the insulating film 15 is formed on the insulating film 15. The passivation film 33 is constituted, for example, of SiN (silicon nitride). A thickness of the passivation film 33 may, for example, be approximately 800 nm.

Pad openings 34 that expose portions of the second wiring portions 17B are formed in the passivation film 33. The pad openings 34 are formed in regions at the downstream side in the ink flow direction 41 with respect to the cavities 19 and are formed, for example, at tip portions (end portions at opposite sides to end portions connecting to the fuses 20) of the second wiring portions 17B. Upper electrode pads 42 that cover the pad openings 34 are formed on the passivation film 33. The upper electrode pads 42 enter into the pad openings 34 and are connected to the second wiring portions 17B inside the pad openings 34. Lower electrode pads 43 (see FIG. 1, FIG. 2, FIG. 3, and FIG. 6) is also provided for the lower wirings 18 and the lower electrode pads 43 shall be described later.

At positions corresponding to end portions of the ink flow passages 5 at the ink inflow portion 6 sides are formed ink supplying penetrating holes 44 that penetrate through the passivation film 33, the insulating film 15, the second hydrogen barrier film 14, the first hydrogen barrier film 8, and the movable film formation layer 10. Each ink supplying penetrating hole 44 is in communication with the ink inflow portion 6.

The protective substrate 4 is constituted, for example, of a silicon substrate. The protective substrate 4 is disposed on the substrate assembly SA such as to cover the piezoelectric elements 9 and the fuses 20. The protective substrate 4 is bonded via an adhesive 50 to the substrate assembly SA. The protective substrate 4 has first recesses 52 and second recesses 53 in an opposing surface 51 that opposes the substrate assembly SA. The piezoelectric elements 9 are housed in the first recesses 52. The second recesses 53 face the regions of the fuses 20 and the vicinities thereof. Each second recess 53 is formed to suppress the heat of the fuse 20 from escaping by being transmitted to the protective substrate 4 when an overcurrent flows through the upper wiring 17.

Further, ink supply passages 54 in communication with the ink supplying penetrating holes 44 and opening portions 55 for exposing the pads 42 and 43 are formed in the protective substrate 4. The ink supply passages 54 and the opening portions 55 penetrate through the protective substrate 4. An ink tank (not shown) that stores an ink is disposed on the protective substrate 4.

The piezoelectric elements 9 are formed at positions opposing the pressure chambers 7 across the movable films 10A and the first hydrogen barrier film 8. That is, the piezoelectric elements 9 are formed such as to contact the front surface of the first hydrogen barrier film 8 at an opposite side to the pressure chambers 7. The pressure chambers 7 are filled with the ink by the ink being supplied from the ink tank to the pressure chambers 7 through the ink supply passages 54, the ink supplying penetrating holes 44, and the ink inflow portions 6. The movable films 10A demarcate top surface portions of the pressure chambers 7 and face the pressure chambers 7. Each movable film 10A is supported by a portion of the actuator substrate 2 at a periphery of the pressure chamber 7 and has a flexibility enabling deformation in a direction opposing the pressure chamber 7 (in other words, in a thickness direction of the movable film 10A).

The lower wirings 18 (see FIG. 2, FIG. 3, and FIG. 6) and the upper wirings 17 are connected to a drive circuit (not shown). Specifically, the upper electrode pads 42 and the drive circuit are connected via a connecting metal member (not shown). The lower electrode pad 43 (see FIG. 2, FIG. 3, and FIG. 6) and the drive circuit are connected via a connecting metal member (not shown). When a drive voltage is applied from the drive circuit to a piezoelectric element 9, the piezoelectric film 12 deforms due to a piezoelectric effect. The piezoelectric element 9 and the movable film 10A thereby deform, a volume change is thereby brought about in the pressure chamber 7, and the ink inside the pressure chamber 7 is pressurized. The pressurized ink passes through the nozzle hole 3a and is discharged as microdroplets from the ink discharge port 3b.

The arrangement of the inkjet print head 1 shall now be described more specifically with reference to FIG. 1 to FIG. 6. In the following description, a left side of FIG. 1 shall be referred to as "left," a right side of FIG. 1 shall be referred to as "right," a lower side of FIG. 1 shall be referred to as "front," and an upper side of FIG. 1 shall be referred to as "rear," respectively.

As shown in FIG. 1, a plan-view shape of the inkjet print head 1 is an oblong shape. In this preferred embodiment, planar shapes and sizes of the actuator substrate 2, the protective substrate 4, and the nozzle substrate 3 are substantially the same as the planar shape and size of the inkjet print head 1.

In plan view, a plurality of columns (hereinafter referred to as "piezoelectric element columns"), each being of a plurality of the piezoelectric elements 9 aligned in a stripe at intervals in a front/rear direction, are provided respectively at an interval in a right/left direction on the actuator substrate 2. For convenience of description, it shall be deemed that two of the piezoelectric element columns are provided in this preferred embodiment.

As shown in FIG. 2 and FIG. 3, the ink flow passages 5 (pressure chambers 7) are formed respectively according to each of the piezoelectric elements 9 in the actuator substrate 2. Therefore, in plan view, two of ink flow passage columns (pressure chamber columns), each constituted of a plurality of the ink flow passages 5 (pressure chambers 7) aligned in a stripe at intervals in the front/rear direction, are provided at an interval in the right/left direction in the actuator substrate 2.

A pattern of the ink flow passage column corresponding to the piezoelectric element column at the left side of FIG. 1 and a pattern of the ink flow passage column corresponding to the piezoelectric element column at the right side are patterns that are right/left symmetrical with respect to a straight line joining centers between the columns. Therefore, whereas with the ink flow passages 5 that are included in the ink flow passage column at the left side, the ink inflow portions 6 are at the right sides of the pressure chambers 7 (piezoelectric elements 9), with the ink flow passage 5 that are included in the ink flow passage column at the right side, the ink inflow portions 6 are at the left sides of the pressure chambers 7 (piezoelectric elements 9). The ink flow directions 41 are thus mutually opposite directions for the ink flow passage column at the left side and the ink flow passage column at the right side.

The ink supplying penetrating holes 44 are provided respectively according to each of the plurality of ink flow passages 5 of each ink flow passage column. The ink supplying penetrating holes 44 are disposed on the ink inflow portions 6. Therefore, the ink supplying penetrating holes 44 for the ink flow passages 5 included in the ink flow passage column at the left side are disposed on right end portions of the ink flow passages 5 and the ink supplying penetrating holes 44 for the ink flow passages 5 included in the ink flow passage column at the right side are disposed on left end portions of the ink flow passages 5.

The cavities 19 are provided respectively according to each of the plurality of ink flow passages 5 of each ink flow passage column. The cavities 19 corresponding to the ink flow passage column at the left side are disposed at the left sides of the ink flow passages 5 and the cavities 19 corresponding to the ink flow passage column at the right side are disposed at the right sides of the ink flow passages 5.

In each ink flow passage column, the plurality of ink flow passages 5 are formed at equal intervals that are minute intervals (of, for example, approximately 30 µm to 350 µm) in width directions thereof. Similarly, in each ink flow passage column, the plurality of cavities 19 are formed at equal intervals that are minute intervals in width directions thereof.

Each ink flow passage 5 is thinly elongate along the ink flow direction 41. The ink flow passage 5 is constituted of the ink inflow portion 6 in communication with the ink supplying penetrating hole 44 and the pressure chamber 7 in communication with the ink inflow portion 6. In plan view, the pressure chamber 7 has an oblong shape that is thinly elongate along the ink flow direction 41. That is, the top surface portion of the pressure chamber 7 has two side edges oriented along the ink flow direction 41 and two end edges oriented along a direction orthogonal to the ink flow direction 41. The ink inflow portion 6 has substantially the same width as the pressure chamber 7 in plan view. An inner surface of an end portion of the ink inflow portion 6 at an opposite side to the pressure chamber 7 is formed to a semicircular shape in plan view. The ink supplying penetrating hole 44 is of a circular shape in plan view (see especially FIG. 3).

In plan view, each piezoelectric element 9 has a rectangular shape that is long in the long direction of the pressure chamber 7 (movable film 10A). An end portion of the piezoelectric element 9 at the ink supplying penetrating hole 44 side is formed to a semicircular shape in plan view. A length in a long direction of the piezoelectric element 9 is shorter than a length in the long direction of the pressure chamber 7 (movable film 10A). As shown in FIG. 3, both end edges oriented along a short direction of the piezoelectric element 9 are respectively disposed at predetermined intervals inward from corresponding both end edges of the movable film 10A. Also, a width in the short direction of the piezoelectric element 9 is narrower than a width in a short direction of the movable film 10A. Both side edges oriented along the long direction of the piezoelectric element 9 are respectively disposed at predetermined intervals inward from corresponding both side edges of the movable film 10A.

The lower electrodes 11 are provided respectively according to each of the piezoelectric element columns. The lower electrode 11 (hereinafter referred to at times as "first lower electrode 11") provided for the piezoelectric element column at the left side is a common electrode that is shared by the plurality of piezoelectric elements 9 of the piezoelectric element column at the left side. The lower electrode 11

(hereinafter referred to at times as "second lower electrode 11") provided for the piezoelectric element column at the right side is a common electrode that is shared by the plurality of piezoelectric elements 9 of the piezoelectric element column at the right side.

As shown in FIG. 2 and FIG. 3, in plan view, the second lower electrode 11 is constituted of a first rectangular region 61 that includes the plurality of piezoelectric elements 9 of the piezoelectric element column at the right side and a second rectangular region 62 that extends in the right direction from a rear end portion of the first rectangular region 61. The second lower electrode 11 includes the main electrode portions 11A of rectangular shape in plan view that constitute the respective piezoelectric elements 9 of the piezoelectric element column at the right side and the extension portion 11B that is led out in a direction along the front surface of the movable film formation layer 10 from the main electrode portions 11A and extends outside peripheral edges of the top surface portions of the pressure chambers 7.

The first lower electrode 11 has a planar shape that is line symmetrical to the second lower electrode 11 with respect to a straight line passing through a center between the piezoelectric element column at the left side and the piezoelectric element column at the right side. In plan view, the first lower electrode 11 is constituted of a first rectangular region that includes the plurality of piezoelectric elements 9 of the piezoelectric element column at the left side and a second rectangular region that extends in the left direction from a rear end portion of the first rectangular region. The first lower electrode 11 includes the main electrode portions 11A of rectangular shape in plan view that constitute the respective piezoelectric elements 9 of the piezoelectric element column at the left side and the extension portion 11B that is led out in a direction along the front surface of the movable film formation layer 10 from the main electrode portions 11A and extends outside peripheral edges of the top surface portions of the pressure chambers 7.

In the first lower electrode 11 and the second lower electrode 11, a length in a long direction of each main electrode portion 11A is shorter than the length in the long direction of each movable film 10A. Both end edges of the main electrode portion 11A are respectively disposed at intervals inward from corresponding both end edges of the movable film 10A. Also, a width in a short direction of the main electrode portion 11A is narrower than the width in the short direction of the movable film 10A. Both side edges of the main electrode portion 11A are respectively disposed at intervals inward from corresponding both side edges of the movable film 10A. In the first lower electrode 11, the extension portion 11B is a region among an entire region of the first lower electrode 11 that excludes the main electrode portions 11A. In the second lower electrode 11, the extension portion 11B is a region among an entire region of the second lower electrode 11 that excludes the main electrode portions 11A.

In plan view, the upper electrodes 13 are formed to rectangular shapes of the same pattern as the main electrode portions 11A of the lower electrodes 11. That is, a length in a long direction of each upper electrode 13 is shorter than the length in the long direction of each movable film 10A. Both end edges of the upper electrode 13 are respectively disposed at intervals inward from corresponding both end edges of the movable film 10A. Also, a width in a short direction of the upper electrode 13 is narrower than the width in the short direction of the movable film 10A. Both side edges of the upper electrode 13 are respectively disposed at intervals inward from corresponding both side edges of the movable film 10A.

In plan view, the piezoelectric films 12 are formed to rectangular shapes of the same pattern as the upper electrodes 13. That is, a length in a long direction of each piezoelectric film 12 is shorter than the length in the long direction of each movable film 10A. Both end edges of the piezoelectric film 12 are respectively disposed at intervals inward from corresponding both end edges of the movable film 10A. Also, a width in a short direction of the piezoelectric film 12 is narrower than the width in the short direction of the movable film 10A. Both side edges of the piezoelectric film 12 are respectively disposed at intervals inward from corresponding both side edges of the movable film 10A. Lower surfaces of the piezoelectric films 12 contact upper surfaces of the main electrode portions 11A of the lower electrodes 11 and upper surfaces of the piezoelectric films 12 contact lower surfaces of the upper electrodes 13.

The first wiring portion 17A of each upper wiring 17 extends from an upper surface of one end portion (end portion at the downstream side in the ink flow direction 41) of the piezoelectric element 9 and along an end surface continuous thereto of the piezoelectric element 9 and further extends to the downstream side in the ink flow direction 41 along a front surface of the insulating film 15. And, the other end portion of the first wiring portion 17A is connected to the one end portion of the fuse 20. The one end portion of the second wiring portion 17B of the upper wiring 17 is connected to the other end portion of the fuse 20. The other end portion of the second wiring portion 17B extends to the downstream side in the ink flow direction 41 and is disposed inside the opening portion 55 of the protective substrate 4.

The pad openings 34 that expose central portions of tip portion front surfaces of the second wiring portions 17B are formed in the passivation film 33. The upper electrode pads 42 are provided on the passivation film 33 such as to cover the pad openings 34. The upper electrode pads 42 are connected to the second wiring portions 17B inside the pad openings 34.

As shown in FIG. 1, the plurality of upper electrode pads 42 corresponding to the plurality of piezoelectric elements 9 in the piezoelectric element column at the left side are disposed such as to be aligned in a single column in the front/rear direction at the left side of the piezoelectric element column at the left side in plan view. Also, the plurality of upper electrode pads 42 corresponding to the plurality of piezoelectric elements 9 in the piezoelectric element column at the right side are disposed such as to be aligned in a single column in the front/rear direction at the right side of the piezoelectric element column at the right side in plan view.

Referring to FIG. 1, FIG. 2, FIG. 3, and FIG. 6, the lower wirings 18 include a lower wiring (hereinafter referred to at times as "first lower wiring 18") that is disposed at a position at the rear of the upper electrode pad column at the left side in plan view and a lower wiring (hereinafter referred to at times as "second lower wiring 18") that is disposed at a position at the rear of the upper electrode pad column at the right side. Each lower wiring 18 is of a quadrilateral shape in plan view.

The extension portion 11B (second rectangular region) of the first lower electrode 11 is present below the first lower wiring 18. The extension portion 11B (second rectangular region 62) of the second lower electrode 11 is present below the second lower wiring 18. A contact hole 32 that penetrates continuously through the second hydrogen barrier film 14 and the insulating film 15 is formed between each lower wiring 18 and the extension portion 11B of the lower electrode 11 that is present below it. The lower wiring 18 enters into the contact hole 32 and is connected to the extension portion 11B of the lower electrode 11 inside the contact hole 32.

Pad openings 35 that expose central portions of front surfaces of the lower wirings 18 are formed in the passivation film 33. Lower electrode pads 43 that cover the pad openings 35 are formed on the passivation film 33. The lower electrode pads 43 enter into the pad openings 35 and are connected to the lower wirings 18 inside the pad openings 35.

As shown in FIG. 1, FIG. 2, FIG. 4A, and FIG. 4B, the plurality of ink supply passages 54 (hereinafter referred to at times as "first ink supply passages 54") that are in communication with the plurality of ink supplying penetrating holes 44 for the ink flow passage column at the left side and the plurality of ink supply passages 54 (hereinafter referred to at times as "second ink supply passages 54") that are in communication with the plurality of ink supplying penetrating holes 44 for the ink flow passage column at the right side are formed in the protective substrate 4. In plan view, the first ink supply passages 54 are disposed, in a single column and at intervals in the front/rear direction, at positions shifted to the left side with respect to a width center of the protective substrate 4. In plan view, the second ink supply passages 54 are disposed, in a single column and at intervals in the front/rear direction, at positions shifted to the right side with respect to the width center of the protective substrate 4. In plan view, the ink supply passages 54 are of circular shapes of the same pattern as the ink supplying penetrating holes 44 of the substrate assembly SA. The ink supply passages 54 are matched with the ink supplying penetrating holes 44 in plan view.

Also, the opening portion 55 for exposing all of the upper electrode pads 42 corresponding to the piezoelectric element column at the left side and the lower electrode pad 43 at the left side is formed in the protective substrate 4. Also, the opening portion 55 for exposing all of the upper electrode pads 42 corresponding to the piezoelectric element column at the right side and the lower electrode pad 43 at the right side is formed in the protective substrate 4. The opening portions 55 are of rectangular shapes that are long in the front/rear direction in plan view.

Figure 9:
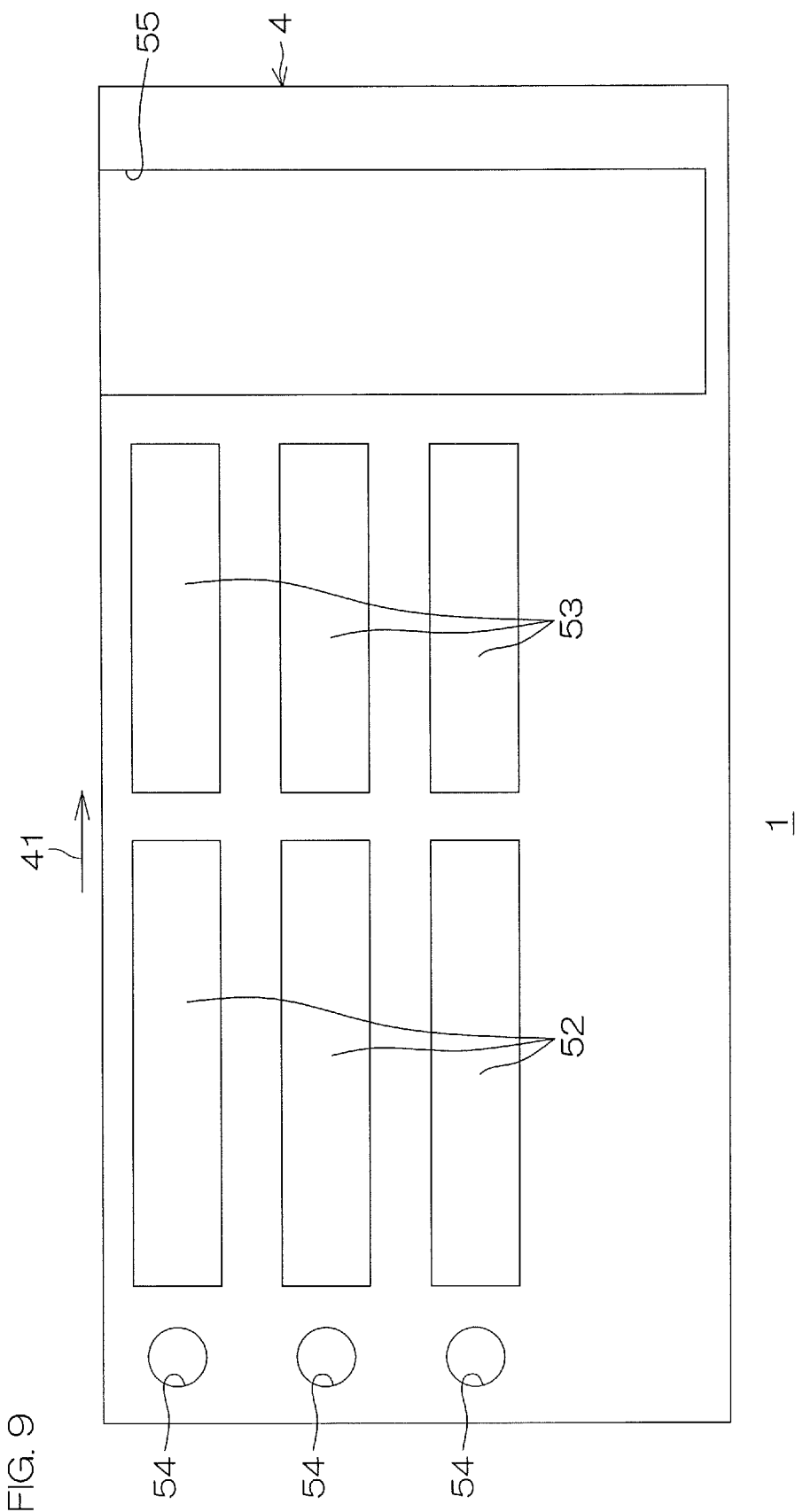
FIG. 9 is a bottom view of a region of the protective substrate indicated in FIG. 2.

FIG. 9 is a bottom view of a region of the protective substrate indicated in FIG. 2.

As shown in FIG. 2, FIG. 4A, FIG. 4B, FIG. 5, and FIG. 9, in an opposing surface 51 of the protective substrate 4 that opposes the actuator substrate 2, first recesses 52 are formed respectively at positions opposing the piezoelectric elements 9 in the respective piezoelectric element columns. Also, in the opposing surface 51 of the protective substrate 4, second recesses 53 are formed respectively at positions opposing the fuses 20 corresponding to the respective piezoelectric elements in the respective piezoelectric element columns. The second recesses 53 are disposed at the downstream side in the ink flow direction 41 with respect to the respective first recesses 52.

The ink supply passage 54 are disposed at an upstream side in the ink flow direction 41 with respect to the respective first recesses 52. The opening portions 55 are disposed at the downstream side in the ink flow direction 41 with respect to the respective second recesses 53. Each first recess 52 is formed to a rectangular shape that is slightly larger than a pattern of the upper electrode 13 of the corresponding piezoelectric element 9 in plan view. And, the corresponding piezoelectric element 9 is housed in each first recess 52. Each second recess 53 is formed to a rectangular shape that is slightly larger than a pattern of the corresponding fuse 20 in plan view. And, the corresponding fuse 20 faces each second recess 53.

Figure 7:
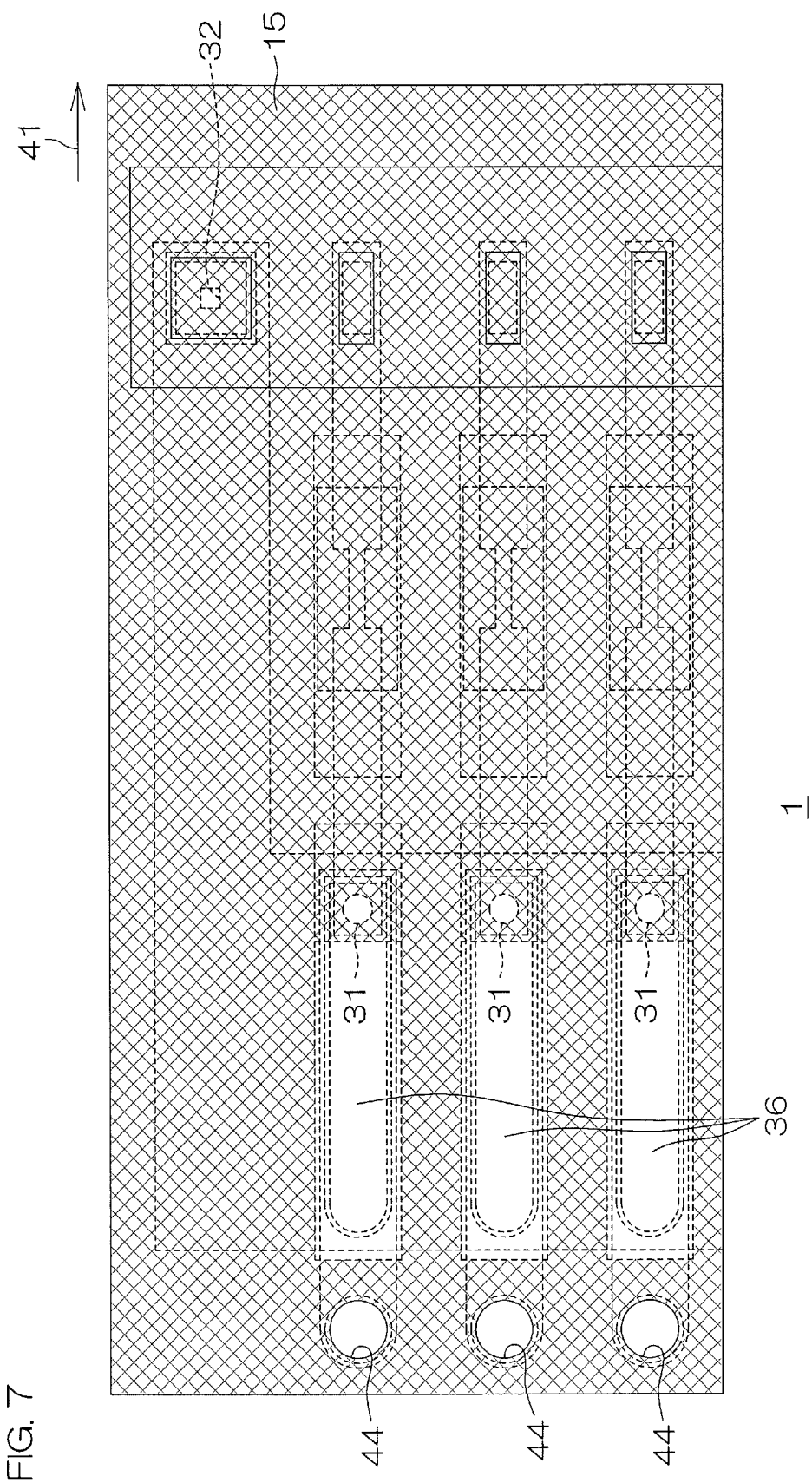
FIG. 7 is an illustrative plan view showing a pattern example of an insulating film of the inkjet print head of FIG. 1 and is a plan view corresponding to FIG. 2.
Figure 8:
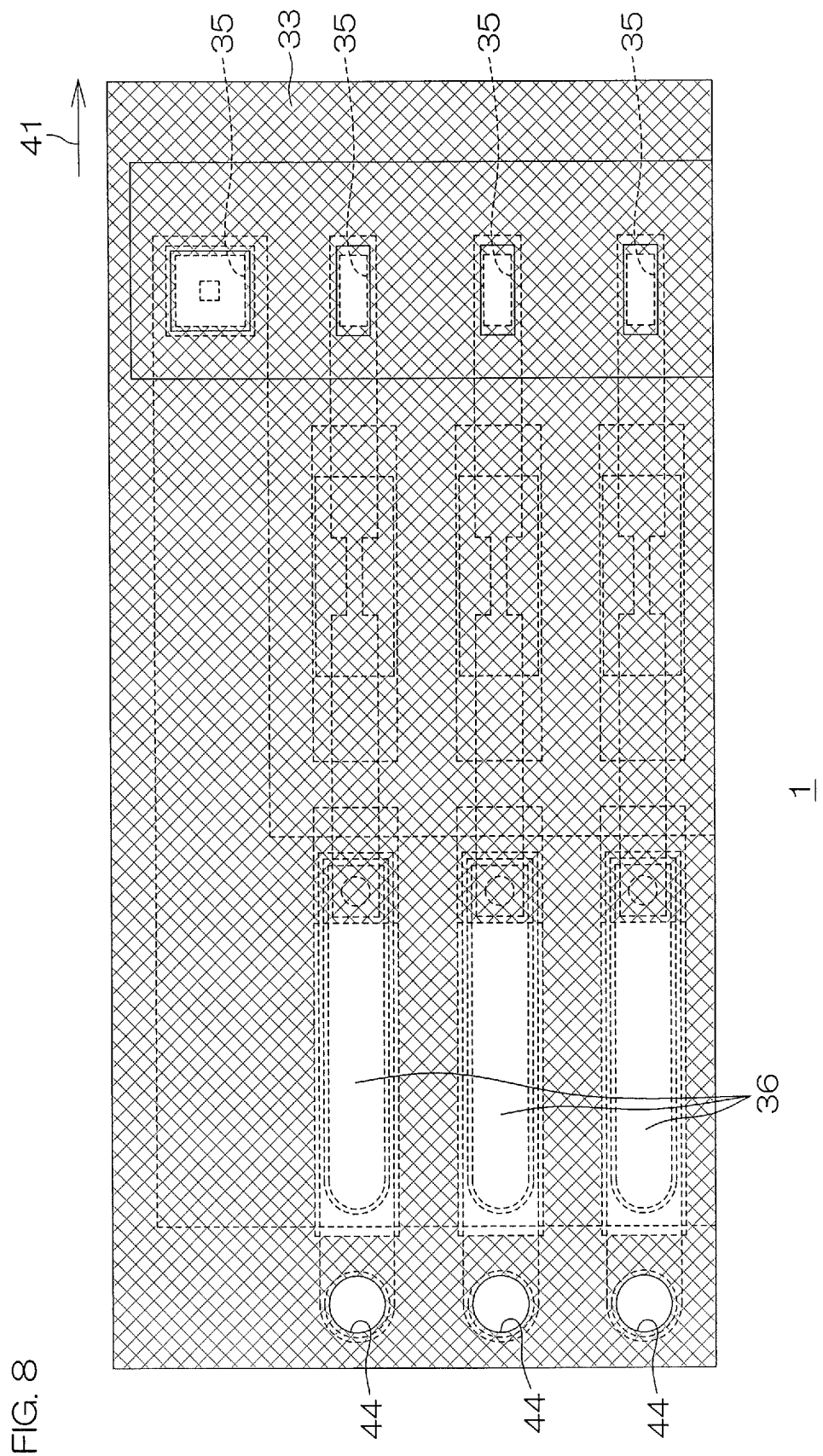
FIG. 8 is an illustrative plan view showing a pattern example of a passivation film of the inkjet print head of FIG. 1 and is a plan view corresponding to FIG. 2.

FIG. 7 is an illustrative plan view showing a pattern example of the insulating film of the inkjet print head of FIG. 1. FIG. 8 is an illustrative plan view showing a pattern example of the passivation film of the inkjet print head of FIG. 1.

In this preferred embodiment, on the actuator substrate 2, the insulating film 15 and the passivation film 33 are formed across substantially an entirety of a region outside the first recesses 52 of the protective substrate 4 in plan view. However, in this region, the ink supplying penetrating holes 44 and the contact holes 32 are formed in the insulating film 15. In this region, the ink supplying penetrating holes 44 and the pad openings 34 and 35 are formed in the passivation film 33.

In an inner region of each first recess 52 of the protective substrate 4, the insulating film 15 and the passivation film 33 are formed just at one end portion (upper wiring region) at which the upper wiring 17 is present. In this region, the passivation film 33 is formed such as to cover an upper surface and side surfaces of the upper wiring 17 on the insulating film 15. In other words, in the insulating film 15 and the passivation film 33, an opening 36 is formed in a region in the inner region of the first recess 52 that excludes the upper wiring region in plan view. The contact hole 31 is further formed in the insulating film 15.

An outline of a method for manufacturing the inkjet print head 1 shall now be described.

Figure 10:
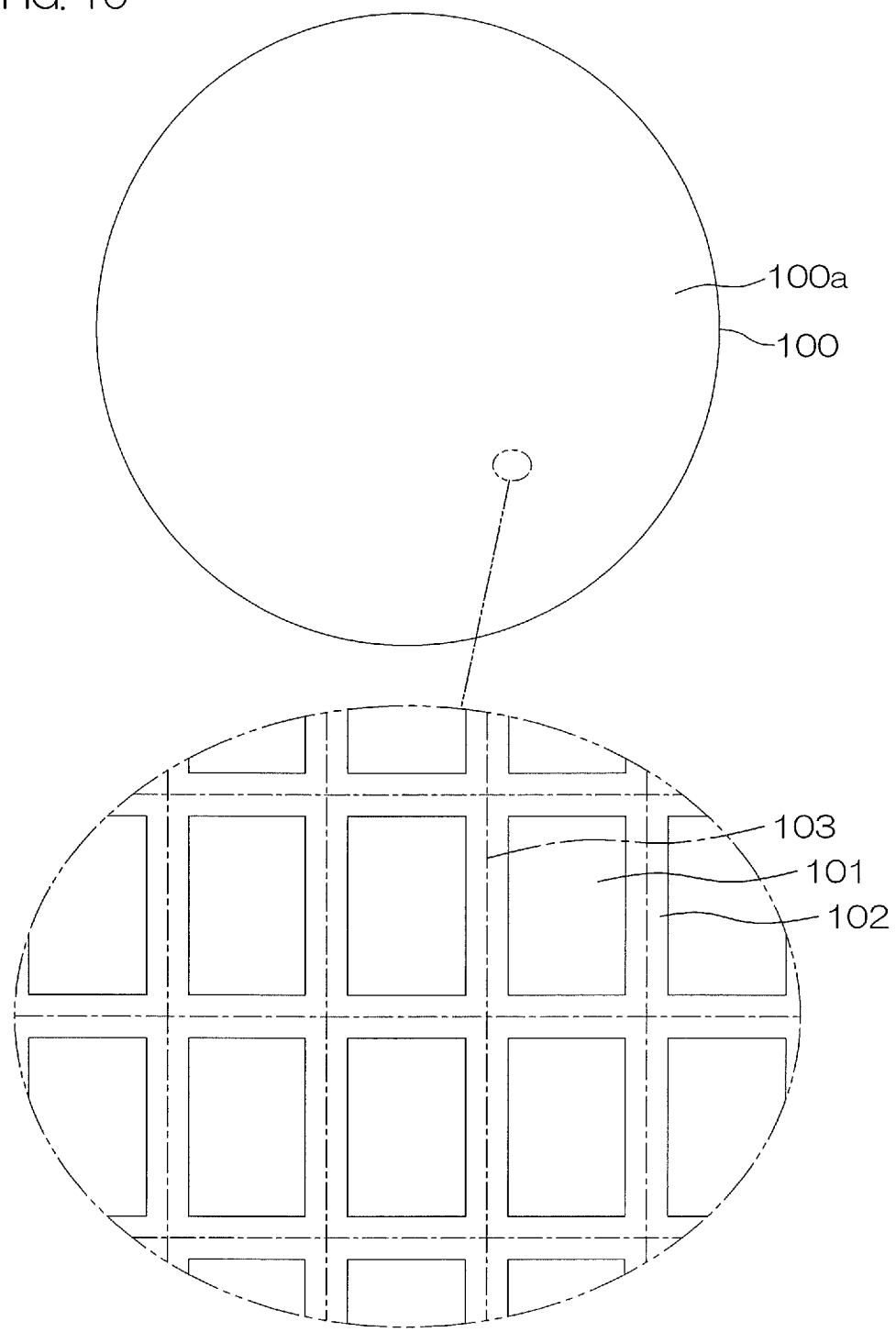
FIG. 10 is a plan view of a semiconductor wafer as a base substrate of an actuator substrate.

FIG. 10 is a plan view of a semiconductor wafer as a base substrate of the actuator substrate and shows a region of a portion in enlarged manner.

The semiconductor wafer (actuator wafer) 100 as the base substrate of the actuator substrate 2 is constituted, for example, of a silicon wafer. A front surface 100a of the actuator wafer 100 corresponds to being the front surface 2a of the actuator substrate. A plurality of functional element formation regions 101 are arrayed in a matrix on the front surface 100a of the actuator wafer 100. A scribe region (boundary region) 102 is provided between adjacent functional element formation regions 101. The scribe region 102 is a region of band shape having a substantially fixed width and extends in two orthogonal directions to be formed as a lattice. Intended cutting lines 103 are set in the scribe region 102. By performing necessary steps on the actuator wafer 100, a substrate assembly set (SA set) 110 (see FIG. 11H and FIG. 12H) with which the ink flow passages 5 and the cavities 19 are not formed but the arrangement of the substrate assembly SA is formed on each functional element formation region 101 is prepared.

A protective substrate set 130 (see FIG. 11I and FIG. 12I) that integrally includes a plurality of the protective substrates 4 corresponding to the respective functional element formation regions 101 of the substrate assembly set 110 is prepared in advance. The protective substrate set 130 is prepared by performing necessary steps on a semiconductor wafer (protective substrate wafer) as a base substrate of the protective substrate 4. The protective substrate wafer is constituted, for example, of a silicon wafer.

Also, a nozzle substrate set 150 (see FIG. 11K and FIG. 12K) that integrally includes a plurality of the nozzle substrates 3 corresponding to the respective functional element formation regions 101 of the substrate assembly set 110 is prepared in advance. The nozzle substrate set 150 is prepared by performing necessary steps on a semiconductor wafer (nozzle wafer) as a base substrate of the nozzle substrate 3. The nozzle wafer is constituted, for example, of a silicon wafer.

When the substrate assembly set 110 is prepared, the protective substrate set 130 is bonded to the substrate assembly set 110. Next, the ink flow passages 5 and the cavities 19 are formed in the substrate assembly set 110. Next, the nozzle substrate set 150 is bonded to the substrate assembly set 110. An inkjet print head set 170 (see FIG. 11K and FIG. 12K) that is constituted of the substrate assembly set 110, the protective substrate set 130, and the nozzle substrate set 150 is thereby obtained. Thereafter, the inkjet print head set 170 is cut (diced) along the intended cutting lines 103 by a dicing blade. Each individual inkjet print head (chip) 1 that includes the functional element formation region 101 is thereby cut out. The inkjet print head 1 is made to have the scribe region 102 at a peripheral edge region and the functional element formation region 101 in a central region surrounded by the scribe region 102.

The method for manufacturing the inkjet print head 1 shall be described specifically below.

FIG. 11A to FIG. 11K and FIG. 12A to FIG. 12K are sectional views showing a manufacturing process of the inkjet print head 1. FIG. 11A to FIG. 11K are sectional views corresponding to the section plane of FIG. 4A and FIG. 12A to FIG. 12K are sectional views corresponding to the section plane of FIG. 4B.

First, as shown in FIG. 11A and FIG. 12A, the actuator wafer 100 is prepared. However, as the actuator wafer 100, that which is thicker than a thickness of the actuator substrate 2 at the final stage is used. The movable film formation layer 10 is then formed on the front surface 100a of the actuator wafer 100. Specifically, a silicon oxide film (of, for example, 1.2 μm thickness) is formed on the front surface 100a of the actuator wafer 100.

Next, the first hydrogen barrier film 8 is formed on the movable film formation layer 10. The first hydrogen barrier film 8 is constituted, for example, of an $Al_2O_3$ film (of, for example, 50 nm to 100 nm thickness). The first hydrogen barrier film 8 prevents degradation of characteristics due to hydrogen reduction of the piezoelectric films 12 to be formed later. Also, the first hydrogen barrier film 8 prevents metal atoms from escaping from the piezoelectric films 12. When the metal atoms escape, the piezoelectric properties of the piezoelectric films 12 may degrade. Also, when the escaped metal atoms become mixed into a silicon layer that constitutes the movable films 10A, durability of the movable films 10A may degrade.

Next, a lower electrode film 71 that is a material film of the lower electrodes 11 is formed on the first hydrogen barrier film 8. The lower electrode film 71 is constituted, for example, of a Pt/Ti laminated film having a Ti film (of, for example, 10 nm to 40 nm thickness) as a lower layer and a Pt film (of, for example, 10 nm to 400 nm thickness) as an upper layer. Such a lower electrode film 71 may be formed by a sputtering method.

Next, a piezoelectric material film 72 that is a material of the piezoelectric films 12 is formed on an entire surface on the lower electrode film 71. Specifically, for example, the piezoelectric material film 72 of 1 μm to 3 μm thickness is formed by sol-gel method. Such a piezoelectric material film 72 is constituted of a sintered body of metal oxide crystal grains.

Next, an upper electrode film 73 that is a material of the upper electrodes 13 is formed on an entire surface on the piezoelectric material film 72. The upper electrode film 73 may, for example, be a single film of platinum (Pt). The upper electrode film 73 may instead be, for example, an $IrO_2$/Ir laminated film having an $IrO_2$ film (of, for example, 40 nm to 160 nm thickness) as a lower layer and an Ir film (of, for example, 40 nm to 160 nm thickness) as an upper layer. Such an upper electrode film 73 may be formed by a sputtering method.

Figure 11B:
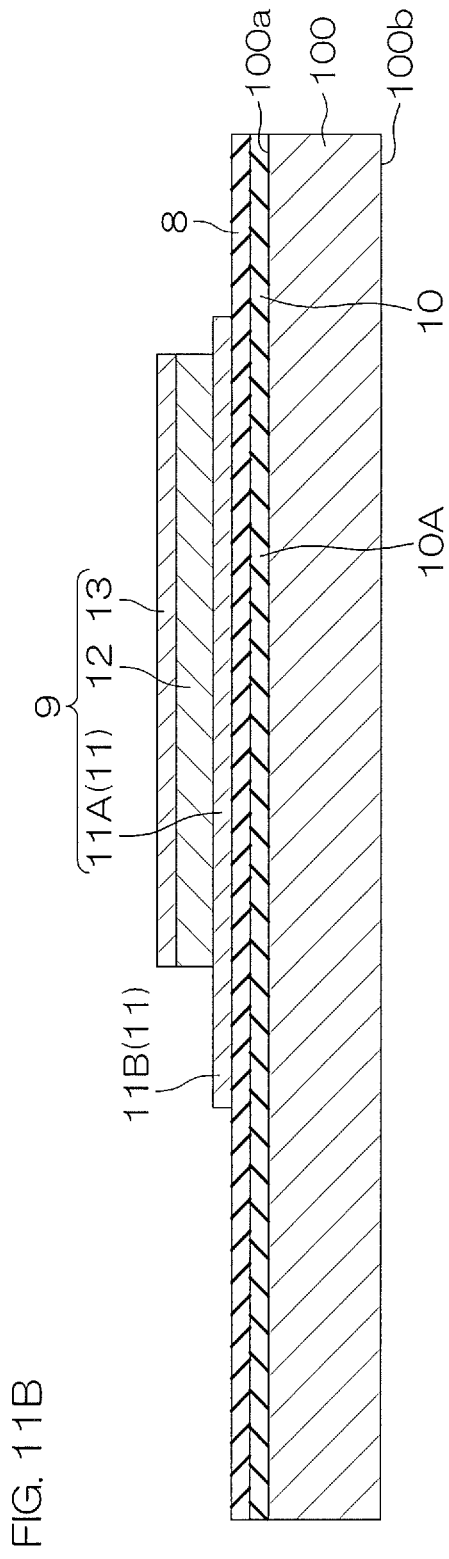
FIG. 11B is a sectional view of a step subsequent to that of FIG. 11A.
Figure 12B:
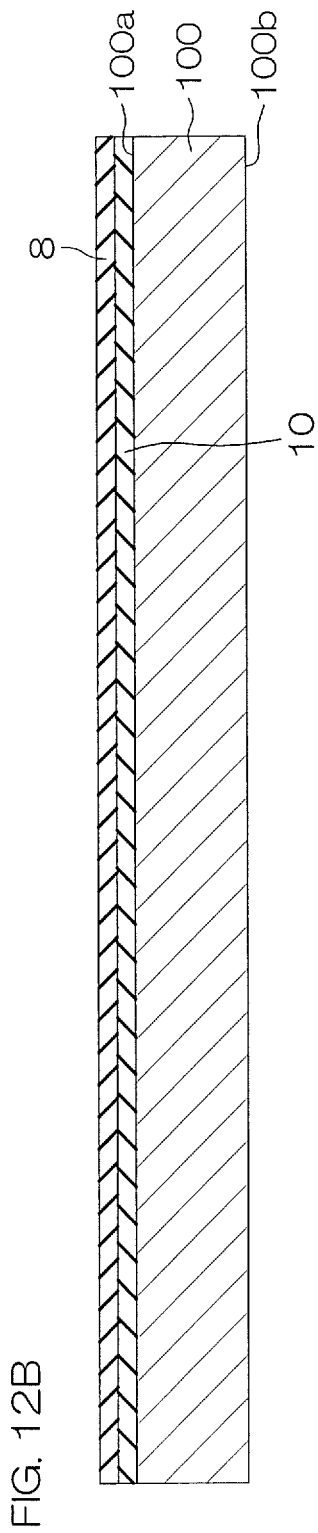
FIG. 12B is a sectional view of a step subsequent to that of FIG. 12A.

Next, as shown in FIG. 11B and FIG. 12B, patterning of the upper electrode film 73, the piezoelectric material film 72, and the lower electrode film 71 is performed. First, a resist mask with a pattern of the upper electrodes 13 is formed by photolithography. By the upper electrode film 73 and the piezoelectric material film 72 then being etched continuously using the resist mask as a mask, the upper electrodes 13 and the piezoelectric films 12 of predetermined patterns are formed.

Next, after the resist mask is peeled off, a resist mask with a pattern of the lower electrodes 11 is formed by photolithography. By the lower electrode film 71 then being etched using the resist mask as a mask, the lower electrodes 11 of the predetermined pattern are formed. The lower electrodes 11, each constituted of the main electrode portions 11A and the extension portion 11B, are thereby formed. The piezoelectric elements 9, each constituted of the main electrode portion 11A of the lower electrode 11, the piezoelectric film 12, and the upper electrode 13, are thus formed.

Figure 11C:
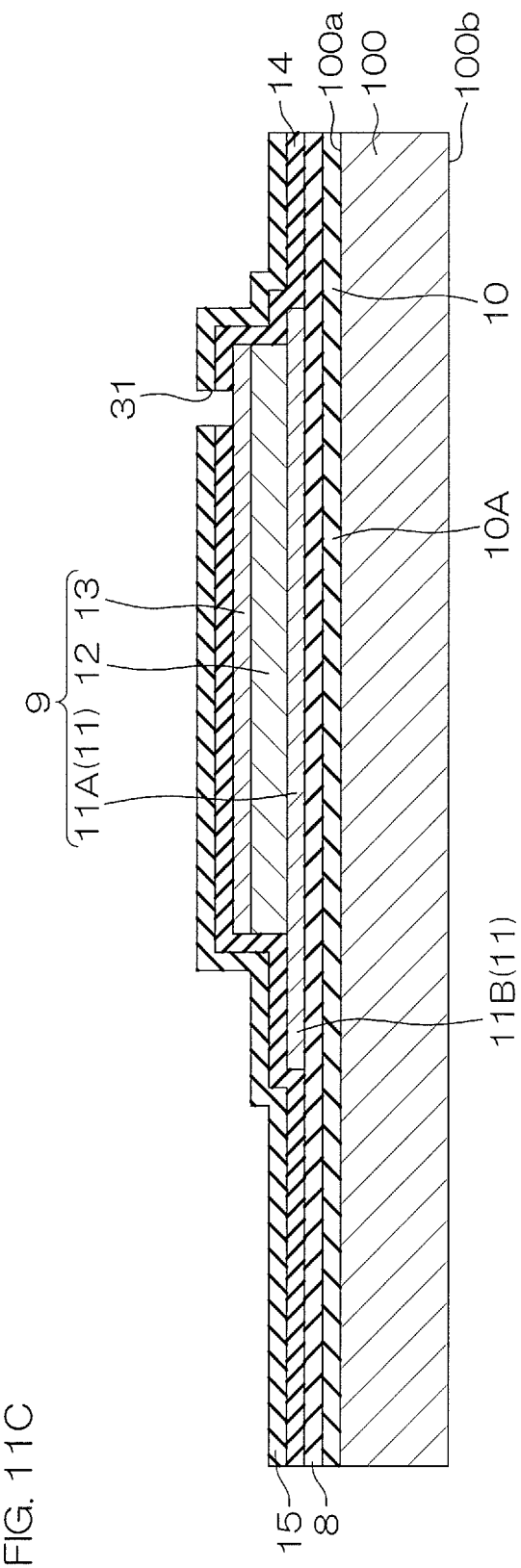
FIG. 11C is a sectional view of a step subsequent to that of FIG. 11B.
Figure 12C:
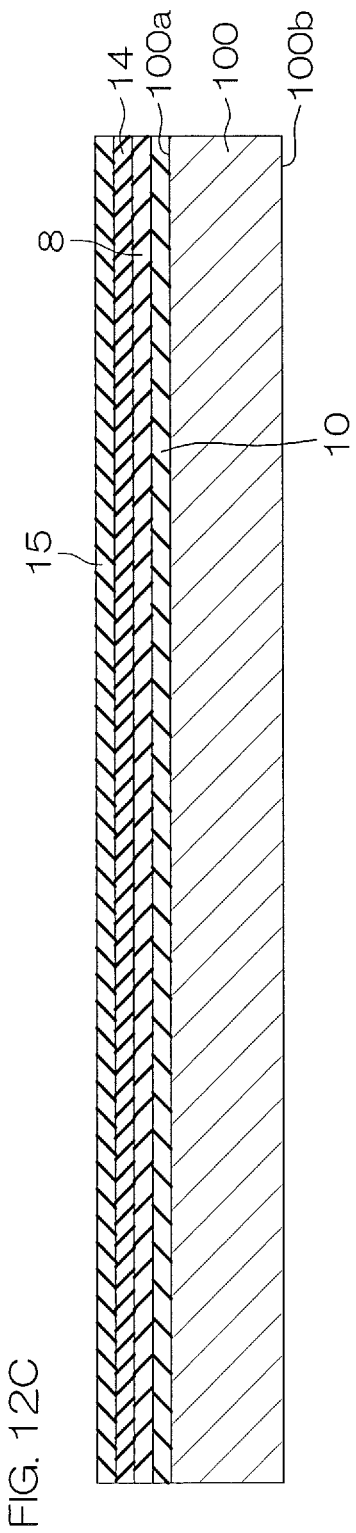
FIG. 12C is a sectional view of a step subsequent to that of FIG. 12B.

Next, as shown in FIG. 11C and FIG. 12C, after the resist mask is peeled off, the second hydrogen barrier film 14 that covers an entire surface is formed. The second hydrogen barrier film 14 may be an $Al_2O_3$ film formed by a sputtering method and a film thickness thereof may be 50 nm to 100 nm. Thereafter, the insulating film 15 is formed on an entire surface on the second hydrogen barrier film 14. The insulating film 15 may be an $SiO_2$ film and a film thickness thereof may be 200 nm to 300 nm. Subsequently, the insulating film 15 and the second hydrogen barrier film 14 are etched continuously to form the contact holes 31 and 32.

Figure 11D:
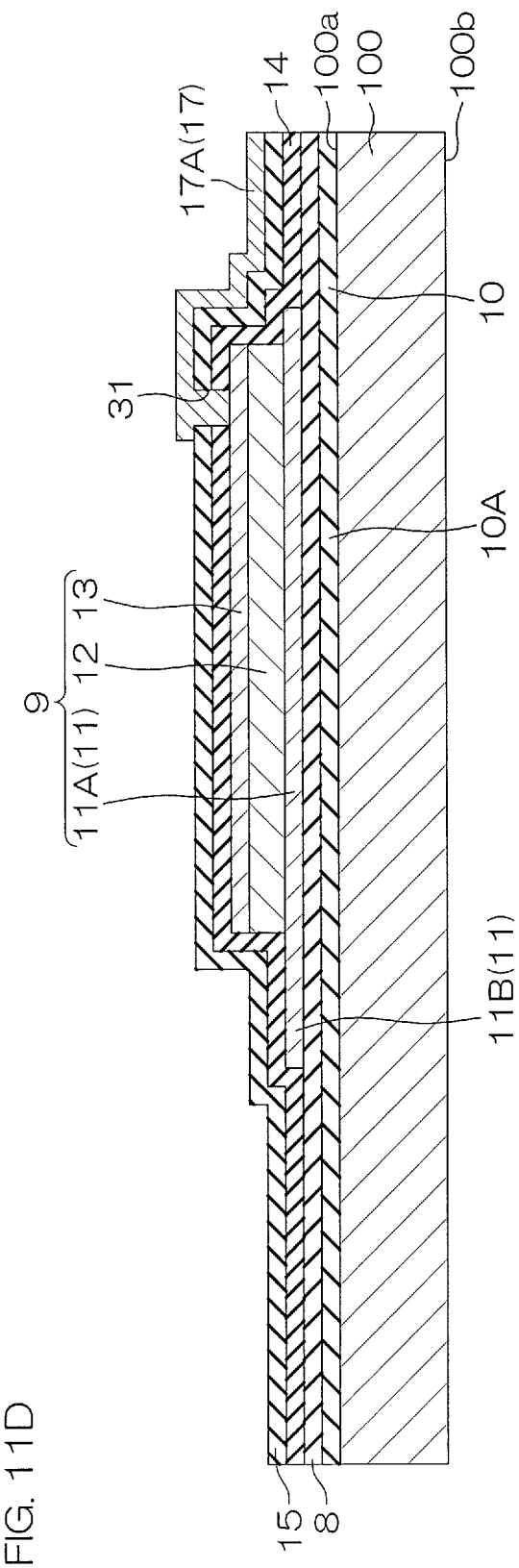
FIG. 11D is a sectional view of a step subsequent to that of FIG. 11C.

Next, as shown in FIG. 11D and FIG. 12D, a wiring film that constitutes the upper wirings 17, the fuses 20, and the lower wirings 18 is formed by a sputtering method on the insulating film 15 including interiors of the contact holes 31 and 32. Thereafter, by the wiring film being patterned by photolithography and etching, the upper wirings 17 (first wiring portions 17A and second wiring portions 17B), the fuses 20, and the lower wirings 18 are formed at the same time.

Figure 11E:
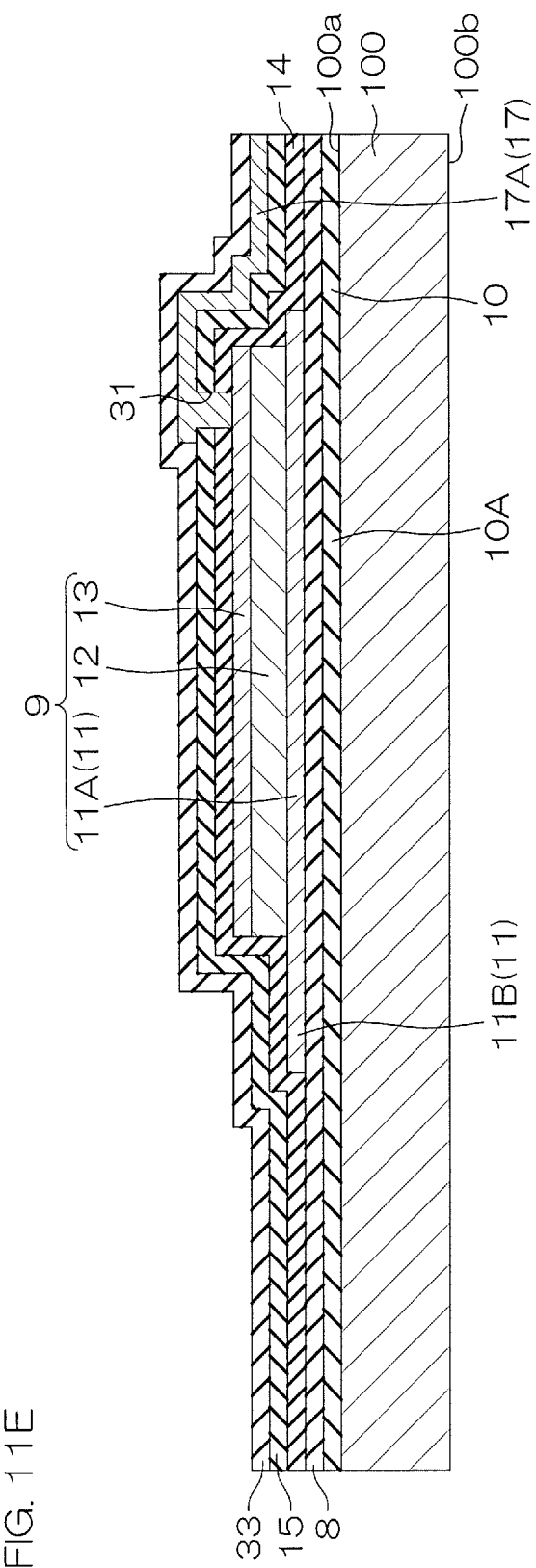
FIG. 11E is a sectional view of a step subsequent to that of FIG. 11D.

Next, as shown in FIG. 11E and FIG. 12E, the passivation film 33 that covers the upper wirings 17, the fuses 20, and the lower wirings 18 is formed on a front surface of the insulating film 15. The passivation film 33 is constituted, for example, of SiN. The passivation film 33 is formed, for example, by plasma CVD.

Figure 11F:
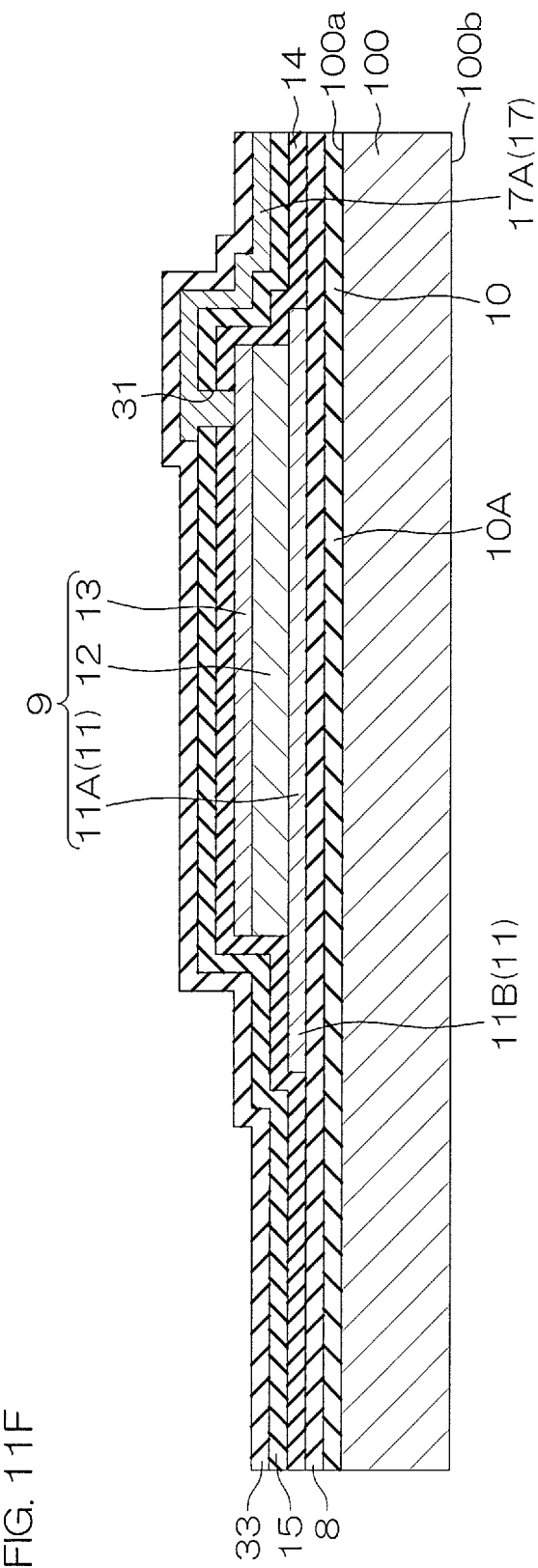
FIG. 11F is a sectional view of a step subsequent to that of FIG. 11E.
Figure 12F:
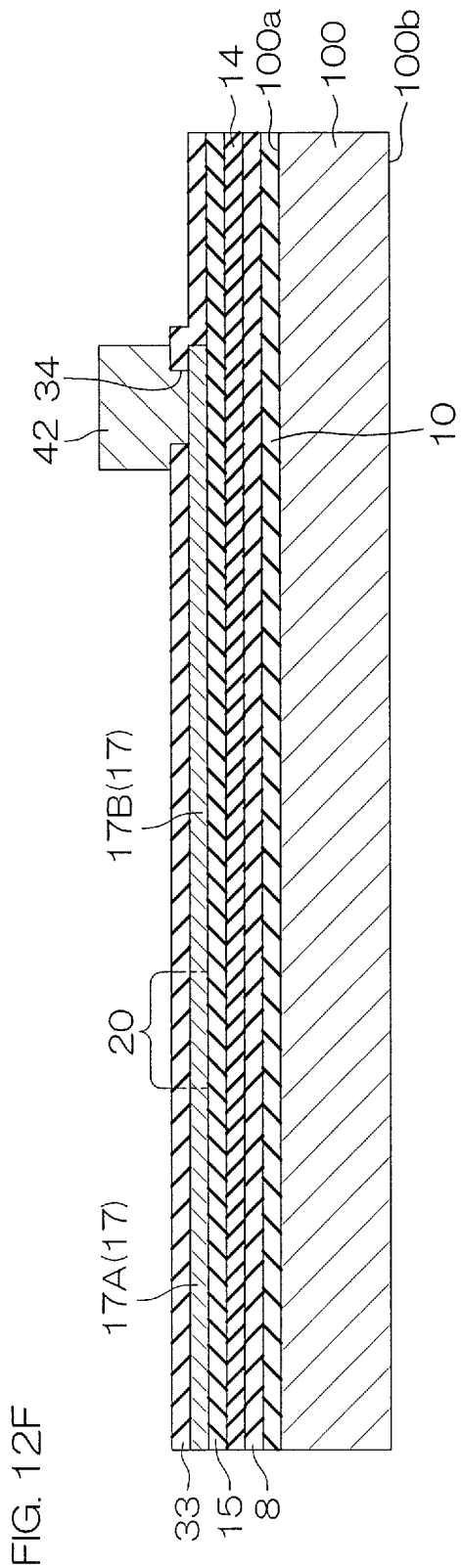
FIG. 12F is a sectional view of a step subsequent to that of FIG. 12E.

Next, a resist mask having openings corresponding to the pad openings 34 and 35 is formed by photolithography and the passivation film 33 is etched using the resist mask as a mask. The pad openings 34 and 35 are thereby formed in the passivation film 33 as shown in FIG. 11F and FIG. 12F. After the resist mask is peeled off, the upper electrode pads 42 and the lower electrode pads 43 are formed on the passivation film 33 respectively via the pad openings 34 and 35.

Figure 11G:
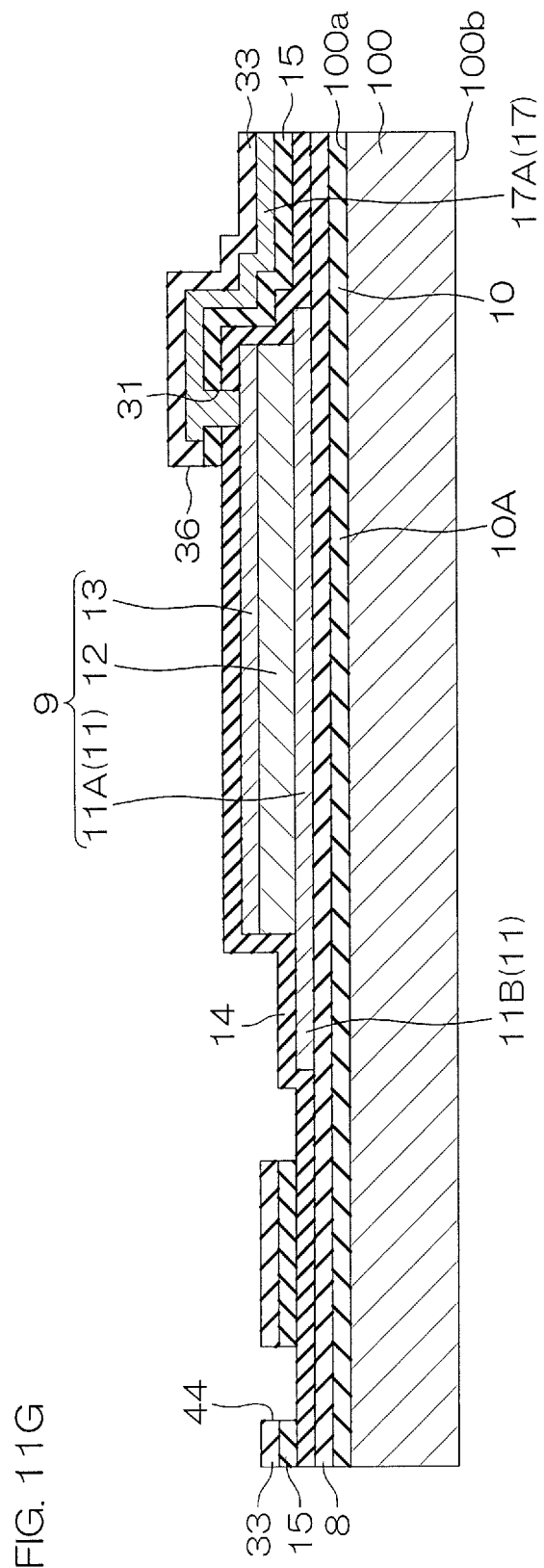
FIG. 11G is a sectional view of a step subsequent to that of FIG. 11F.
Figure 12G:
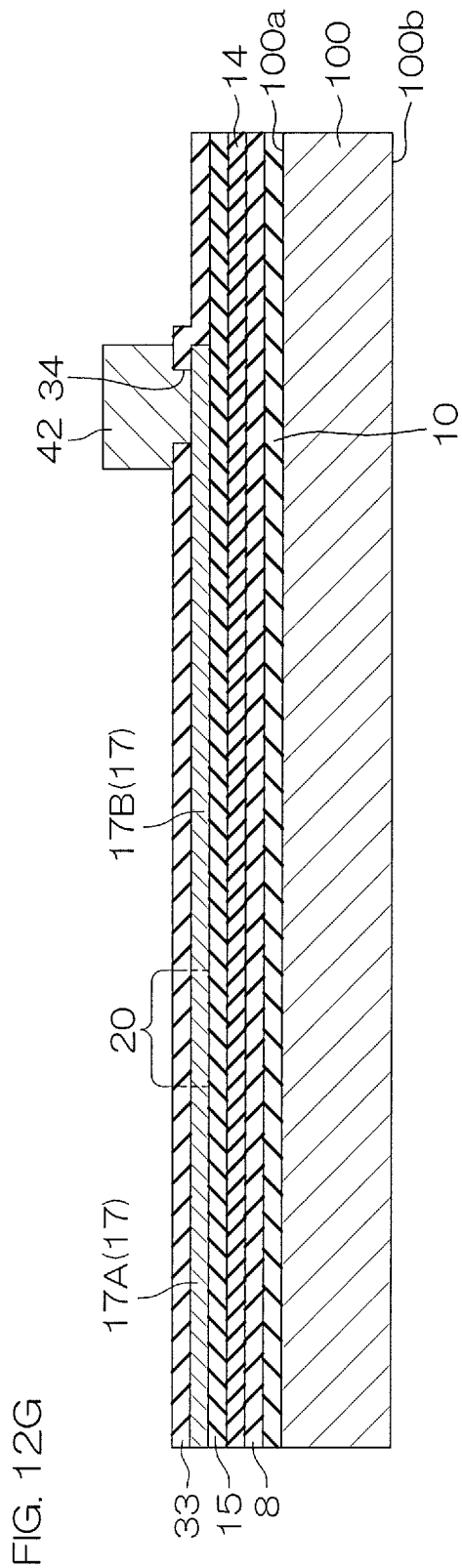
FIG. 12G is a sectional view of a step subsequent to that of FIG. 12F.
Figure 12:
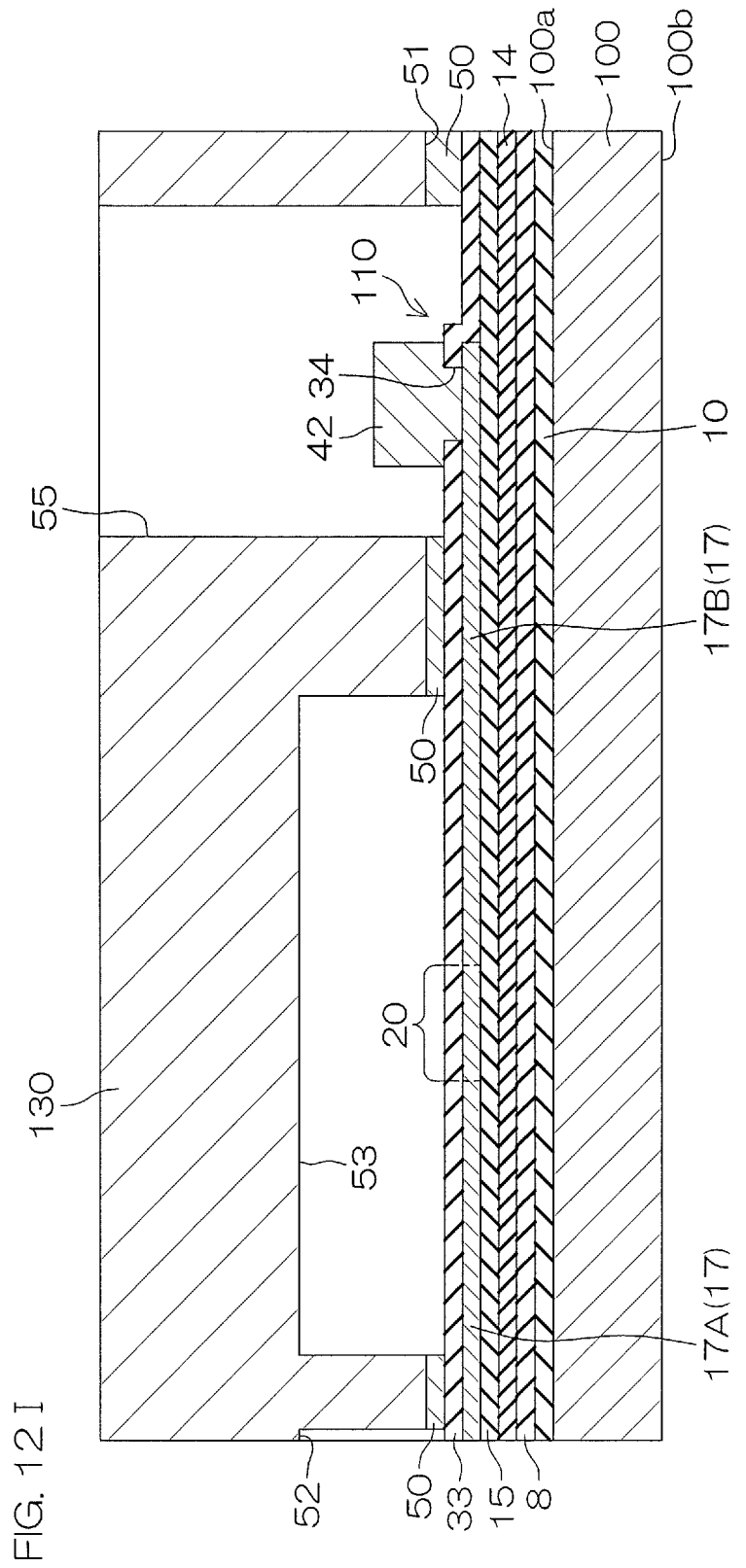
FIG. 12A is a sectional view of an example of a manufacturing process of the inkjet print head of FIG. 1.
FIG. 12D is a sectional view of a step subsequent to that of FIG. 12C.
FIG. 12E is a sectional view of a step subsequent to that of FIG. 12D.
FIG. 12H is a sectional view of a step subsequent to that of FIG. 12G.
FIG. 12I is a sectional view of a step subsequent to that of FIG. 12H.
FIG. 12J is a sectional view of a step subsequent to that of FIG. 12I.
FIG. 12K is a sectional view of a step subsequent to that of FIG. 12J.

Next, a resist mask having openings corresponding to the openings 36 and the ink supplying penetrating holes 44 is formed by photolithography and the passivation film 33 and the insulating film 15 are etched continuously using the resist mask as a mask. The openings 36 and the ink supplying penetrating holes 44 are thereby formed in the passivation film 33 and the insulating film 15 as shown in FIG. 11G and FIG. 12G.

Figure 11H:
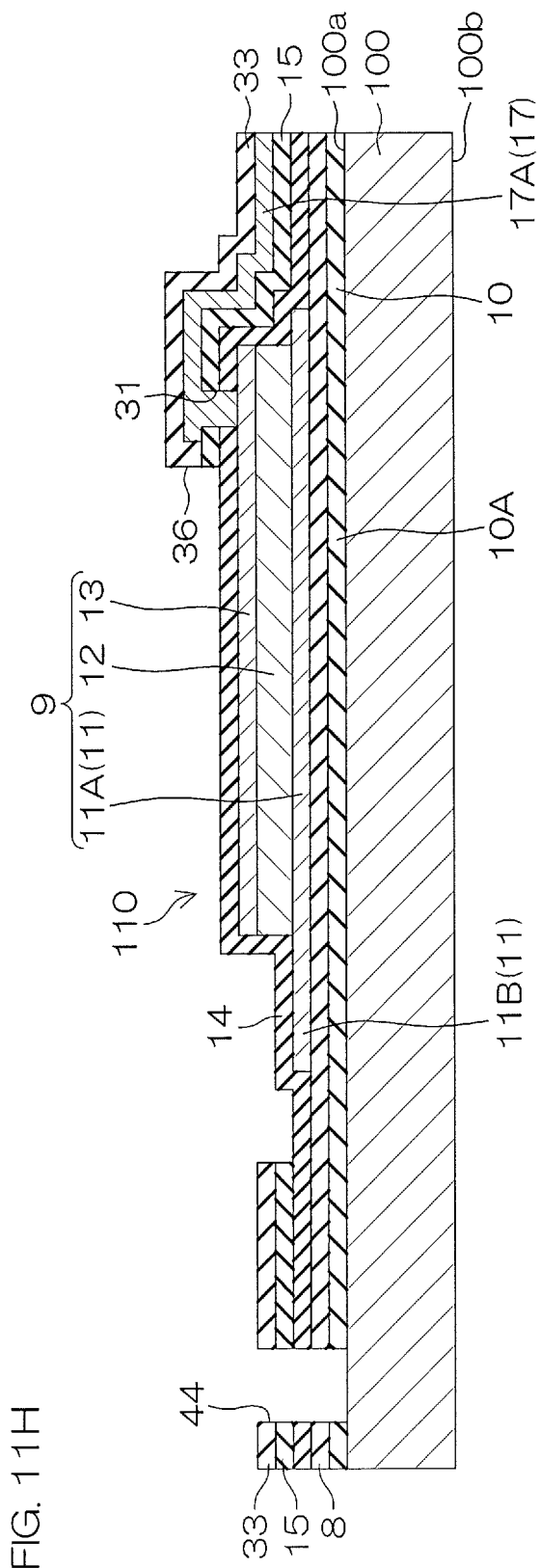
FIG. 11H is a sectional view of a step subsequent to that of FIG. 11G.

Next, the resist mask is peeled off. Then, a resist mask having openings corresponding to the ink supplying penetrating holes 44 is formed by photolithography and the second hydrogen barrier film 14, the first hydrogen barrier film 8, and the movable film formation layer 10 are etched using the resist mask as a mask. The ink supplying penetrating holes 44 are thereby formed in the second hydrogen barrier film 14, the first hydrogen barrier film 8, and the movable film formation layer 10 as shown in FIG. 11H and FIG. 12H. The substrate assembly set 110 is thereby prepared.

Next, as shown in FIG. 11I and FIG. 12I, the adhesive 50 is coated on the opposing surface 51 of the protective substrate set 130 and the protective substrate set 130 is fixed on the substrate assembly set 110 such that the ink supply passages 54 and the ink supplying penetrating holes 44 corresponding thereto are matched.

Figure 11J:
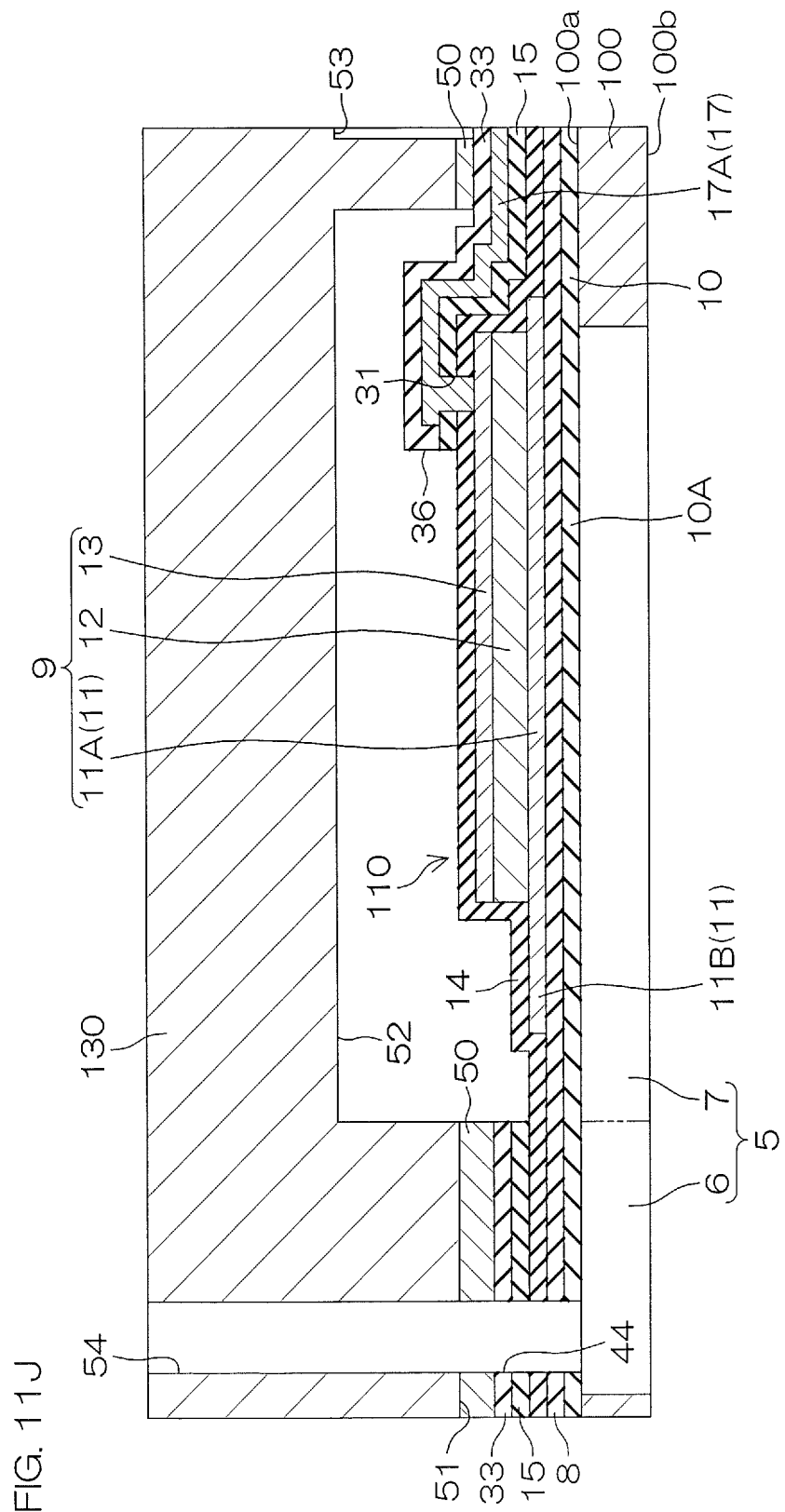
FIG. 11J is a sectional view of a step subsequent to that of FIG. 11I.

Next, as shown in FIG. 11J and FIG. 12J, rear surface grinding for thinning the actuator wafer 100 is performed. Film-thinning of the actuator wafer 100 is performed by the actuator wafer 100 being ground from a rear surface 100b. For example, the actuator wafer 100 of approximately 670 µm thickness in an initial state may be thinned to approximately 300 µm thickness. Thereafter, a resist mask having openings corresponding to the ink flow passages 5 (ink inflow portions 6 and pressure chambers 7) and openings corresponding to the cavities 19 is formed by photolithography on the rear surface 100b side of the actuator wafer 100 and the actuator wafer 100 is etched from the rear surface 100b using the resist mask as a mask. The ink flow passages 5 (ink inflow portions 6 and pressure chambers 7) and the cavities 19 are thereby formed in the actuator wafer 100.

In this process of etching, the first hydrogen barrier film 8 formed on the front surface of the movable film formation layer 10 prevents metal elements (Pb, Zr, and Ti in the case of PZT) from escaping from the piezoelectric films 12 and keeps the piezoelectric properties of the piezoelectric film 12 satisfactory. Also, as mentioned above, the first hydrogen barrier film 8 contributes to maintenance of the durability of the silicon layers that form the movable films 10A.

Figure 11K:
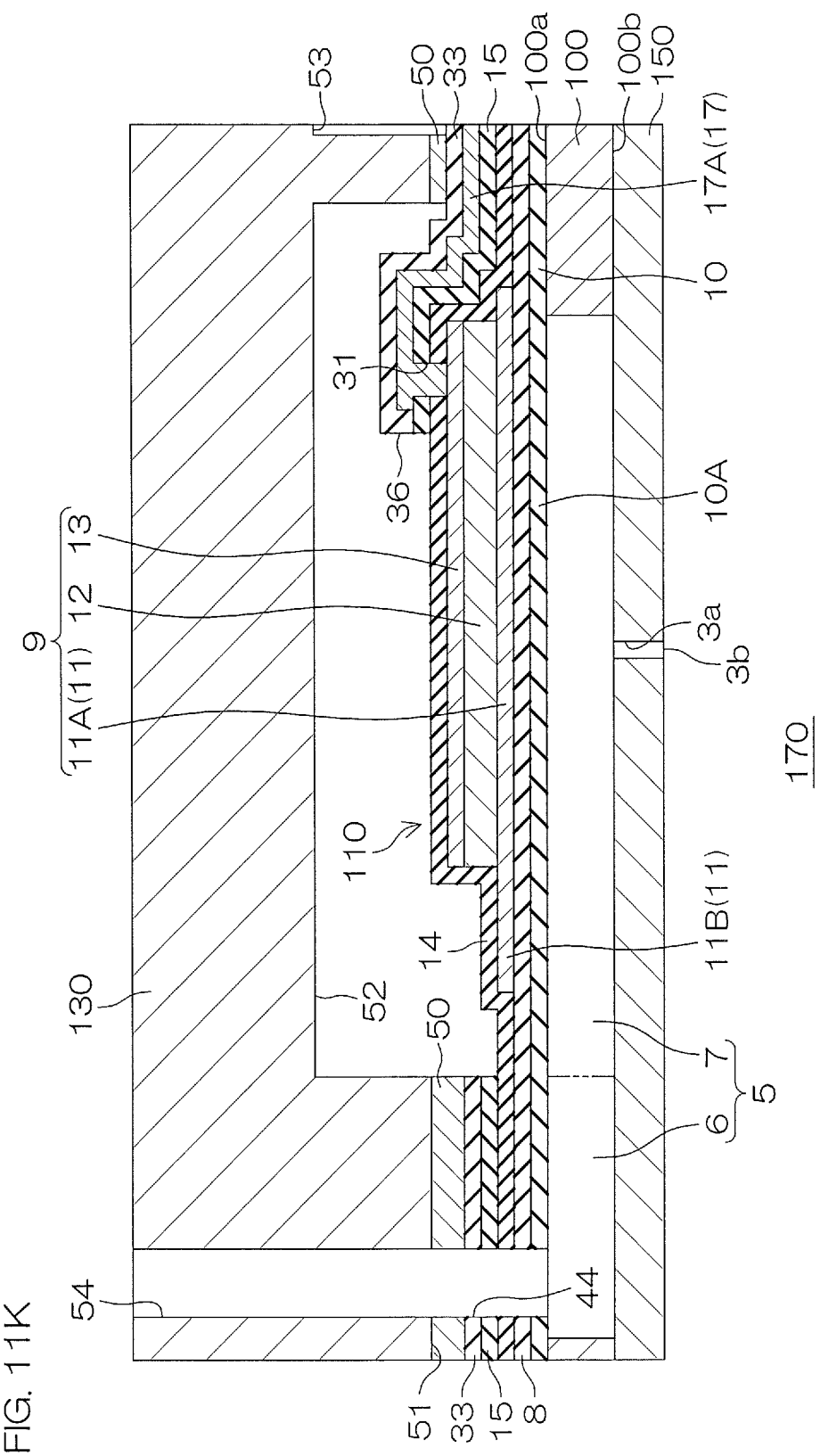
FIG. 11K is a sectional view of a step subsequent to that of FIG. 11J.
Figure 12K:
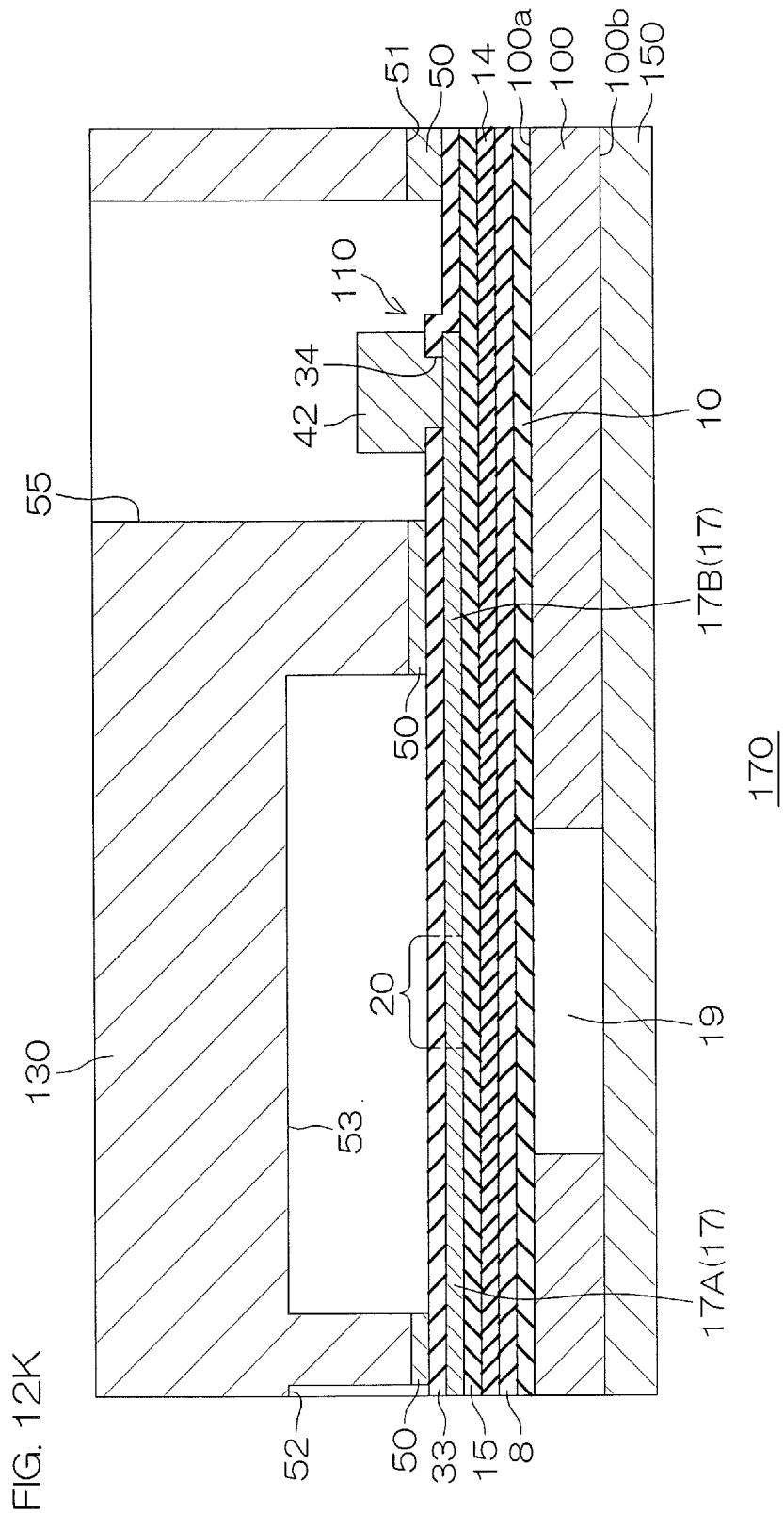

Thereafter, as shown in FIG. 11K and FIG. 12K, the nozzle substrate set 150 is bonded to the rear surface 100b of the actuator wafer 100. The inkjet print head set 170 that is constituted of the substrate assembly set 110, the protective substrate set 130, and the nozzle substrate set 150 is thereby obtained. Thereafter, the inkjet print head set 170 is cut along the intended cutting lines 103 by a dicing blade. That is, a step for cutting out the inkjet print heads 1 individually is performed.

When this step is completed, the actuator wafer 100 in the substrate assembly set 110 becomes the actuator substrate 2 of each individual inkjet print head 1. Also, the protective substrate set 130 becomes the protective substrate 4 of each individual inkjet print head 1. Also, a nozzle wafer 140 in the nozzle substrate set 150 becomes a silicon substrate in the nozzle substrate 3 of each individual inkjet print head 1. Individual pieces of the inkjet print heads 1, each having the structure shown in FIG. 1 to FIG. 6, are thereby obtained.

With each inkjet print head 1 thus obtained, side surfaces of the actuator substrate 2 and side surfaces of the nozzle substrate 3 are flush in all directions (flush across entire peripheries) in plan view. That is, with this preferred embodiment, the inkjet print head 1 with which there is no step between the actuator substrate 2 and the nozzle substrate 3 is obtained. Also, with this preferred embodiment, the side surfaces of the actuator substrate 2 and side surfaces of the protective substrate 4 are also flush in all directions (flush across entire peripheries) in plan view. That is, with this preferred embodiment, the inkjet print head 1 with which there is also no step between the actuator substrate 2 and the protective substrate 4 is obtained.

With the method for manufacturing an inkjet print head according to this preferred embodiment, the inkjet print head set 170 is prepared by the nozzle substrate set 150 being bonded to the substrate assembly set 110 with the protective substrate set 130 being fixed thereto. The inkjet print heads 1 are then cut out individually by the inkjet print head set 170 being diced. Therefore, in comparison to a case where, for example, an inkjet print head is manufactured by manufacturing each individual substrate assembly SA and thereafter bonding the nozzle substrate 3 individually to each individual substrate assembly SA, the inkjet print head 1 can be manufactured efficiently.

With the inkjet print head 1 according to this preferred embodiment, when dielectric breakdown occurs in one piezoelectric element 9, an excessive current flows through the upper wiring 17 of that piezoelectric element 9. However, since the fuse 20 is provided in an intermediate portion of the upper wiring 17, the fuse 20 becomes heated and is cut by fusion. The excessive current can thereby be prevented from flowing continuously through the upper wiring 17 such that damage of the movable film due to Joule heat generated in the upper wiring 17 can be suppressed and leakage of ink can be suppressed. Thereby, degradation due to ink of the upper wirings 17 connected to other adjacent piezoelectric elements 9 can be suppressed and spreading of a fault range can be suppressed.

[2] Second Preferred Embodiment

Figure 13:
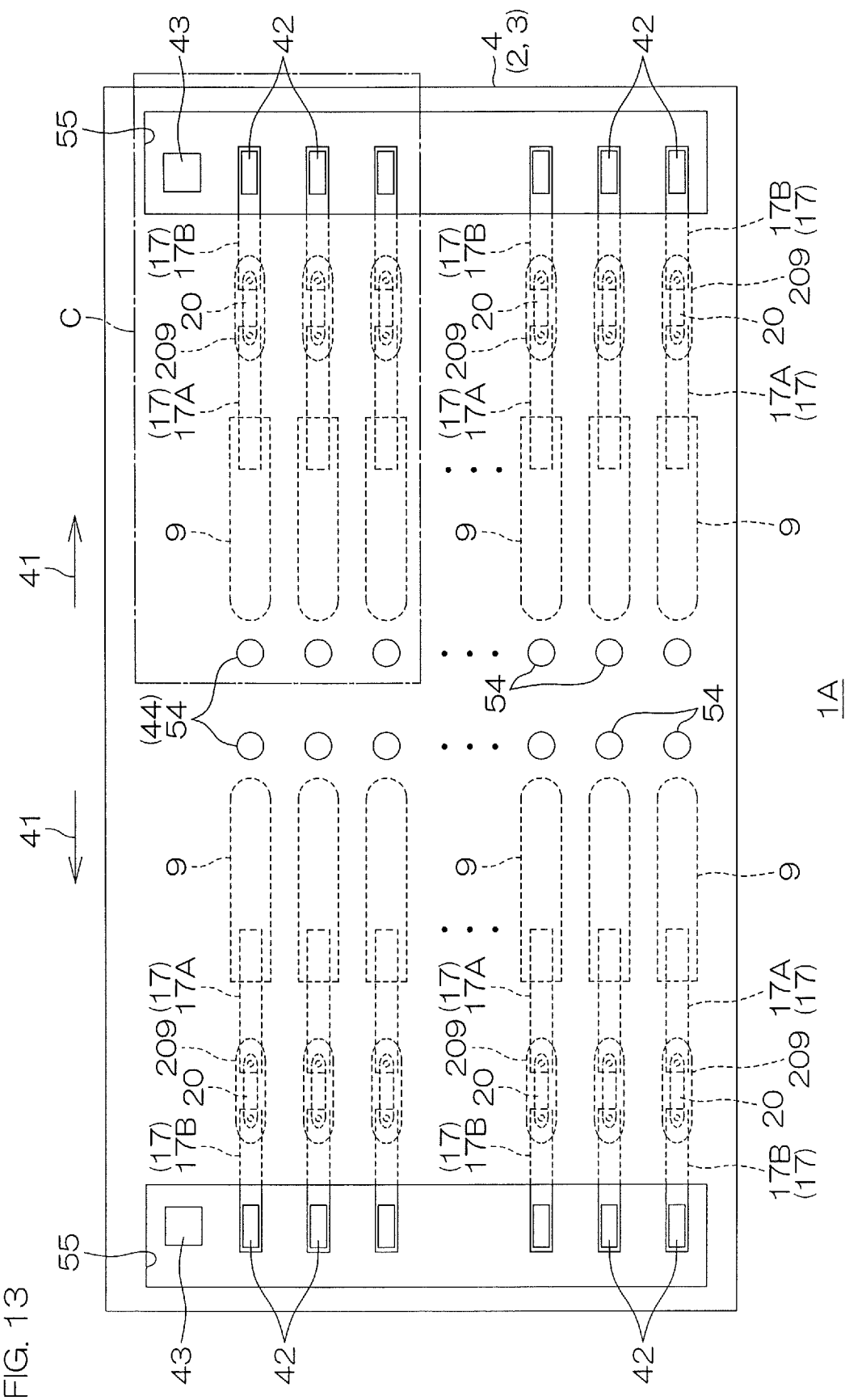
FIG. 13 is an illustrative plan view for describing the arrangement of an inkjet print head according to a second preferred embodiment of the present disclosure.
Figure 14:
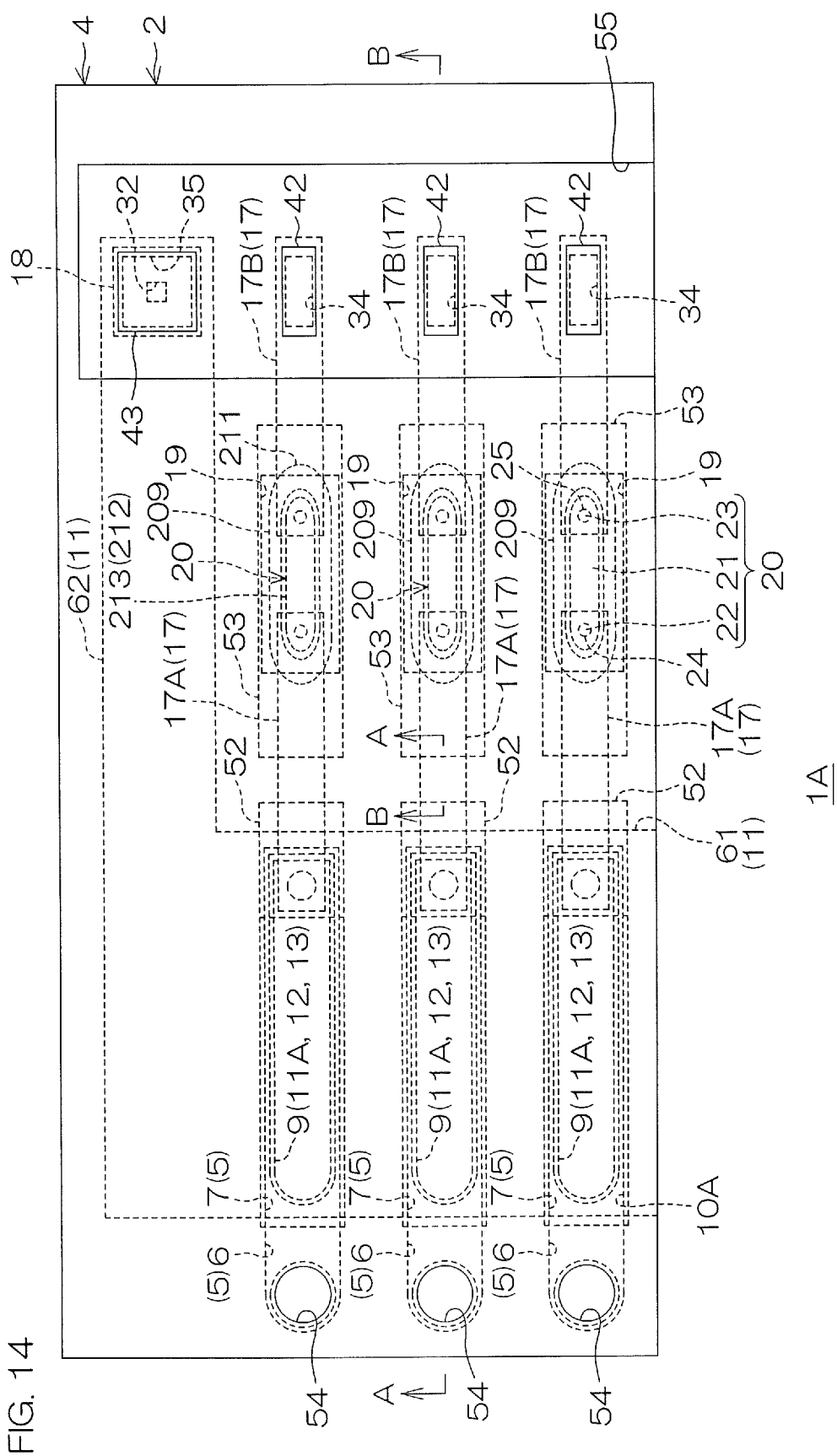
FIG. 14 is an illustrative partially enlarged plan view showing a portion C of FIG. 13 in enlarged manner and is a plan view including a protective substrate.
Figure 15:
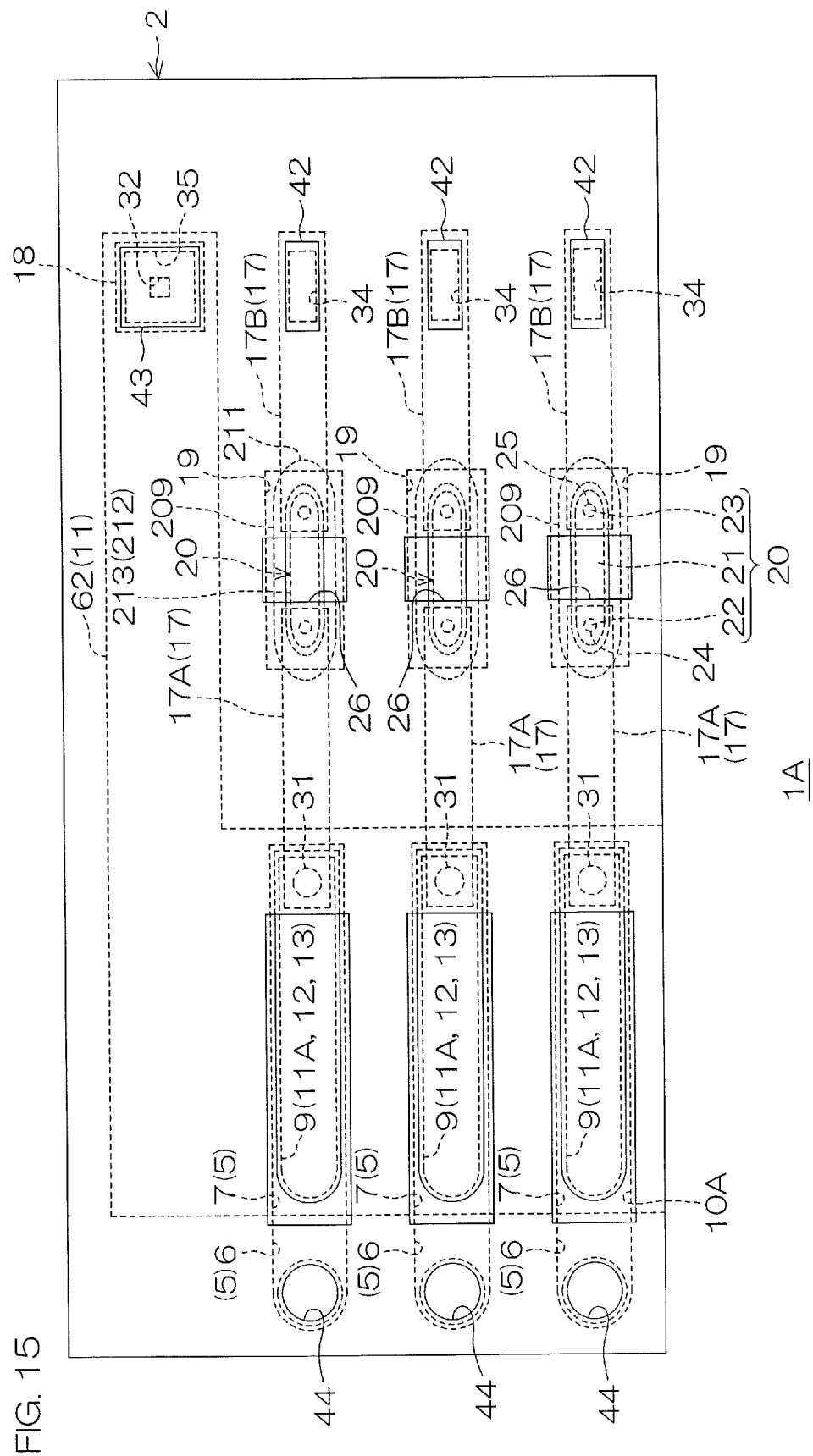
FIG. 15 is an illustrative partially enlarged plan view showing the portion C of FIG. 13 in enlarged manner and is a plan view with the protective substrate omitted.
Figure 16A:
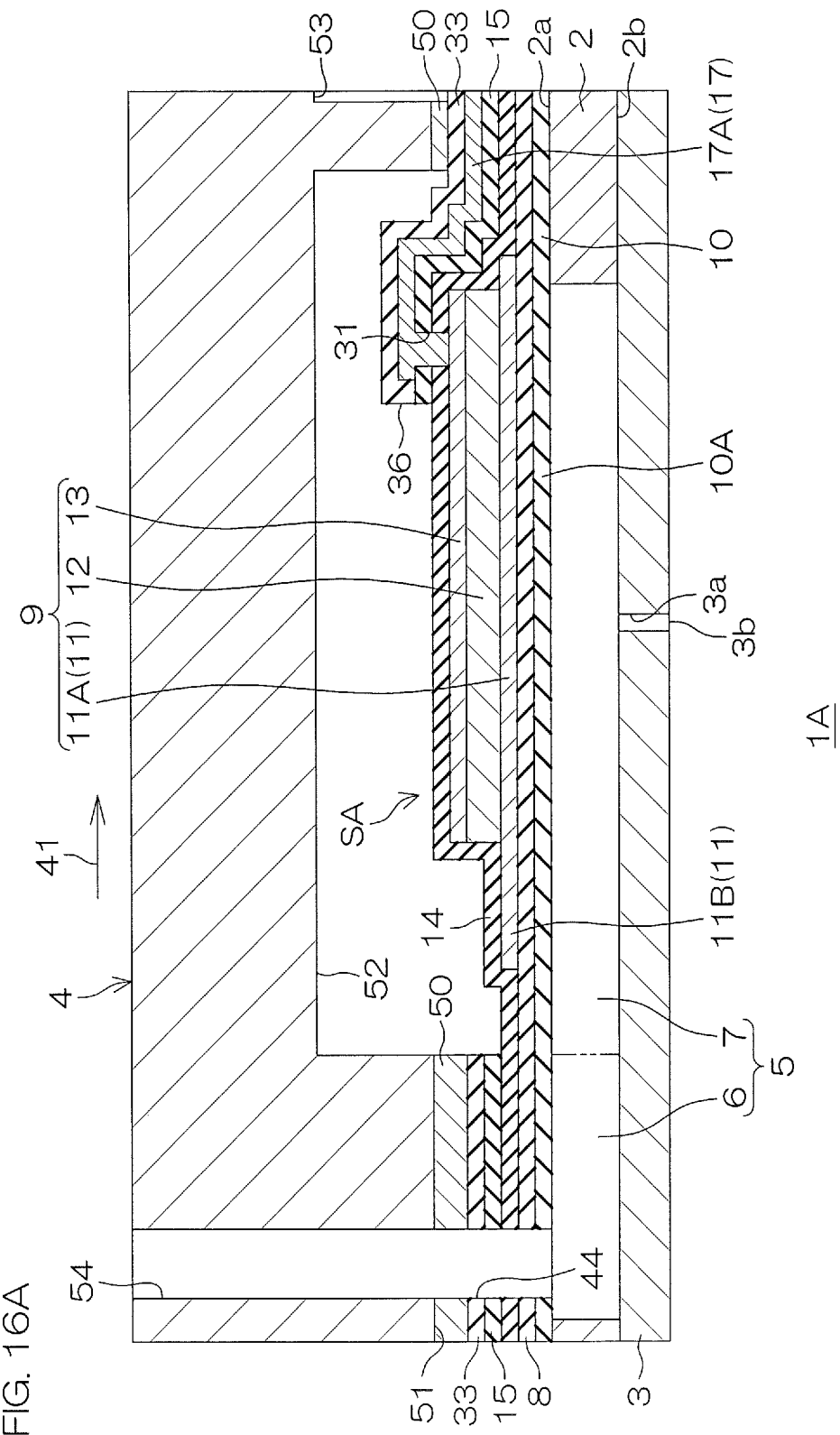
FIG. 16A is an illustrative sectional view taken along line A-A of FIG. 14.
Figure 16B:
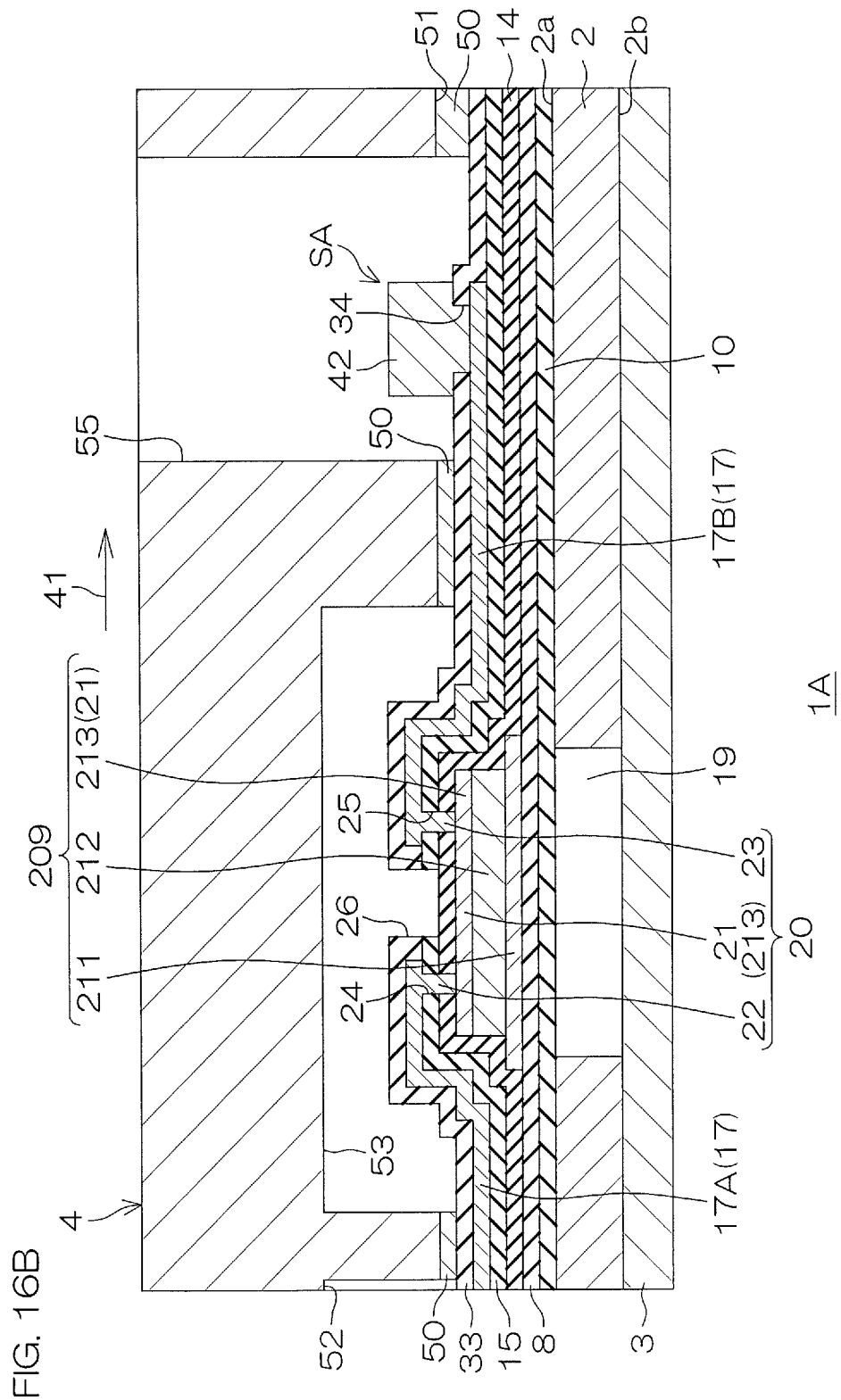
FIG. 16B is an illustrative sectional view taken along line B-B of FIG. 14.

FIG. 13 is a plan view of an inkjet print head according to a second preferred embodiment of the present disclosure and is a plan view corresponding to FIG. 1. FIG. 14 is an illustrative partially enlarged plan view showing a portion C of FIG. 13 in enlarged manner and is a plan view including a protective substrate. FIG. 15 is an illustrative partially enlarged plan view showing the portion C of FIG. 13 in enlarged manner and is a plan view with the protective substrate omitted. FIG. 16A is an illustrative sectional view of a region A of a sectional view taken along line A-A of FIG. 14. FIG. 16B is an illustrative sectional view of a region B of a sectional view taken along line B-B of FIG. 14.

In FIG. 13, portions corresponding to respective portions in FIG. 1 described above are indicated with the same reference signs attached as in FIG. 1. In FIG. 14, portions corresponding to respective portions in FIG. 2 described above are indicated with the same reference signs attached as in FIG. 2. In FIG. 15, portions corresponding to respective portions in FIG. 3 described above are indicated with the same reference signs attached as in FIG. 3. In FIG. 16A and FIG. 16B, portions corresponding to respective portions in FIG. 4A and FIG. 4B described above are indicated with the same reference signs attached as in FIG. 4A and FIG. 4B.

In comparison to the inkjet print head 1 according to the first preferred embodiment, the inkjet print head 1A according to the second preferred embodiment differs in the arrangement of the fuses 20. Specifically, each fuse 20 is constituted of a conductor 21 constituted of an upper electrode 213 of a dummy piezoelectric element 209, a first contact 22 connecting one end portion (first end portion) of the conductor 21 and the other end portion (second end portion) of the first wiring portion 17A of the upper wiring 17, and a second contact 23 connecting another end portion (second end portion) of the conductor 21 and the one end portion (first end portion) of the second wiring portion 17B of the upper wiring 17.

The dummy piezoelectric element 209 is formed above the cavity 19 and on the first hydrogen barrier film 8. Although the dummy piezoelectric element 209 has a similar structure as the piezoelectric element 9, it does not operate as a piezoelectric element. The dummy piezoelectric element 209 is constituted of a lower electrode 211 formed on the first hydrogen barrier film 8, a piezoelectric film 212 formed on the lower electrode 211, and an upper electrode 213 formed on the piezoelectric film 212. Although the upper wiring 17 is connected to the upper electrode 213, a lower wiring is not connected to the lower electrode 211.

In plan view, the lower electrode 211 is of a rectangular shape that is long in the long direction of the cavity 19 and both end edges are formed to outwardly projecting curved shapes. In plan view, a width in a short direction of the lower electrode 211 is substantially equal to the width in the short direction of the upper electrode 13 of the piezoelectric element 9. In plan view, both side edges of the lower electrode 211 are receded further inward than corresponding both side edges of the cavity 19. A length in a long direction of the lower electrode 211 is longer than the length in the long direction of the cavity 19. In plan view, both end edges of the lower electrode 211 are advanced further outward than corresponding both end edges of the cavity 19.

In plan view, the upper electrode 213 is of a rectangular shape that is long in the long direction of the cavity 19 and both end edges are formed to outwardly projecting curved shapes. A width in a short direction of the upper electrode 213 is shorter than the width in the short direction of the lower electrode 211. In plan view, both side edges of the upper electrode 213 are receded further inward than corresponding both side edges of the lower electrode 211. A length in a long direction of the upper electrode 213 is shorter than the length in the long direction of the cavity 19. In plan view, both end edges of the upper electrode 213 are receded further inward than corresponding both end edges of the cavity 19.

In plan view, the piezoelectric film 212 has the same pattern as the upper electrode 213. In plan view, the piezoelectric film 212 is of a rectangular shape that is long in the long direction of the cavity 19 and both end edges are formed to outwardly projecting curved shapes. A width in a short direction of the piezoelectric film 212 is shorter than the width in the short direction of the lower electrode 211. In plan view, both side edges of the piezoelectric film 212 are receded further inward than corresponding both side edges of the lower electrode 211. A length in a long direction of the piezoelectric film 212 is shorter than the length in the long direction of the cavity 19. In plan view, both end edges of the piezoelectric film 212 are receded further inward than corresponding both end edges of the cavity 19.

A front surface and side surfaces of the upper electrode 213, side surfaces of the piezoelectric film 212, and a front surface and side surfaces of the lower electrode 211 of the dummy piezoelectric element 209 are covered by the second hydrogen barrier film 14. The second hydrogen barrier film 14 is covered by the insulating film 15.

The other end portion of the first wiring portion 17A is disposed above one end portion (upstream side end portion in the ink flow direction 41) of the upper electrode 213. In this preferred embodiment, the width in the short direction of the upper electrode 213 is shorter than the width of the first wiring portion 17A (upper wiring 17). In plan view, both side edges of the one end portion of the upper electrode 213 are receded further inward than corresponding both side edges of the other end portion of the first wiring portion 17A.

A contact hole 24 that penetrates continuously through the second hydrogen barrier film 14 and the insulating film 15 is formed between the first wiring portion 17A and the upper electrode 213. The first contact 22 that connects the other end portion of the first wiring portion 17A and the one end portion of the upper electrode 213 (conductor 21) is embedded in the contact hole 24. The first contact 22 is formed integral to the first wiring portion 17A.

The one end portion of the second wiring portion 17B is disposed above another end portion of the upper electrode 213. In this preferred embodiment, the width in the short direction of the upper electrode 213 is shorter than a width of the second wiring portion 17B (upper wiring 17). In plan view, both side edges of the other end portion of the upper electrode 213 are receded further inward than corresponding both side edges of the one end portion of the second wiring portion 17B.

A contact hole 25 that penetrates continuously through the second hydrogen barrier film 14 and the insulating film 15 is formed between the second wiring portion 17B and the upper electrode 213. The second contact 23 that connects the one end portion of the second wiring portion 17B and the other end portion of the upper electrode 213 (conductor 21) is embedded in the contact hole 25. The second contact 23 is formed integral to the second wiring portion 17B. A transverse cross-sectional area of at least one of the first contact 22 and the second contact 23 is preferably smaller than a transverse cross-sectional area of an upper wiring portion (upper contact) inside the contact hole 31. In this preferred embodiment, the transverse cross-sectional areas of the first contact 22 and the second contact 23 are smaller than the transverse cross-sectional area of the upper wiring portion inside the contact hole 31.

In an inner region of each second recess 53 of the protective substrate 4, the insulating film 15 and the passivation film 33 are formed at one end portion at which the first wiring portion 17A is present and another end portion at which the second wiring portion 17B is present but are not formed in a lengthwise central portion. In the inner region of the second recess 53, the passivation film 33 is formed such as to cover an upper surface and side surfaces of the first wiring portion 17A on the insulating film 15 and an upper surface and side surfaces of the second wiring portion 17B on the insulating film 15. In other words, in the insulating film 15 and the passivation film 33, an opening 26 is formed in a region in the inner region of the second recess 53 that excludes the upper wiring region in plan view. The contact holes 24 and 25 are further formed in the insulating film 15.

The same effects as the first preferred embodiment are also obtained with the second preferred embodiment.

Here, if, as with the conductor 21 (upper electrode 213) described above, the width in the short direction of the conductor 21 is shorter than the width of the upper wiring 17 and the conductor 21 has a property of being more likely to be cut by fusion than the upper wiring 17, the transverse cross-sectional areas of the first contact 22 and the second contact 23 may be not less than the transverse cross-sectional area of the upper wiring portion inside the contact hole 31.

Also, if the transverse cross-sectional area of at least one of the first contact 22 and the second contact 23 is smaller than the transverse cross-sectional area of the upper wiring portion inside the contact hole 31 and at least one of the first contact 22 and the second contact 23 has a property of being more likely to be cut by fusion than the upper wiring 17, the width in the short direction of the upper electrode 213 (conductor 21) may be not less than the width of the upper wiring 17.

A method for manufacturing the inkjet print head 1A shall be described specifically below.

FIG. 17A to FIG. 17J and FIG. 18A to FIG. 18J are sectional views showing a manufacturing process of the inkjet print head 1A. FIG. 17A to FIG. 17J are sectional views corresponding to the section plane of FIG. 16A and FIG. 18A to FIG. 18J are sectional views corresponding to the section plane of FIG. 16B.

Figure 17A:
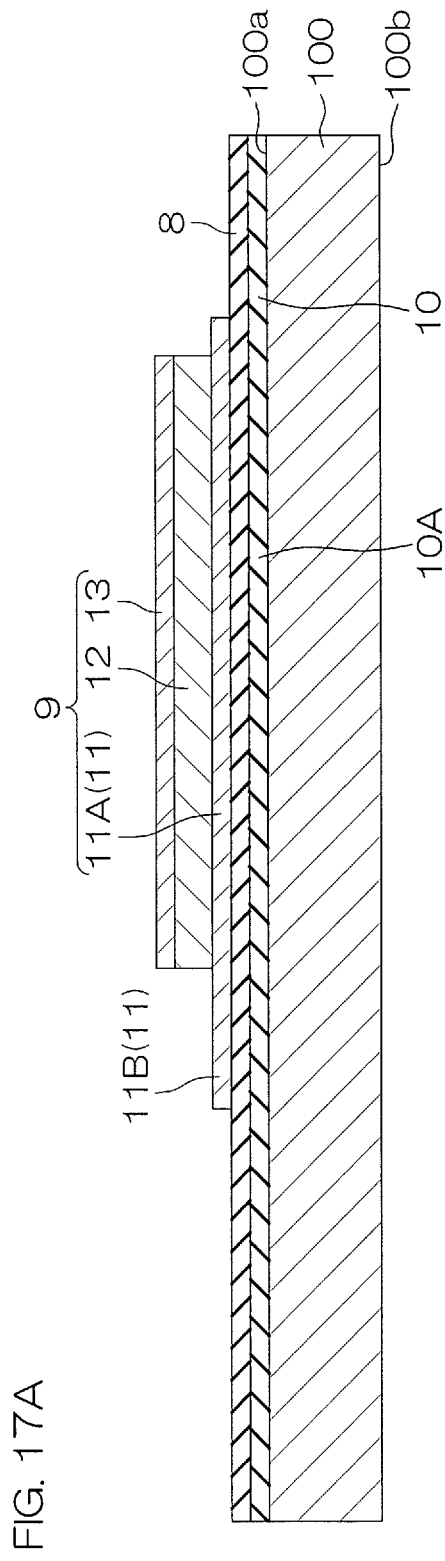
FIG. 17A is a sectional view of an example of a manufacturing process of the inkjet print head of FIG. 13.
Figure 18A:
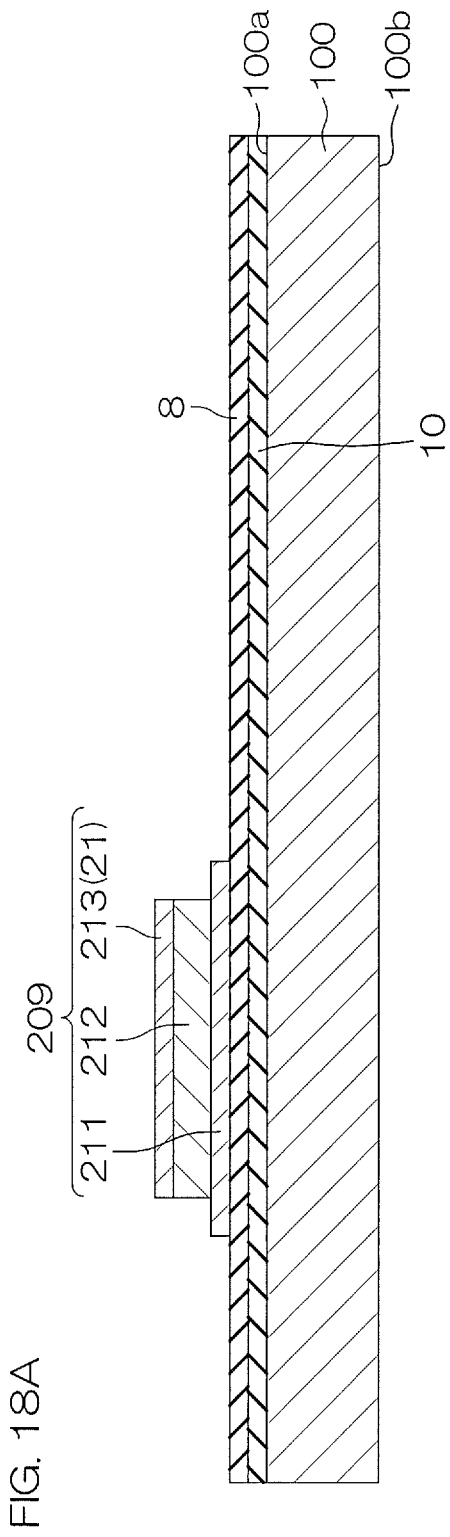
FIG. 18A is a sectional view of an example of a manufacturing process of the inkjet print head of FIG. 13.

First, after the same step as that of FIG. 11A and FIG. 12A described above has been performed, patterning of the upper electrode film 73, the piezoelectric material film 72, and the lower electrode film 71 is performed as shown in FIG. 17A and FIG. 18A. First, a resist mask with patterns of the upper electrodes 13 and 213 is formed by photolithography. By the upper electrode film 73 and the piezoelectric material film 72 then being etched continuously using the resist mask as a mask, the upper electrodes 13 and 233 and the piezoelectric films 12 and 212 of predetermined patterns are formed.

Next, after the resist mask is peeled off, a resist mask with patterns of the lower electrodes 11 and 211 is formed by photolithography. By the lower electrode film 71 then being etched using the resist mask as a mask, the lower electrodes 11 and 211 of the predetermined patterns are formed.

The lower electrodes 11 are each constituted of the main electrode portions 11A and the extension portion 11B. The piezoelectric elements 9, each constituted of the main electrode portion 11A of the lower electrode 11, the piezoelectric film 12, and the upper electrode 13, are thus formed. Also, the dummy piezoelectric elements 209, each constituted of the lower electrode 211, the piezoelectric film 212, and the upper electrode 213, are thus formed. The upper electrode 213 constitutes the conductor 21 of the fuse 20.

Next, as shown in FIG. 17B and FIG. 18B, after the resist mask is peeled off, the second hydrogen barrier film 14 that covers the entire surface is formed. Thereafter, the insulating film 15 is formed on the entire surface on the second hydrogen barrier film 14. Subsequently, the insulating film 15 and the second hydrogen barrier film 14 are etched continuously to form the contact holes 31, 32, 24, and 25.

Figure 17C:
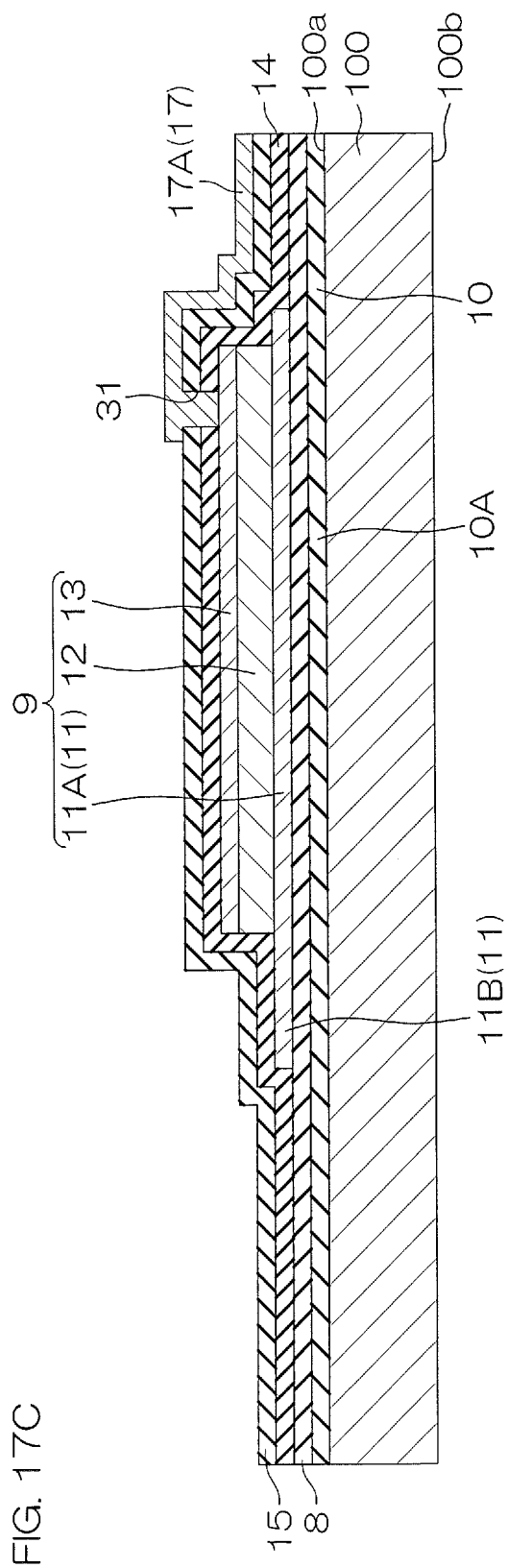
FIG. 17C is a sectional view of a step subsequent to that of FIG. 17B.
Figure 18C:
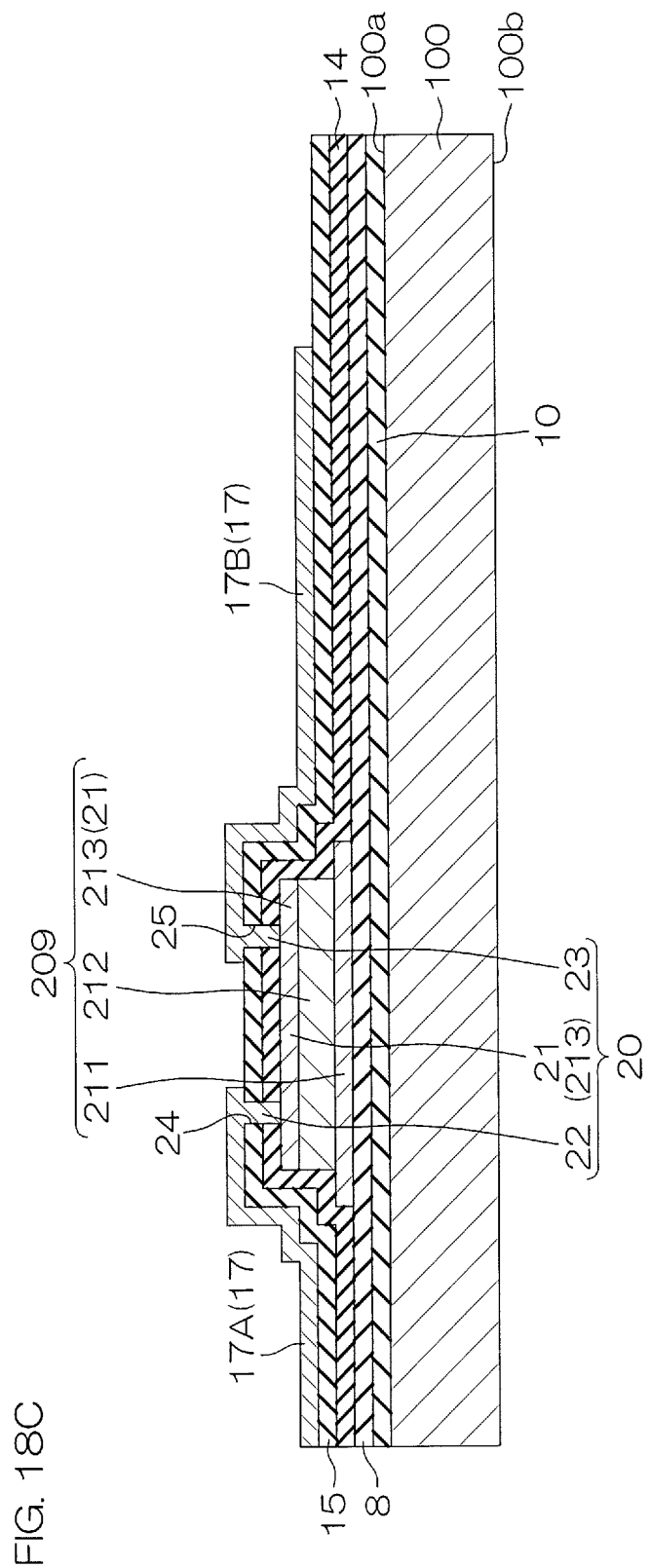
FIG. 18C is a sectional view of a step subsequent to that of FIG. 18B.

Next, as shown in FIG. 17C and FIG. 18C, a wiring film is formed by a sputtering method on the insulating film 15 including interiors of the contact holes 31, 32, 24, and 25. Thereafter, by the wiring film being patterned by photolithography and etching, the upper wirings 17 (first wiring portions 17A and second wiring portions 17B), the first contacts 22 and the second contacts 23 of the fuses 20, and the lower wirings 18 are formed at the same time. The fuses 20, each constituted of the conductor 21 (upper electrode 213), the first contact 22, and the second contact 23, are thereby obtained.

Figure 17D:
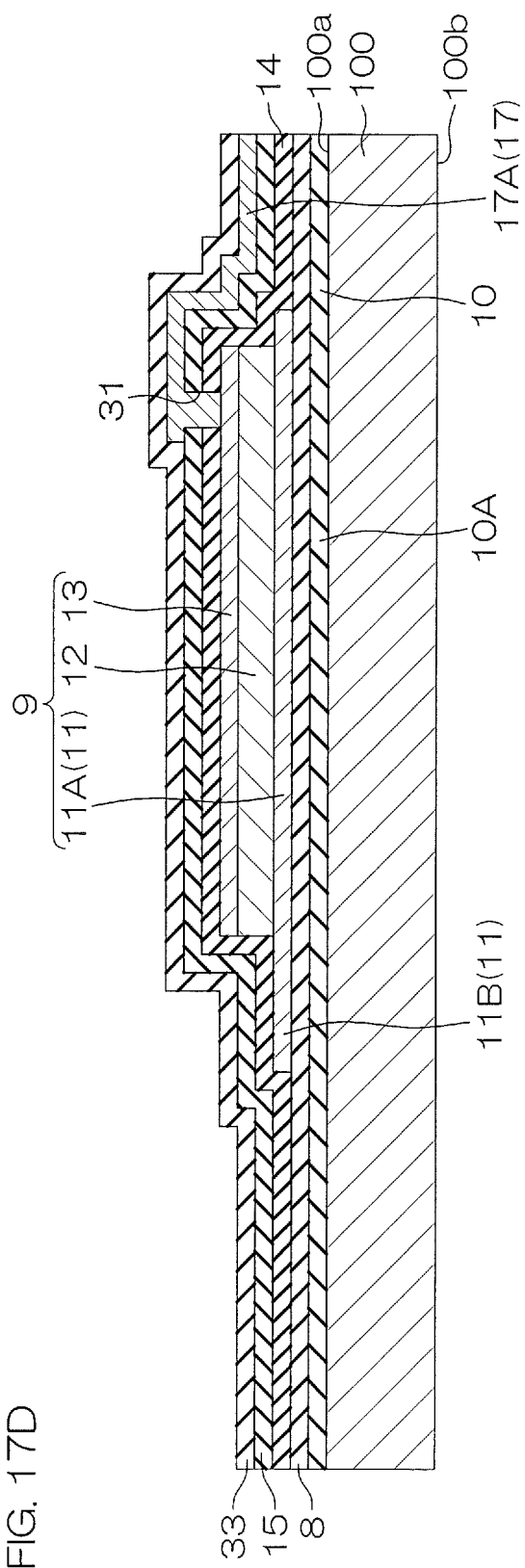
FIG. 17D is a sectional view of a step subsequent to that of FIG. 17C.
Figure 18D:
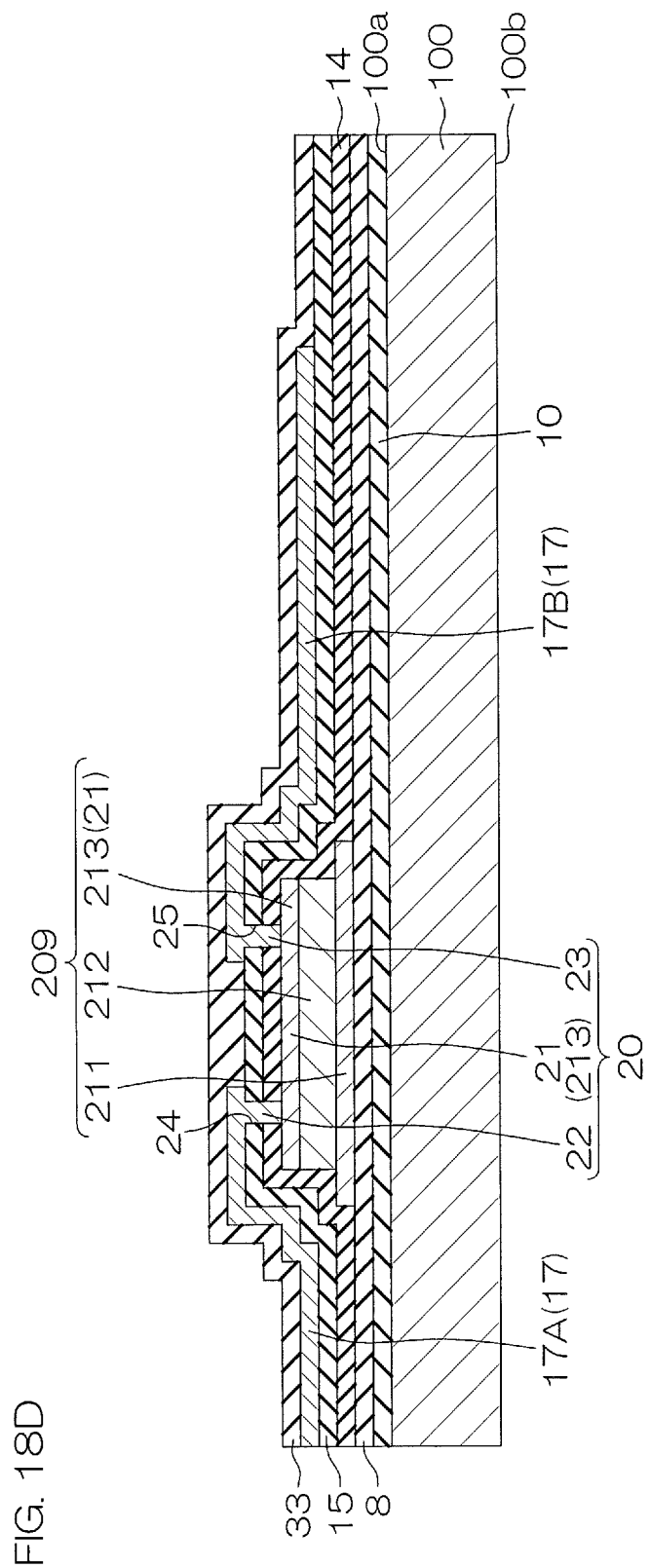
FIG. 18D is a sectional view of a step subsequent to that of FIG. 18C.

Next, as shown in FIG. 17D and FIG. 18D, the passivation film 33 that covers the upper wirings 17 and the lower wirings 18 is formed on the front surface of the insulating film 15.

Figure 17E:
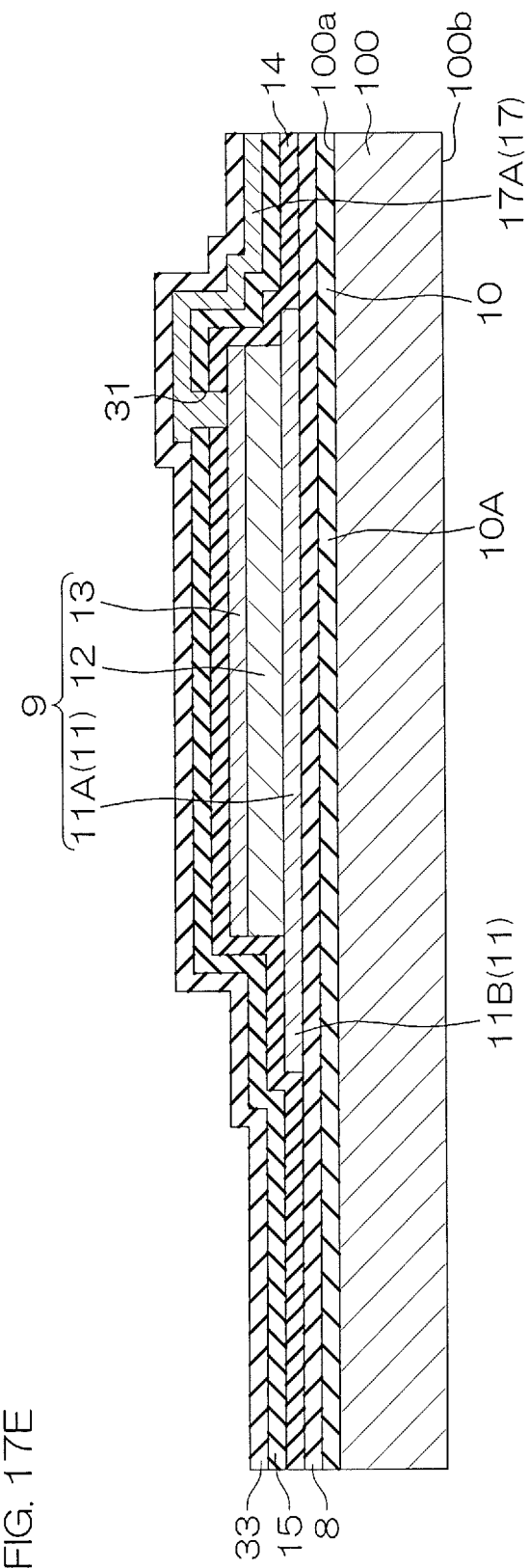
FIG. 17E is a sectional view of a step subsequent to that of FIG. 17D.

Next, a resist mask having openings corresponding to the pad openings 34 and 35 is formed by photolithography and the passivation film 33 is etched using the resist mask as a mask. The pad openings 34 and 35 are thereby formed in the passivation film 33 as shown in FIG. 17E and FIG. 18E. After the resist mask is peeled off, the upper electrode pads 42 and the lower electrode pads 43 are formed on the passivation film 33 respectively via the pad openings 34 and 35.

Figure 17F:
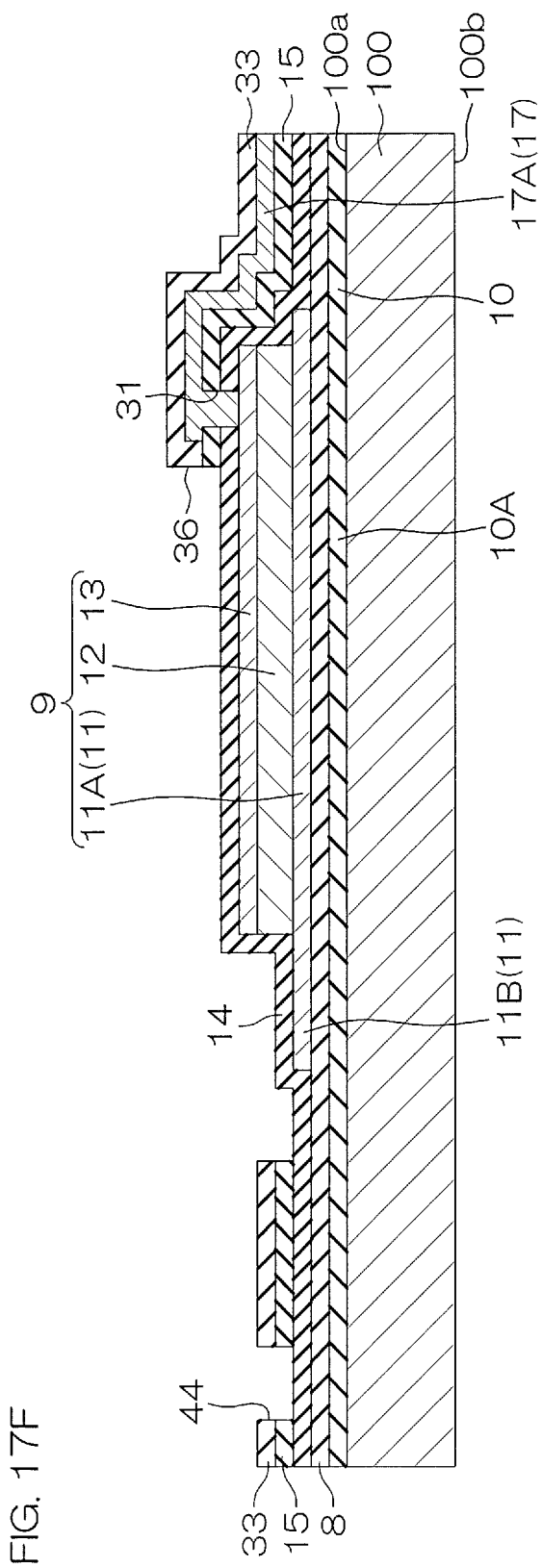
FIG. 17F is a sectional view of a step subsequent to that of FIG. 17E.
Figure 18F:
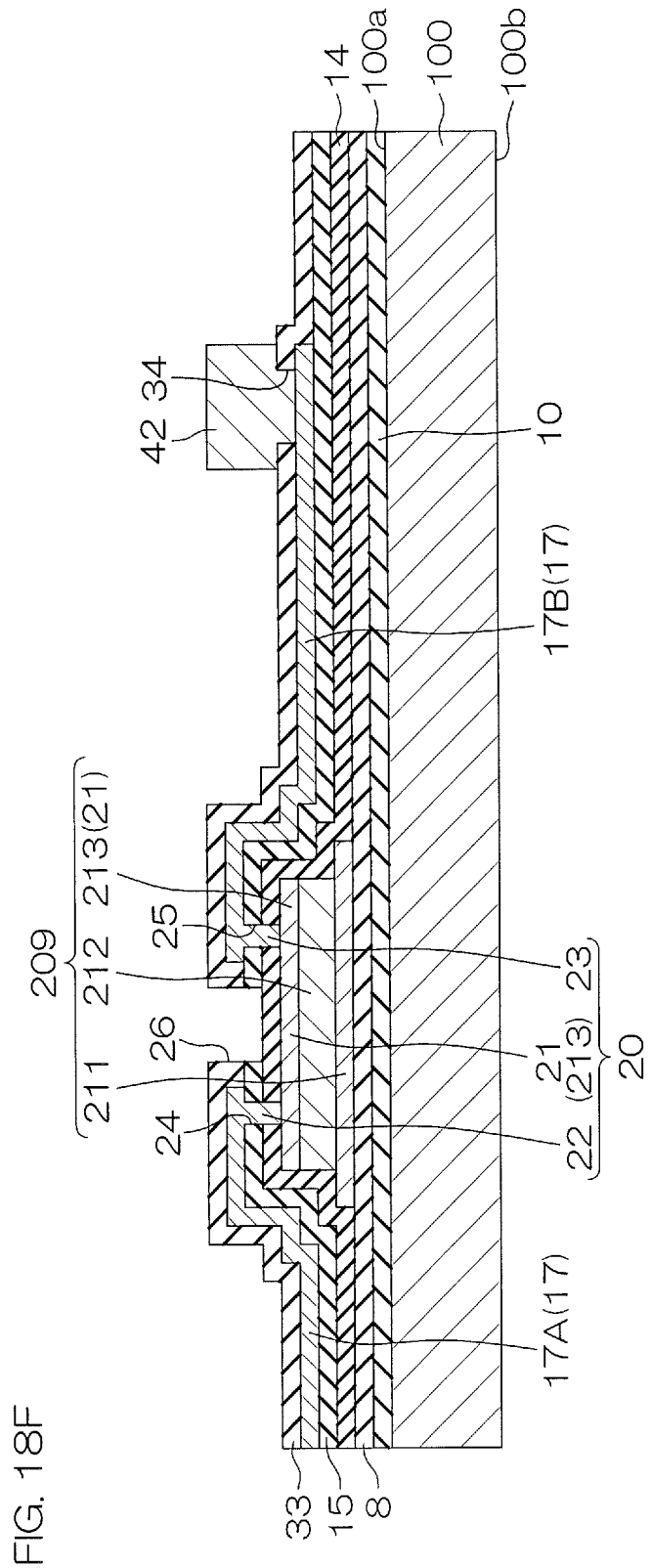
FIG. 18F is a sectional view of a step subsequent to that of FIG. 18E.

Next, a resist mask having openings corresponding to the openings 36 and 26 and the ink supplying penetrating holes 44 is formed by photolithography and the passivation film 33 and the insulating film 15 are etched continuously using the resist mask as a mask. The openings 36 and 26 and the ink supplying penetrating holes 44 are thereby formed in the passivation film 33 and the insulating film 15 as shown in FIG. 17F and FIG. 18F.

Figure 17G:
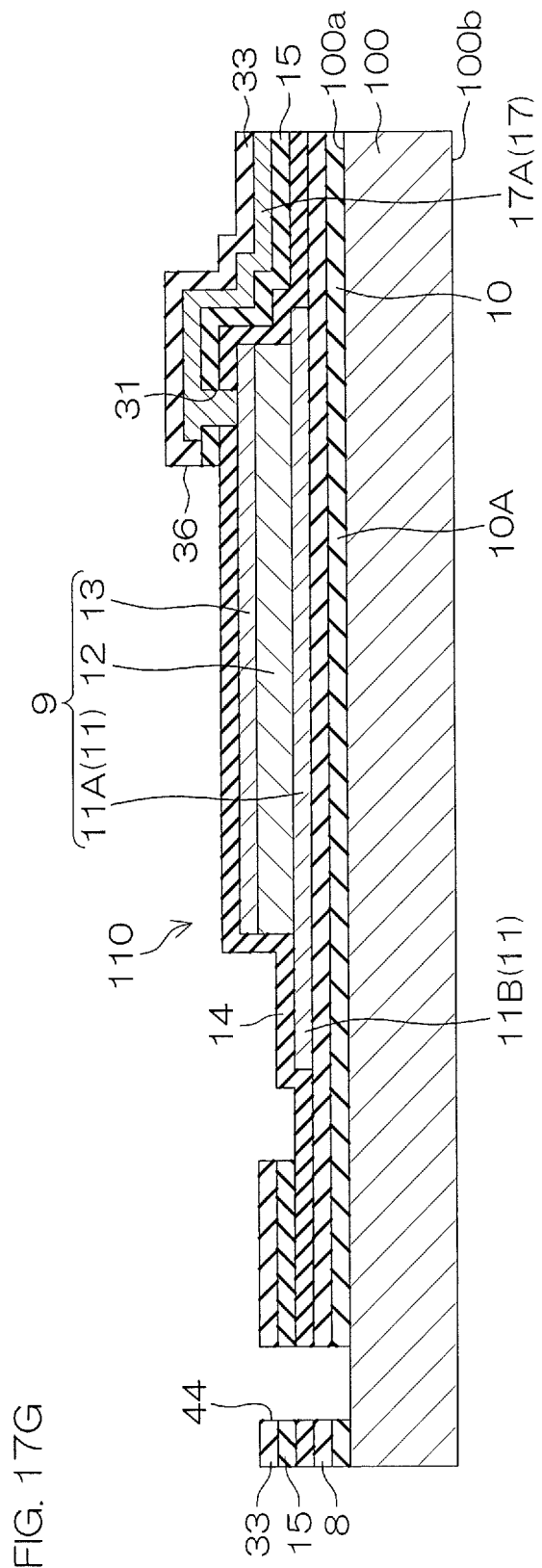
FIG. 17G is a sectional view of a step subsequent to that of FIG. 17F.
Figure 18G:
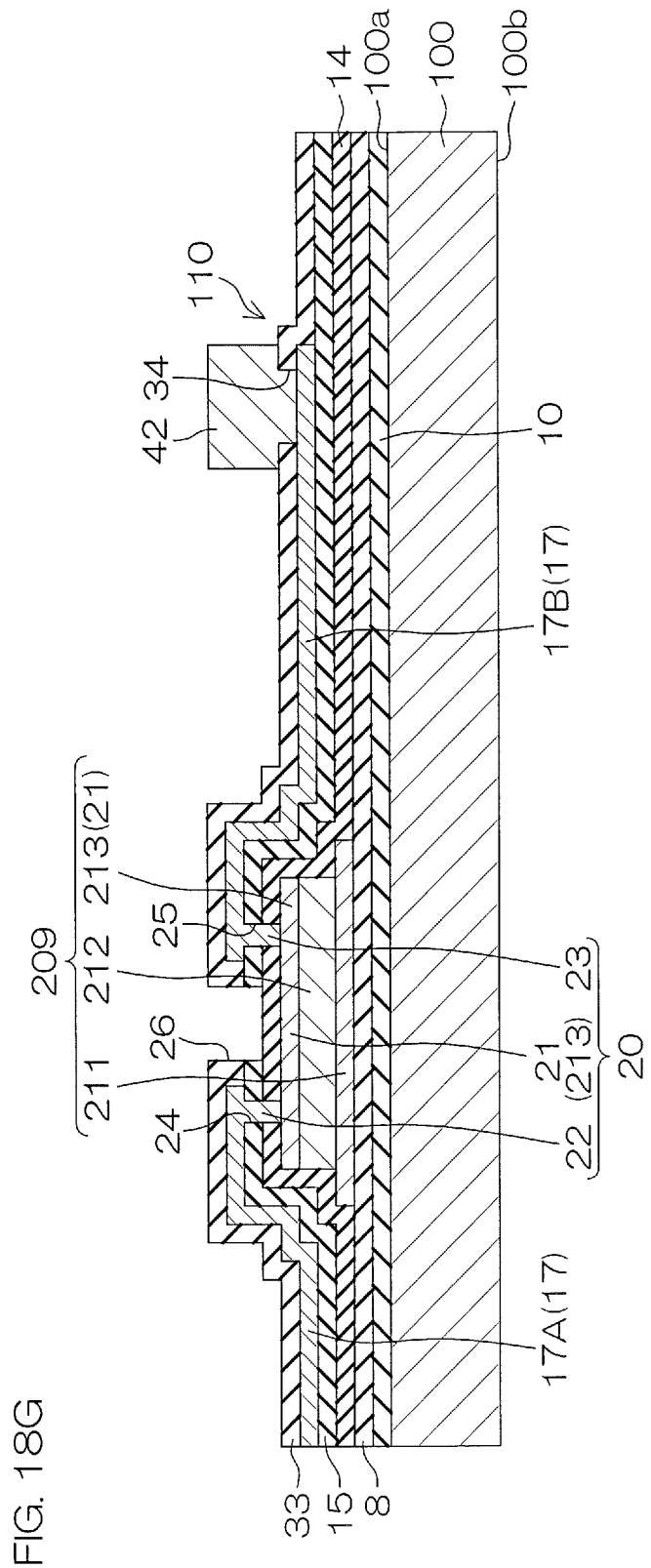
FIG. 18G is a sectional view of a step subsequent to that of FIG. 18F.

Next, the resist mask is peeled off. Then, a resist mask having openings corresponding to the ink supplying penetrating holes 44 is formed by photolithography and the second hydrogen barrier film 14, the first hydrogen barrier film 8, and the movable film formation layer 10 are etched using the resist mask as a mask. The ink supplying penetrating holes 44 are thereby formed in the second hydrogen barrier film 14, the first hydrogen barrier film 8, and the movable film formation layer 10 as shown in FIG. 17G and FIG. 18G. The substrate assembly set 110 is thereby prepared.

Figure 17H:
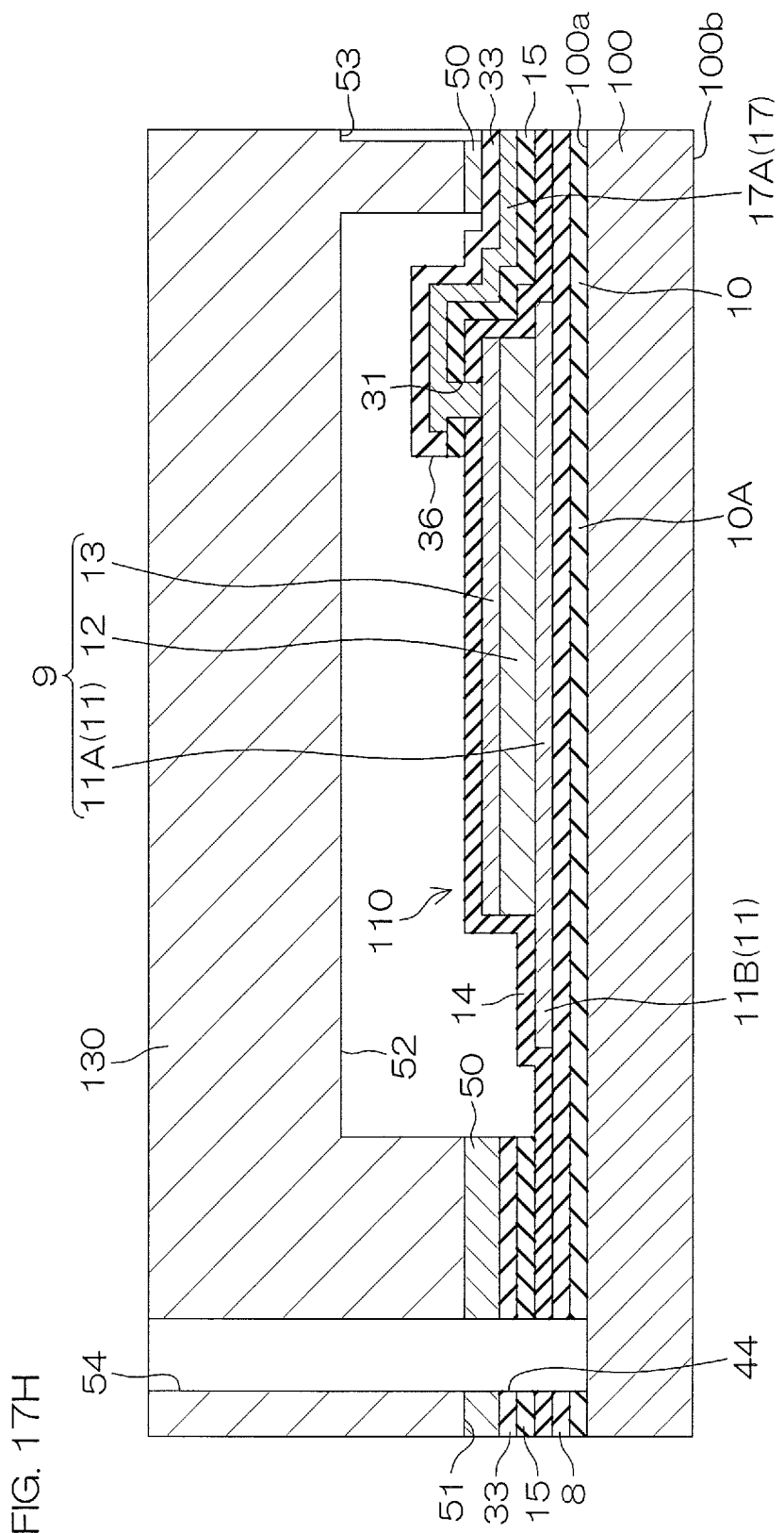
FIG. 17H is a sectional view of a step subsequent to that of FIG. 17G.
Figure 18H:
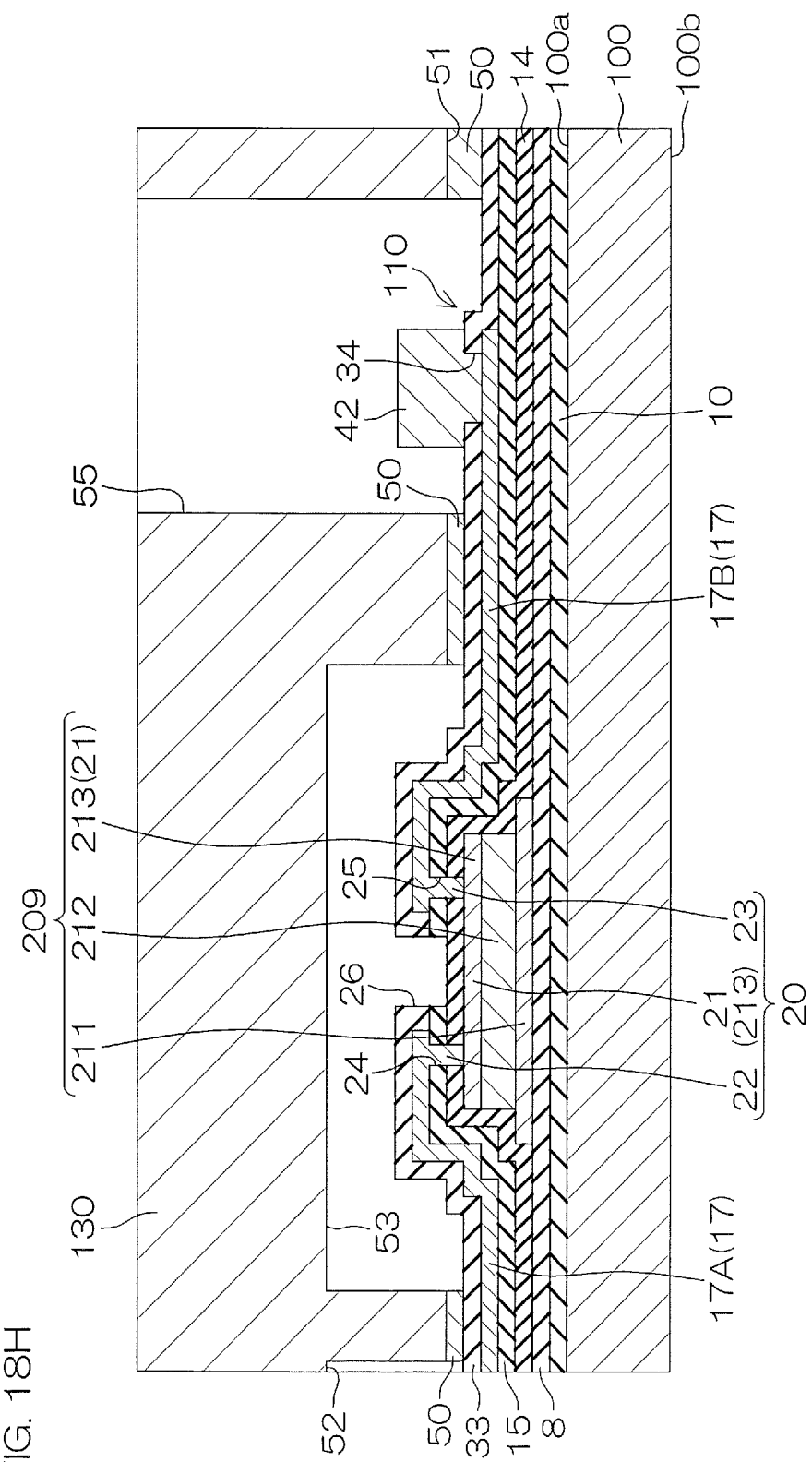
FIG. 18H is a sectional view of a step subsequent to that of FIG. 18G.
Figure 18:
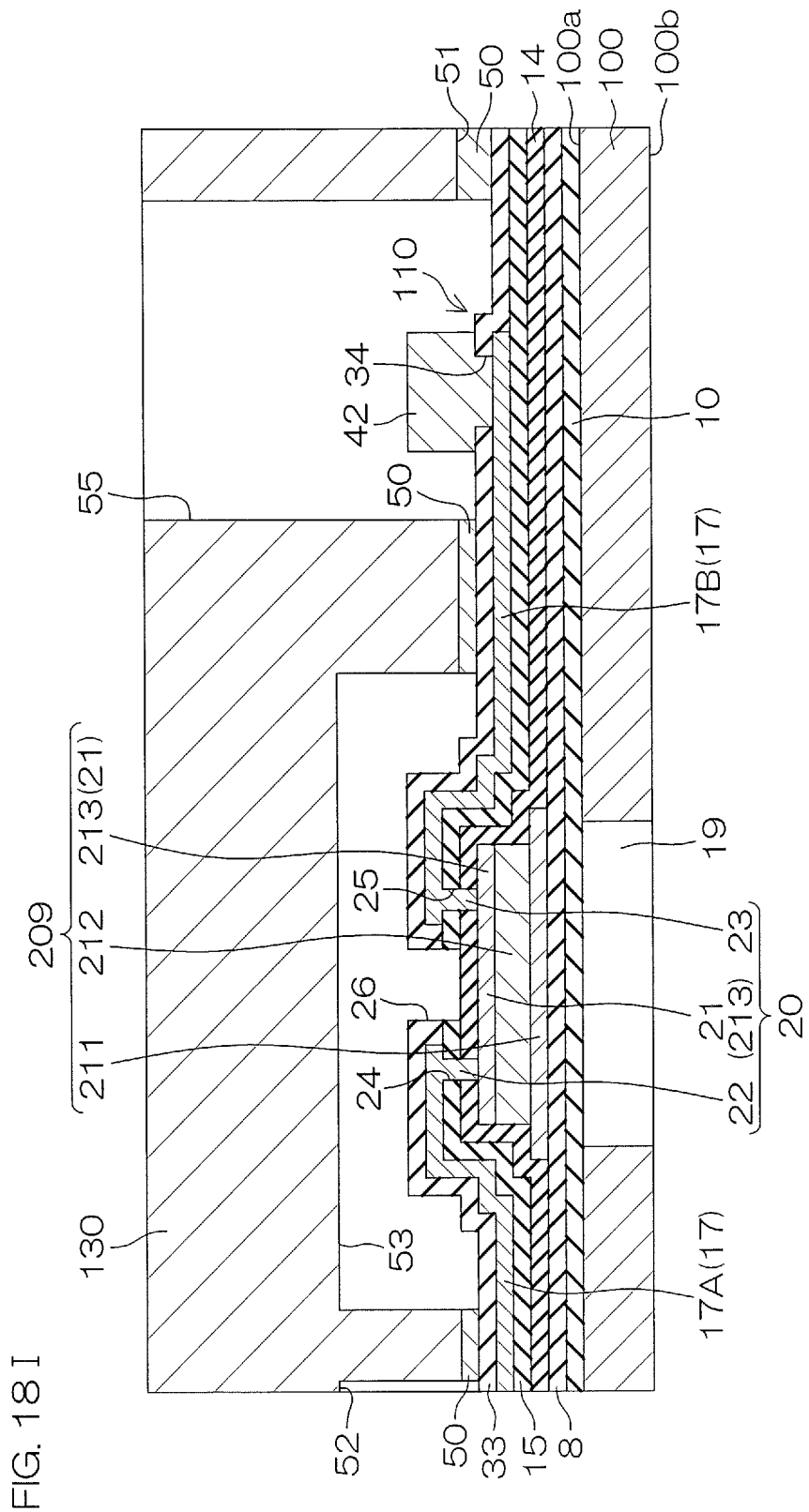
FIG. 18B is a sectional view of a step subsequent to that of FIG. 18A.
FIG. 18E is a sectional view of a step subsequent to that of FIG. 18D.
FIG. 18I is a sectional view of a step subsequent to that of FIG. 18H.
FIG. 18J is a sectional view of a step subsequent to that of FIG. 18I.

Next, as shown in FIG. 17H and FIG. 18H, the adhesive 50 is coated on the opposing surface 51 of the protective substrate set 130 and the protective substrate set 130 is fixed on the substrate assembly set 110 such that the ink supply passages 54 and the ink supplying penetrating holes 44 corresponding thereto are matched.

Figure 17I:
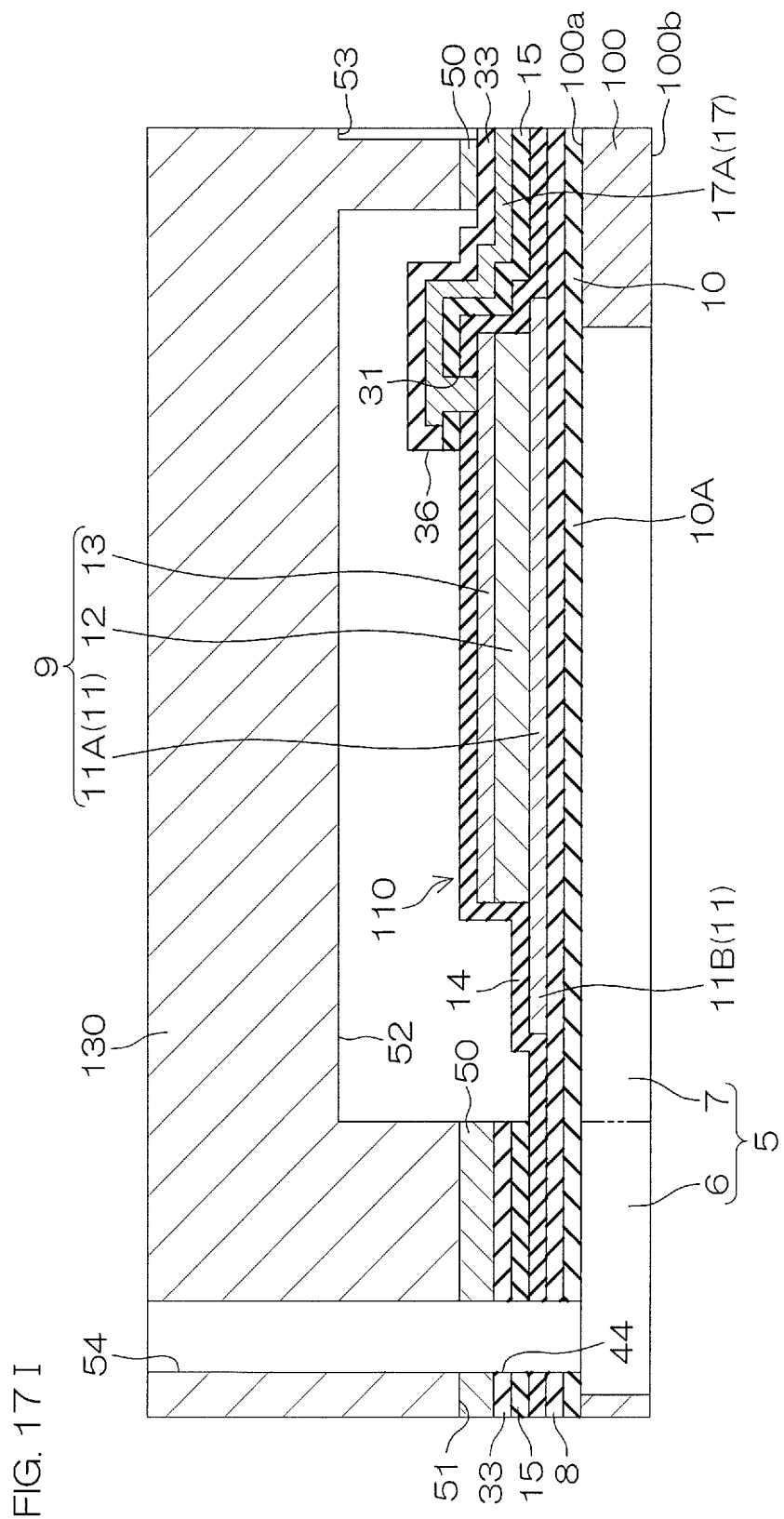
FIG. 17I is a sectional view of a step subsequent to that of FIG. 17H.

Next, as shown in FIG. 17I and FIG. 18I, rear surface grinding for thinning the actuator wafer 100 is performed. Film-thinning of the actuator wafer 100 is performed by the actuator wafer 100 being ground from the rear surface 100b. Thereafter, a resist mask having openings corresponding to the ink flow passages 5 (ink inflow portions 6 and pressure chambers 7) and openings corresponding to the cavities 19 is formed by photolithography on the rear surface 100b side of the actuator wafer 100 and the actuator wafer 100 is etched from the rear surface 100b using the resist mask as a mask. The ink flow passages 5 (ink inflow portions 6 and pressure chambers 7) and the cavities 19 are thereby formed in the actuator wafer 100.

Figure 17J:
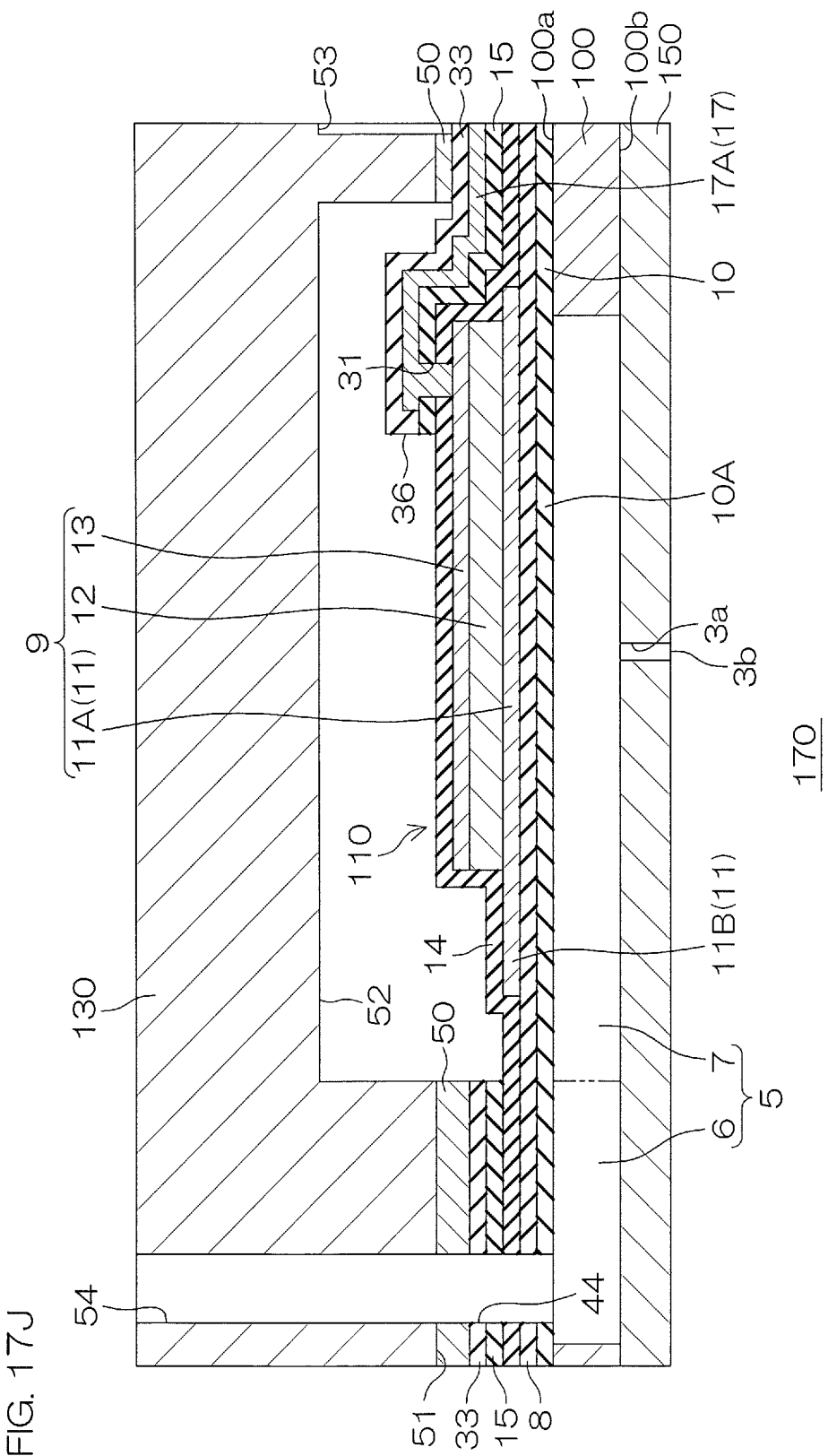
FIG. 17J is a sectional view of a step subsequent to that of FIG. 17I.
Figure 18J:
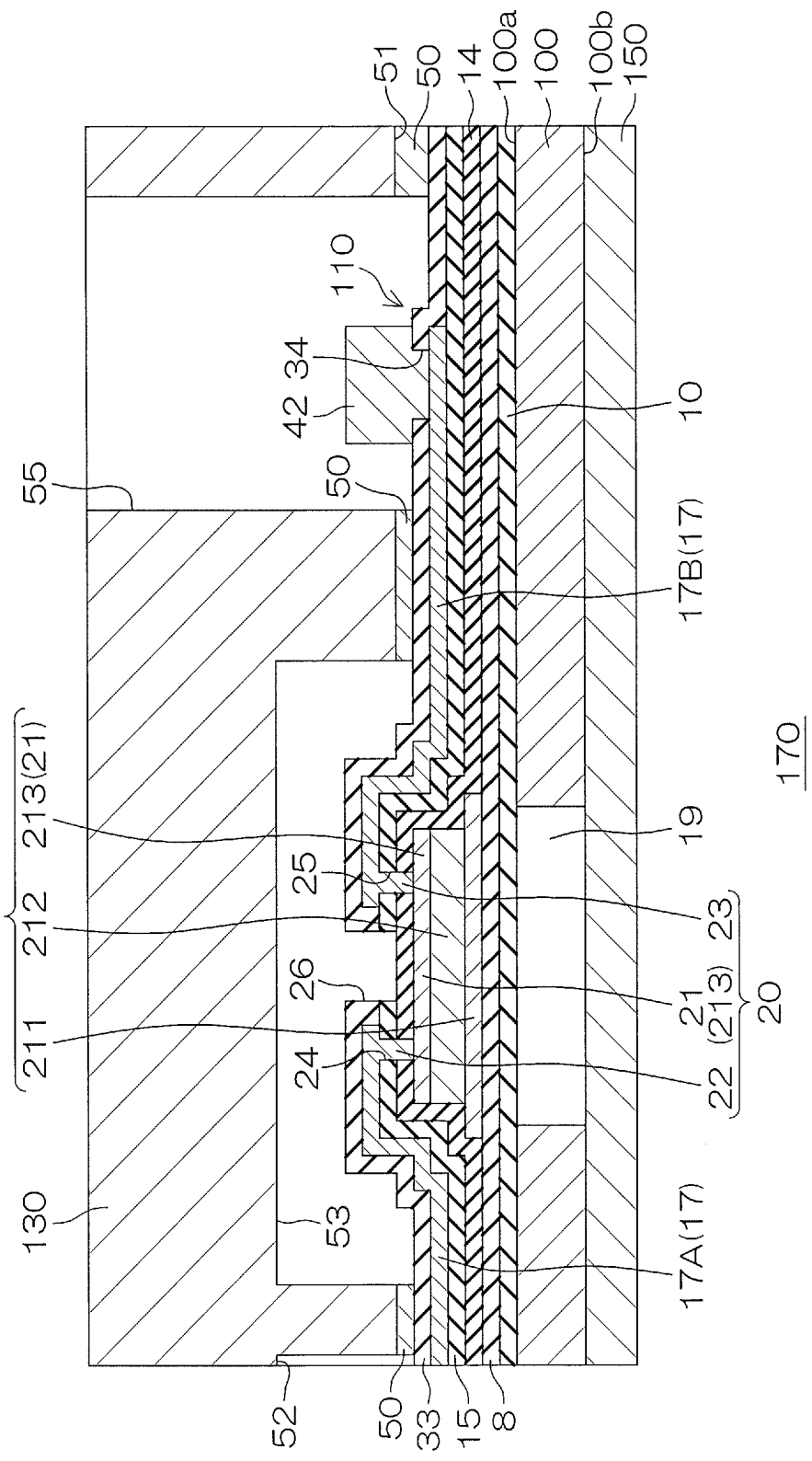

Thereafter, as shown in FIG. 17J and FIG. 18J, the nozzle substrate set 150 is bonded to the rear surface 100b of the actuator wafer 100. The inkjet print head set 170 that is constituted of the substrate assembly set 110, the protective substrate set 130, and the nozzle substrate set 150 is thereby obtained. Thereafter, the inkjet print head set 170 is cut along the intended cutting lines 103 by a dicing blade. That is, a step for cutting out the inkjet print heads 1A individually is performed.

When this step is completed, the actuator wafer 100 in the substrate assembly set 110 becomes the actuator substrate 2 of each individual inkjet print head 1A. Also, the protective substrate set 130 becomes the protective substrate 4 of each individual inkjet print head 1A. Also, the nozzle wafer 140 in the nozzle substrate set 150 becomes the silicon substrate in the nozzle substrate 3 of each individual inkjet print head 1A. Individual pieces of the inkjet print heads 1A, each having the structure shown in FIG. 13 to FIG. 16B, are thereby obtained.

[3] Third Preferred Embodiment

Figure 19:
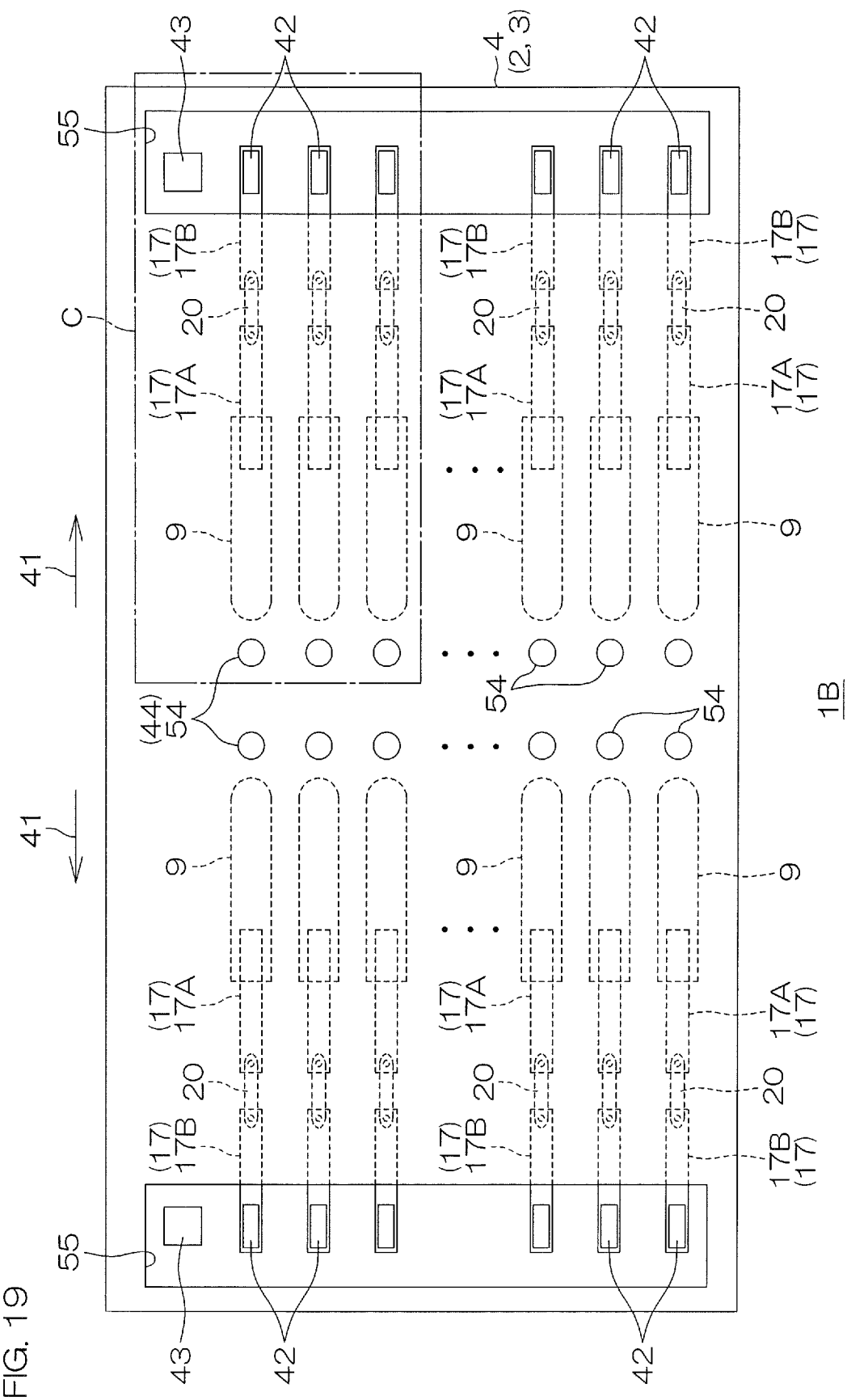
FIG. 19 is an illustrative plan view for describing the arrangement of an inkjet print head according to a third preferred embodiment of the present disclosure.
Figure 20:
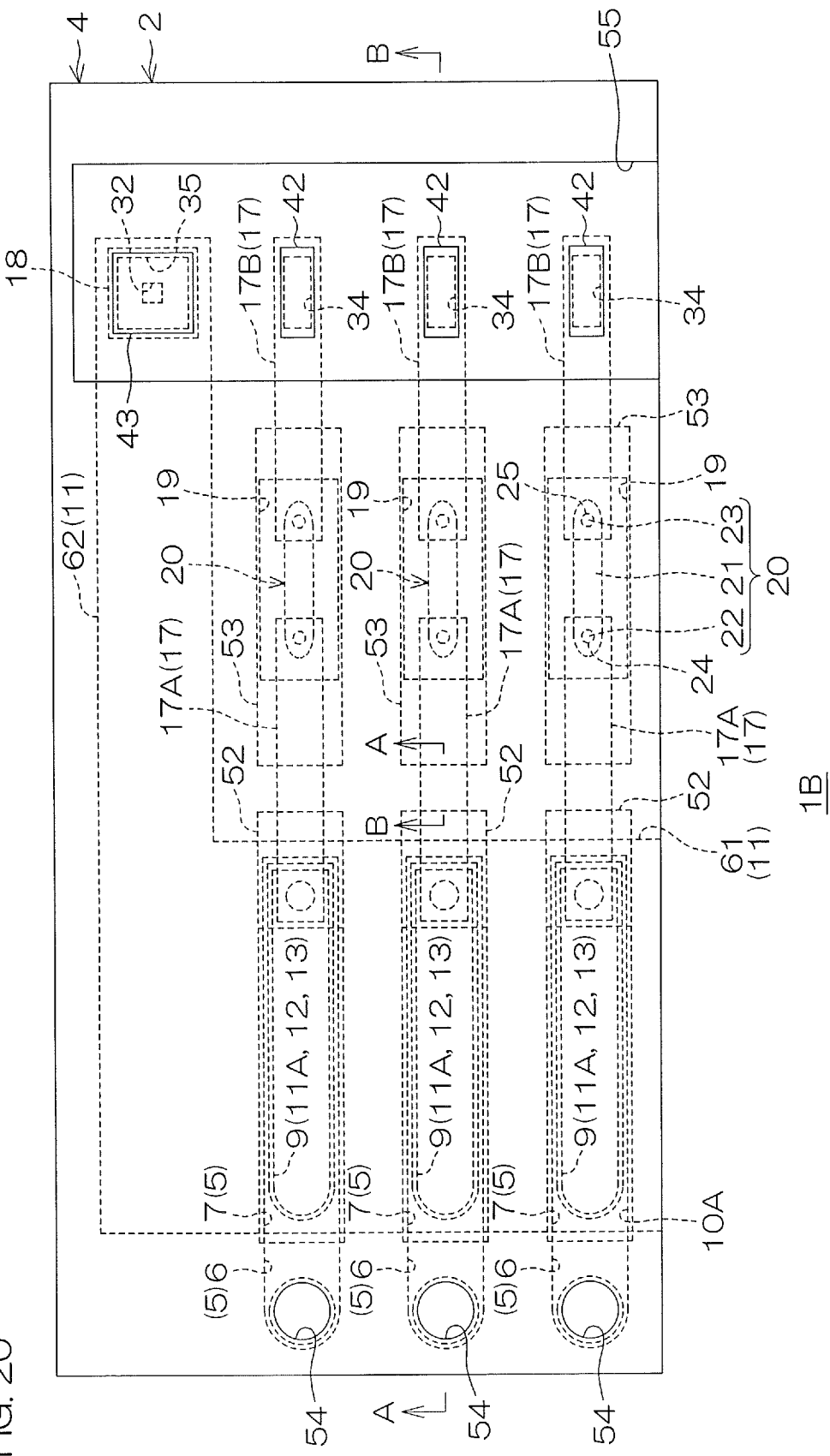
FIG. 20 is an illustrative partially enlarged plan view showing a portion C of FIG. 19 in enlarged manner and is a plan view including a protective substrate.
Figure 21:
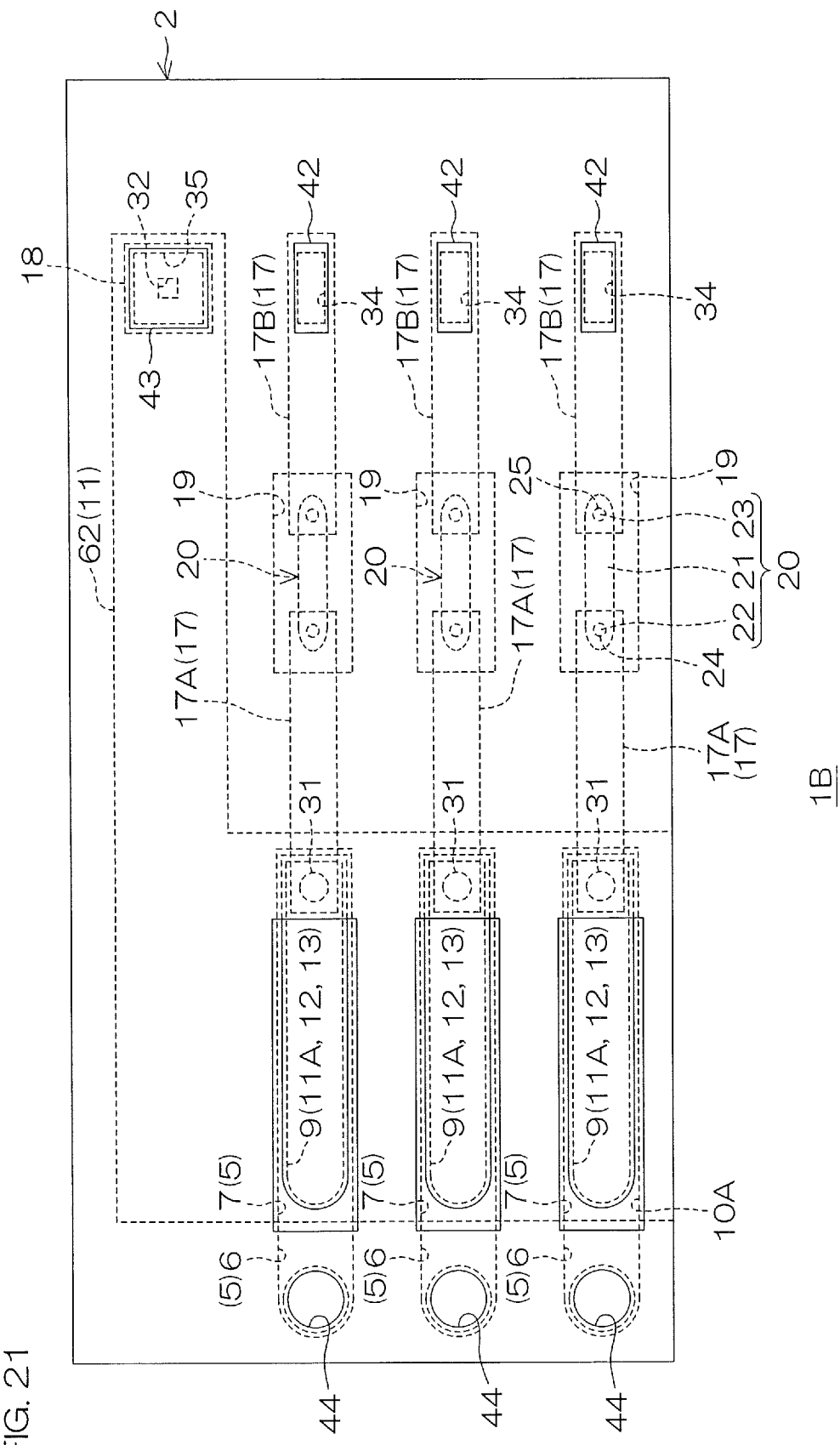
FIG. 21 is an illustrative partially enlarged plan view showing the portion C of FIG. 19 in enlarged manner and is a plan view with the protective substrate omitted.
Figure 22A:
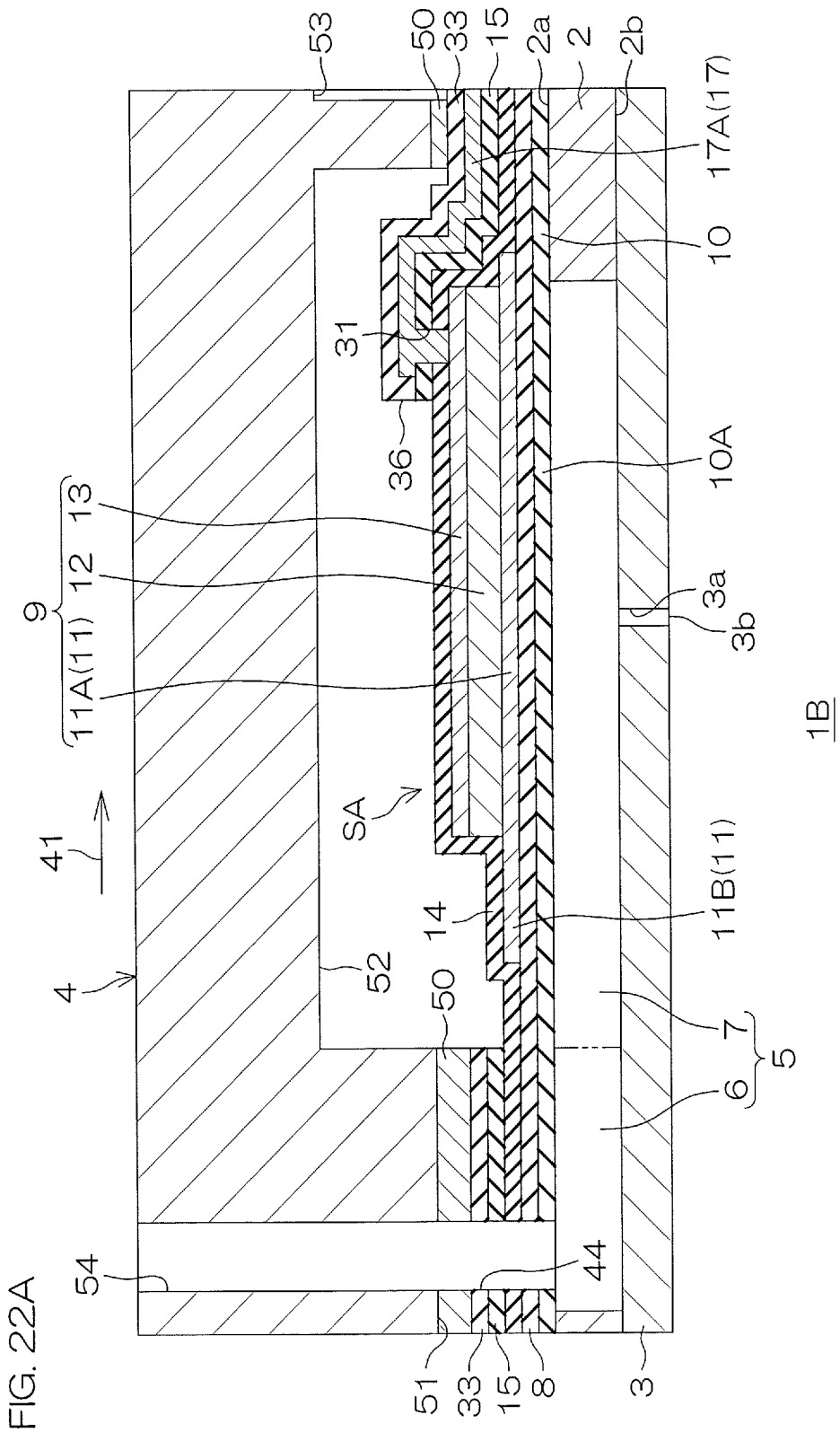
FIG. 22A is an illustrative sectional view taken along line A-A of FIG. 20.

FIG. 19 is a plan view of an inkjet print head according to a third preferred embodiment of the present disclosure and is a plan view corresponding to FIG. 1. FIG. 20 is an illustrative partially enlarged plan view showing a portion C of FIG. 19 in enlarged manner and is a plan view including a protective substrate. FIG. 21 is an illustrative partially enlarged plan view showing the portion C of FIG. 19 in enlarged manner and is a plan view with the protective substrate omitted. FIG. 22A is an illustrative sectional view taken along line A-A of FIG. 20. FIG. 22B is an illustrative sectional view taken along line B-B of FIG. 20.

In FIG. 19, portions corresponding to respective portions in FIG. 1 described above are indicated with the same reference signs attached as in FIG. 1. In FIG. 20, portions corresponding to respective portions in FIG. 2 described above are indicated with the same reference signs attached as in FIG. 2. In FIG. 21, portions corresponding to respective portions in FIG. 3 described above are indicated with the same reference signs attached as in FIG. 3. In FIG. 22A and FIG. 22B, portions corresponding to respective portions in FIG. 4A and FIG. 4B described above are indicated with the same reference signs attached as in FIG. 4A and FIG. 4B.

In comparison to the inkjet print head 1 according to the first preferred embodiment, the inkjet print head 1B according to the third preferred embodiment differs in the arrangement of the fuses 20. Specifically, each fuse 20 is constituted of the conductor 21 formed on the first hydrogen barrier film 8 and constituted of the same material as the lower electrode 11, the first contact 22 connecting the one end portion (first end portion) of the conductor 21 and the other end portion (second end portion) of the first wiring portion 17A of the upper wiring 17, and the second contact 23 connecting the other end portion (second end portion) of the conductor 21 and the one end portion (first end portion) of the second wiring portion 17B of the upper wiring 17.

In plan view, the conductor 21 is of a rectangular shape that is long in the ink flow direction 41 and both end edges are formed to outwardly projecting curved shapes. In plan view, the conductor 21 is disposed at an inner side of the cavity 19. In plan view, the width in the short direction of the conductor 21 is shorter than the width in the short direction of the cavity 19. In plan view, both side edges of the conductor 21 are receded further inward than corresponding both side edges of the cavity 19. A length in a long direction of the conductor 21 is shorter than the length in the long direction of the cavity 19. In plan view, both end edges of the conductor 21 are receded further inward than corresponding both end edges of the cavity 19.

A front surface and side surfaces of the conductor 21 are covered by the second hydrogen barrier film 14. The second hydrogen barrier film 14 is covered by the insulating film 15.

The other end portion of the first wiring portion 17A is disposed above the one end portion (upstream side end portion in the ink flow direction 41) of the conductor 21. In this preferred embodiment, the width in the short direction of the conductor 21 is shorter than the width of the first wiring portion 17A (upper wiring 17). In plan view, both side edges of the one end portion of the conductor 21 are receded further inward than corresponding both side edges of the other end portion of the first wiring portion 17A.

The contact hole 24 that penetrates continuously through the second hydrogen barrier film 14 and the insulating film 15 is formed between the first wiring portion 17A and the conductor 21. The first contact 22 that connects the other end portion of the first wiring portion 17A and the one end portion of the conductor 21 is embedded in the contact hole 24. The first contact 22 is formed integral to the first wiring portion 17A.

The one end portion of the second wiring portion 17B is disposed above the other end portion of the conductor 21. In this preferred embodiment, the width in the short direction of the conductor 21 is shorter than the width of the second wiring portion 17B (upper wiring 17). In plan view, both side edges of the other end portion of the conductor 21 are receded further inward than corresponding both side edges of the one end portion of the second wiring portion 17B.

The contact hole 25 that penetrates continuously through the second hydrogen barrier film 14 and the insulating film 15 is formed between the second wiring portion 17B and the conductor 21. The second contact 23 that connects the one end portion of the second wiring portion 17B and the other end portion of the conductor 21 is embedded in the contact hole 25. The second contact 23 is formed integral to the second wiring portion 17B. The transverse cross-sectional area of at least one of the first contact 22 and the second contact 23 is preferably smaller than the transverse cross-sectional area of the upper wiring portion (upper contact) inside the contact hole 31. In this preferred embodiment, the transverse cross-sectional areas of the first contact 22 and the second contact 23 are smaller than the transverse cross-sectional area of the upper wiring portion inside the contact hole 31.

The same effects as the first preferred embodiment are also obtained with the third preferred embodiment.

Here, if, as with the conductor 21 described above, the width in the short direction of the conductor 21 is shorter than the width of the upper wiring 17 and the conductor 21 has the property of being more likely to be cut by fusion than the upper wiring 17, the transverse cross-sectional areas of the first contact 22 and the second contact 23 may be not less than the transverse cross-sectional area of the upper wiring portion inside the contact hole 31.

Also, if the transverse cross-sectional area of at least one of the first contact 22 and the second contact 23 is smaller than the transverse cross-sectional area of the upper wiring portion inside the contact hole 31 and at least one of the first contact 22 and the second contact 23 has the property of being more likely to be cut by fusion than the upper wiring 17, the width in the short direction of the conductor 21 may be not less than the width of the upper wiring 17.

A method for manufacturing the inkjet print head 1B shall be described specifically below.

FIG. 23A to FIG. 23J and FIG. 24A to FIG. 24J are sectional views showing a manufacturing process of the inkjet print head 1B. FIG. 23A to FIG. 23J are sectional views corresponding to the section plane of FIG. 22A and FIG. 24A to FIG. 24J are sectional views corresponding to the section plane of FIG. 22B.

Figure 23A:
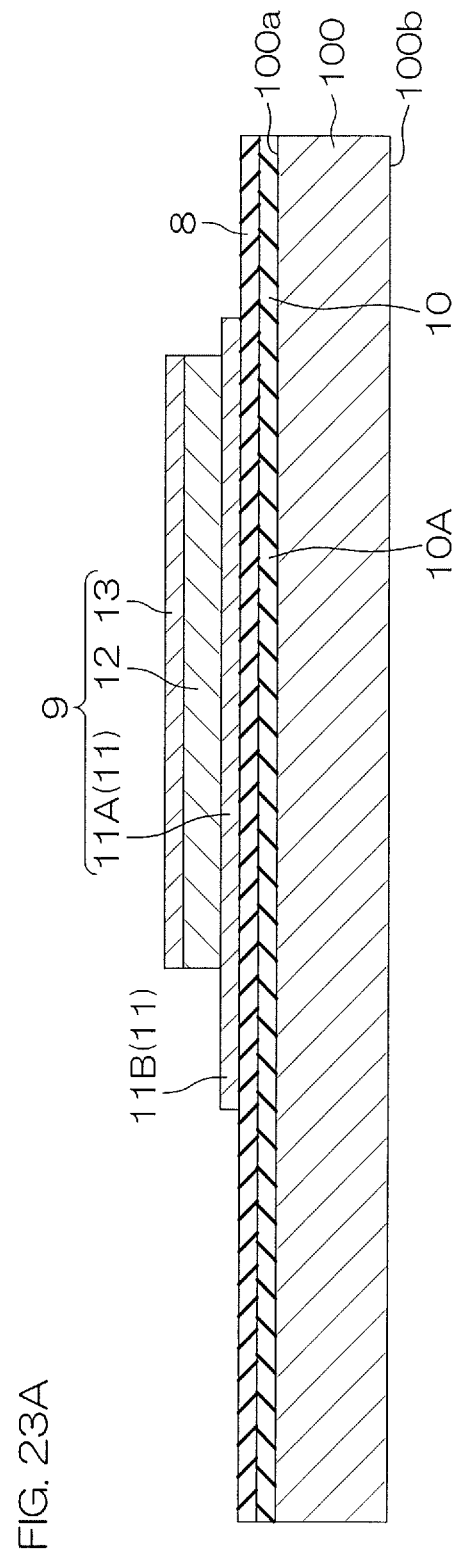
FIG. 23A is a sectional view of an example of a manufacturing process of the inkjet print head of FIG. 19.
Figure 24A:
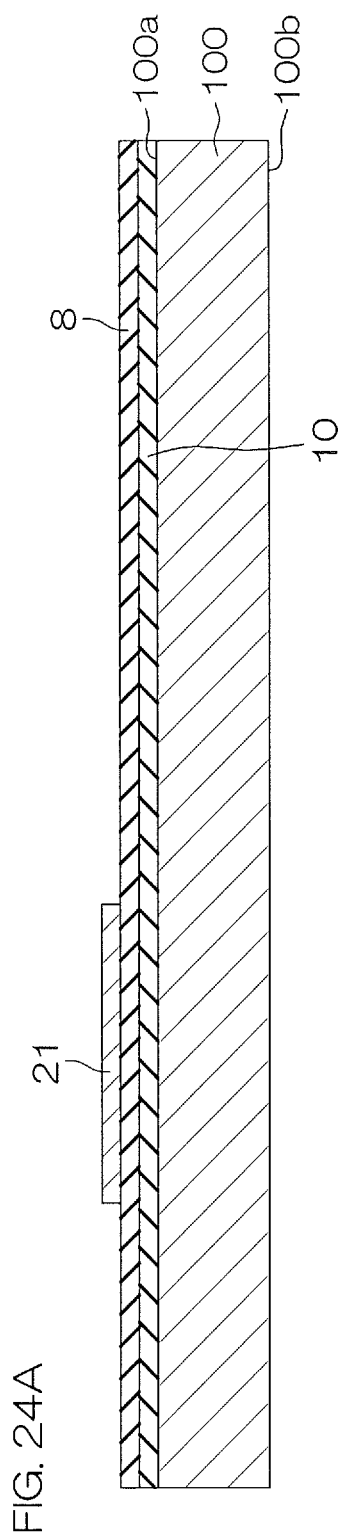
FIG. 24A is a sectional view of an example of a manufacturing process of the inkjet print head of FIG. 19.

First, after the same step as that of FIG. 11A and FIG. 12A described above has been performed, patterning of the upper electrode film 73, the piezoelectric material film 72, and the lower electrode film 71 is performed as shown in FIG. 23A and FIG. 24A. First, a resist mask with a pattern of the upper electrodes 13 is formed by photolithography. By the upper electrode film 73 and the piezoelectric material film 72 then being etched continuously using the resist mask as a mask, the upper electrodes 13 and the piezoelectric films 12 of predetermined patterns are formed.

Next, after the resist mask is peeled off, a resist mask with patterns of the lower electrodes 11 and the conductors 21 is formed by photolithography. By the lower electrode film 71 then being etched using the resist mask as a mask, the lower electrodes 11 and the conductors 21 of the predetermined patterns are formed.

The lower electrodes 11 are each constituted of the main electrode portions 11A and the extension portion 11B. The piezoelectric elements 9, each constituted of the main electrode portion 11A of the lower electrode 11, the piezoelectric film 12, and the upper electrode 13, are thus formed.

Figure 23B:
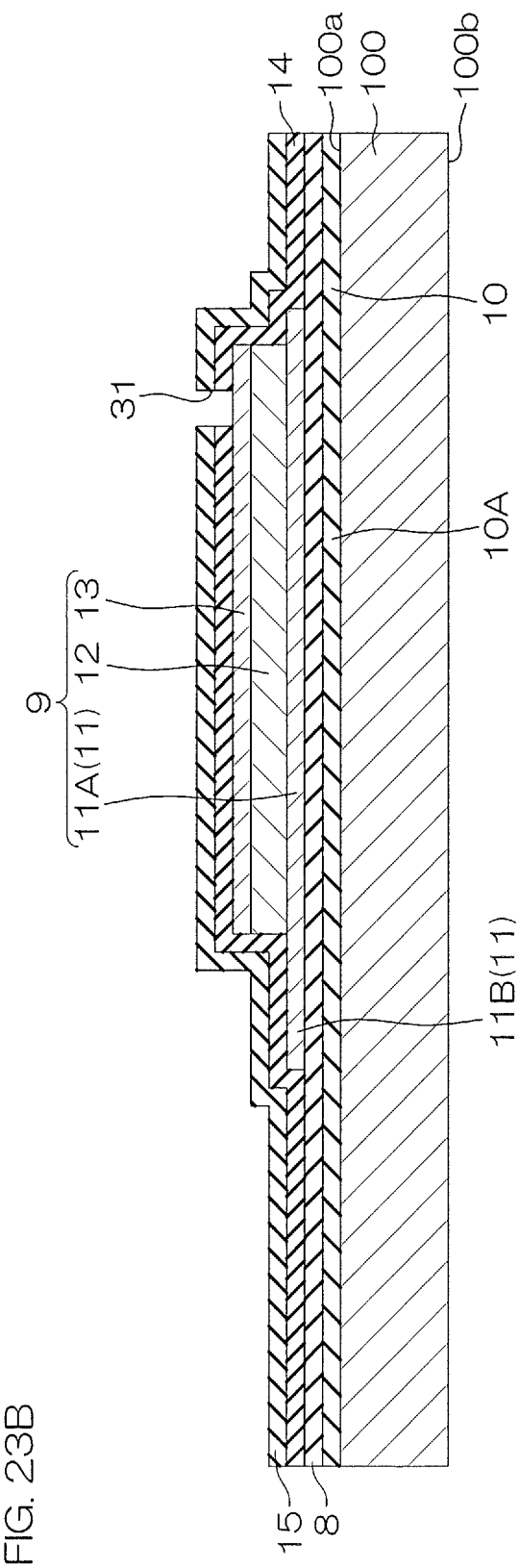
FIG. 23B is a sectional view of a step subsequent to that of FIG. 23A.
Figure 24B:
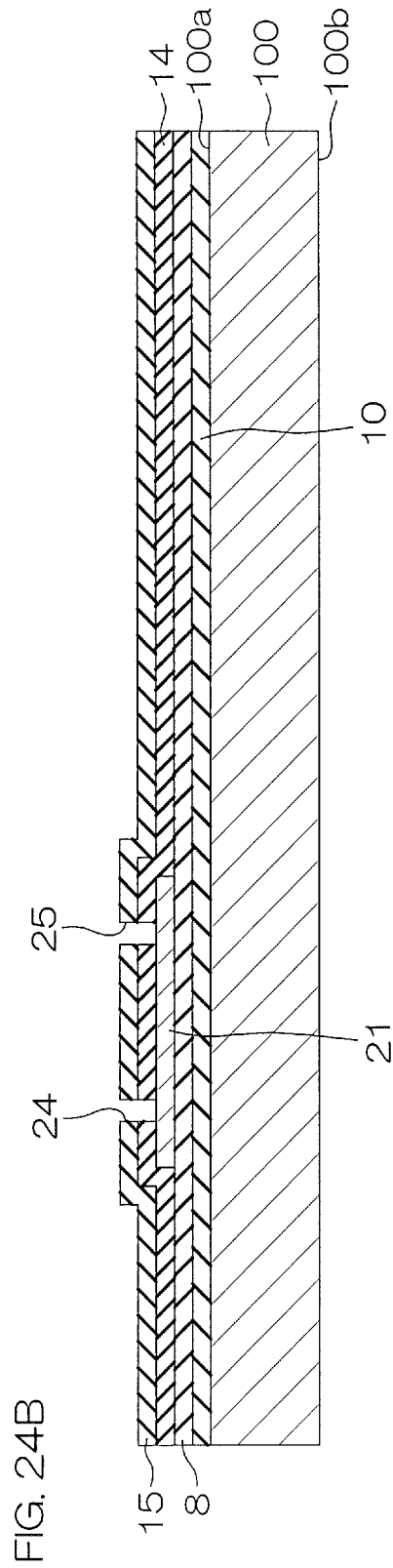
FIG. 24B is a sectional view of a step subsequent to that of FIG. 24A.

Next, as shown in FIG. 23B and FIG. 24B, after the resist mask is peeled off, the second hydrogen barrier film 14 that covers the entire surface is formed. Thereafter, the insulating film 15 is formed on the entire surface on the second hydrogen barrier film 14. Subsequently, the insulating film 15 and the second hydrogen barrier film 14 are etched continuously to form the contact holes 31, 32, 24, and 25.

Figure 23C:
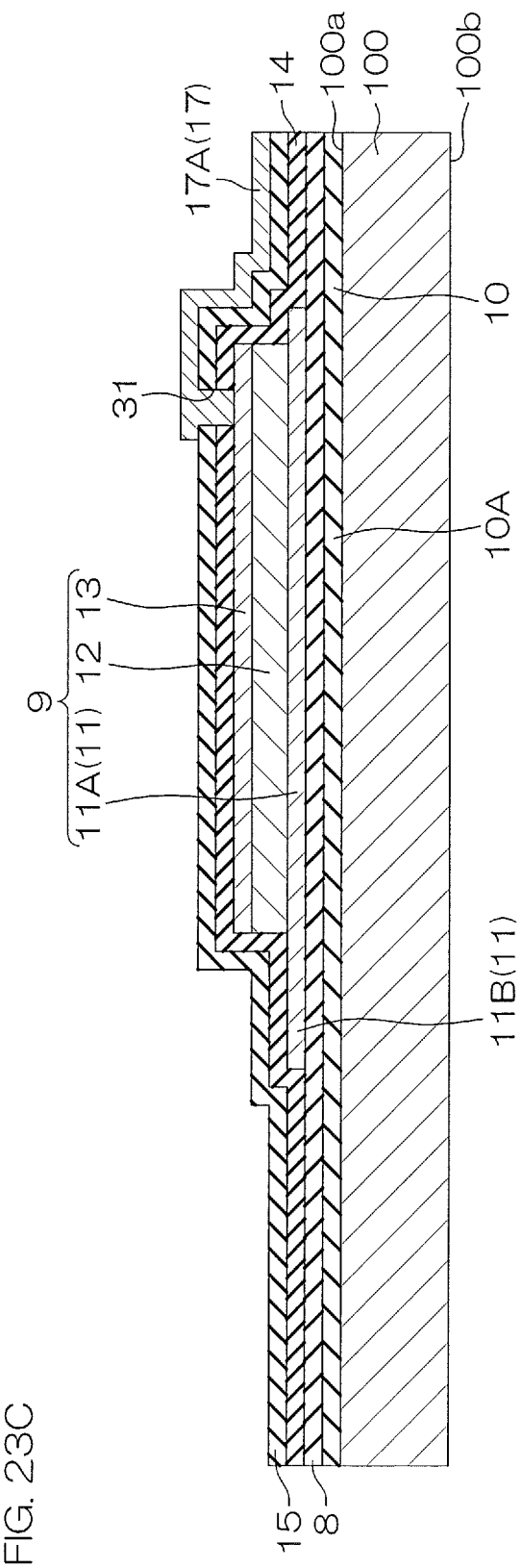
FIG. 23C is a sectional view of a step subsequent to that of FIG. 23B.
Figure 24C:
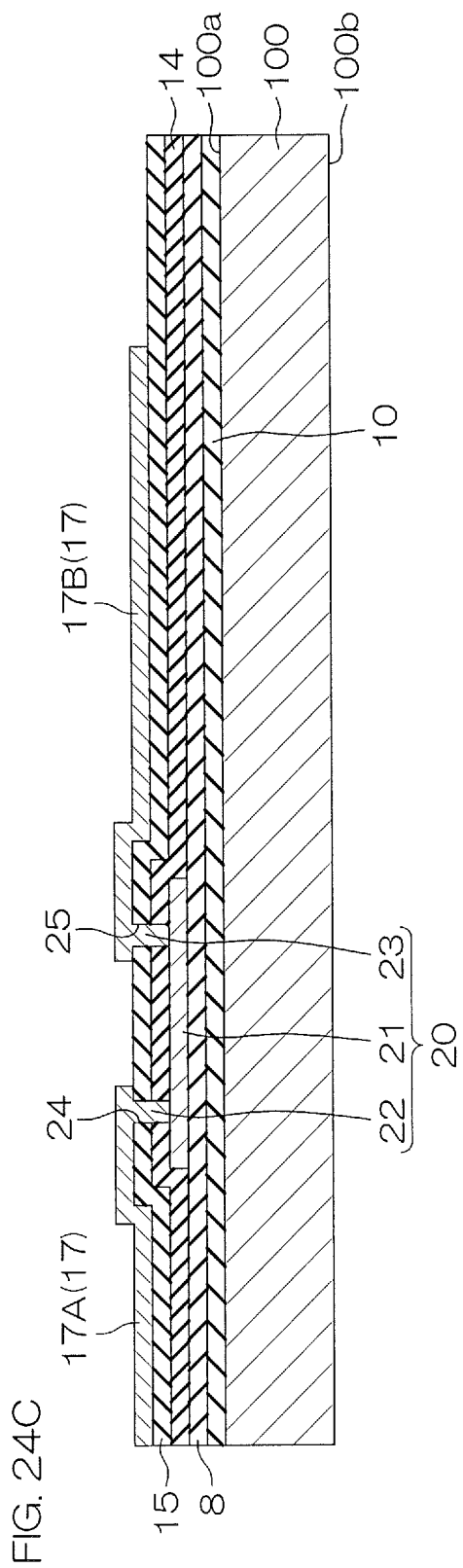
FIG. 24C is a sectional view of a step subsequent to that of FIG. 24B.

Next, as shown in FIG. 23C and FIG. 24C, a wiring film is formed by a sputtering method on the insulating film 15 including interiors of the contact holes 31, 32, 24, and 25. Thereafter, by the wiring film being patterned by photolithography and etching, the upper wirings 17 (first wiring portions 17A and second wiring portions 17B), the first contacts 22 and the second contacts 23 of the fuses 20, and the lower wirings 18 are formed at the same time. The fuses 20, each constituted of the conductor 21, the first contact 22, and the second contact 23, are thereby obtained.

Figure 23D:
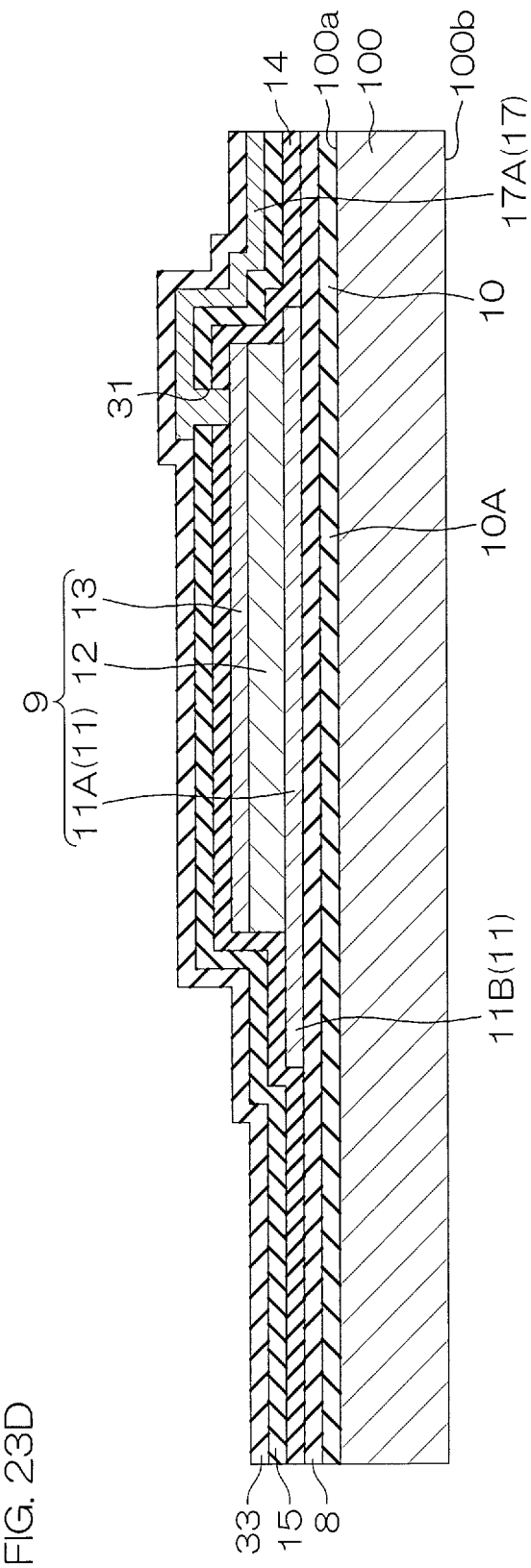
FIG. 23D is a sectional view of a step subsequent to that of FIG. 23C.

Next, as shown in FIG. 23D and FIG. 24D, the passivation film 33 that covers the upper wirings 17 and the lower wirings 18 is formed on the front surface of the insulating film 15.

Figure 23E:
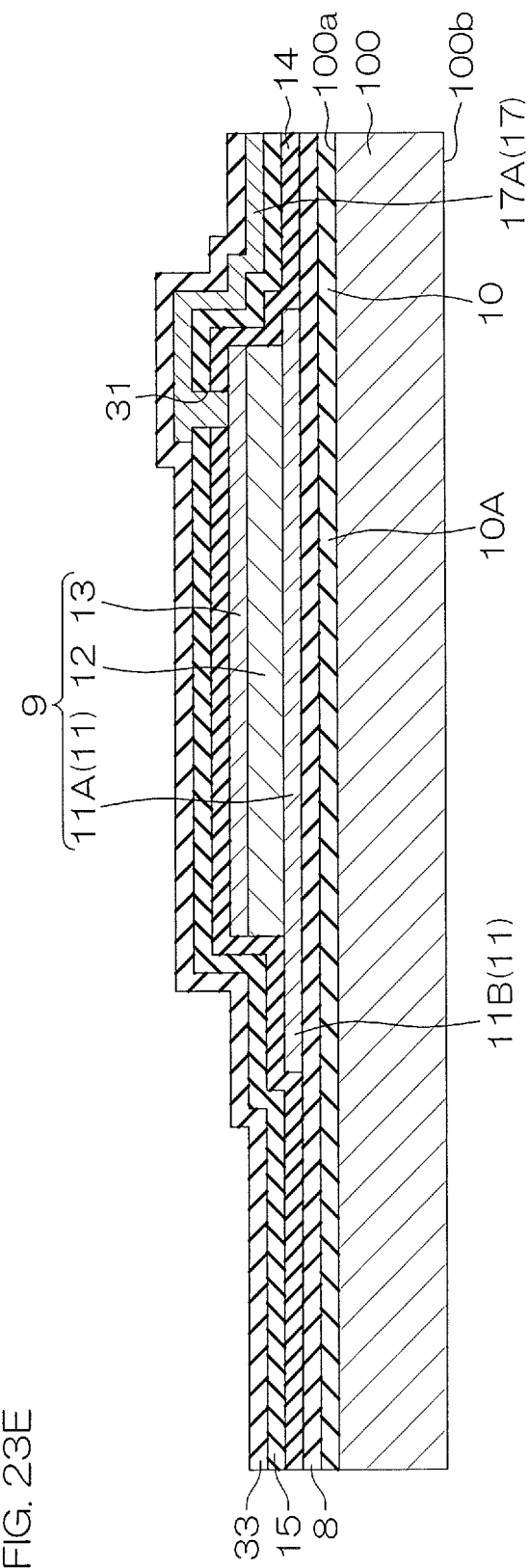
FIG. 23E is a sectional view of a step subsequent to that of FIG. 23D.

Next, a resist mask having openings corresponding to the pad openings 34 and 35 is formed by photolithography and the passivation film 33 is etched using the resist mask as a mask. The pad openings 34 and 35 are thereby formed in the passivation film 33 as shown in FIG. 23E and FIG. 24E. After the resist mask is peeled off, the upper electrode pads 42 and the lower electrode pads 43 are formed on the passivation film 33 respectively via the pad openings 34 and 35.

Figure 23F:
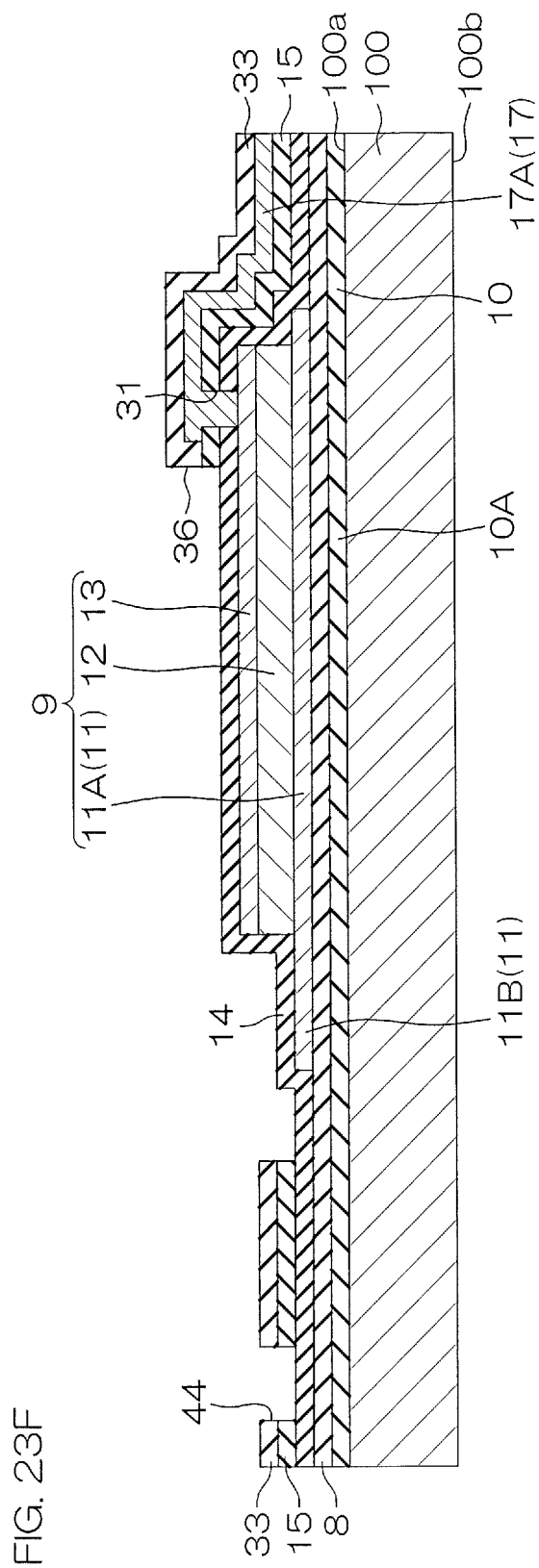
FIG. 23F is a sectional view of a step subsequent to that of FIG. 23E.

Next, a resist mask having openings corresponding to the openings 36 and the ink supplying penetrating holes 44 is formed by photolithography and the passivation film 33 and the insulating film 15 are etched continuously using the resist mask as a mask. The openings 36 and the ink supplying penetrating holes 44 are thereby formed in the passivation film 33 and the insulating film 15 as shown in FIG. 23F and FIG. 24F.

Figure 23G:
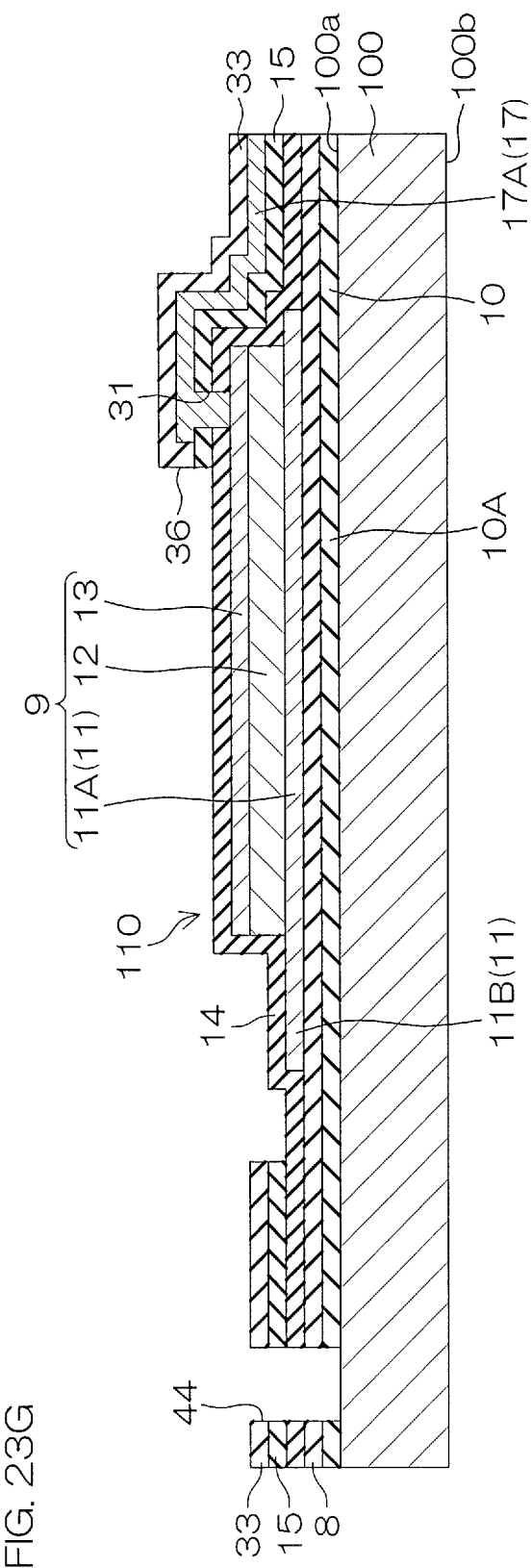
FIG. 23G is a sectional view of a step subsequent to that of FIG. 23F.
Figure 24G:
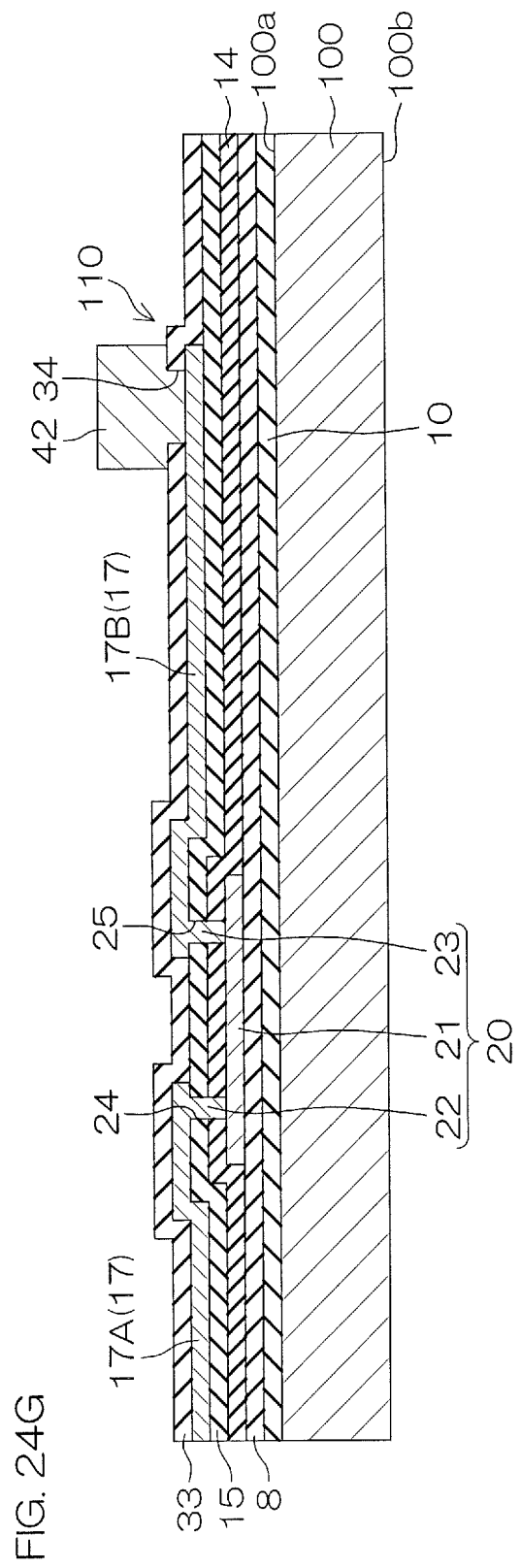
FIG. 24G is a sectional view of a step subsequent to that of FIG. 24F.

Next, the resist mask is peeled off. Then, a resist mask having openings corresponding to the ink supplying penetrating holes 44 is formed by photolithography and the second hydrogen barrier film 14, the first hydrogen barrier film 8, and the movable film formation layer 10 are etched using the resist mask as a mask. The ink supplying penetrating holes 44 are thereby formed in the second hydrogen barrier film 14, the first hydrogen barrier film 8, and the movable film formation layer 10 as shown in FIG. 23G and FIG. 24G. The substrate assembly set 110 is thereby prepared.

Figure 23H:
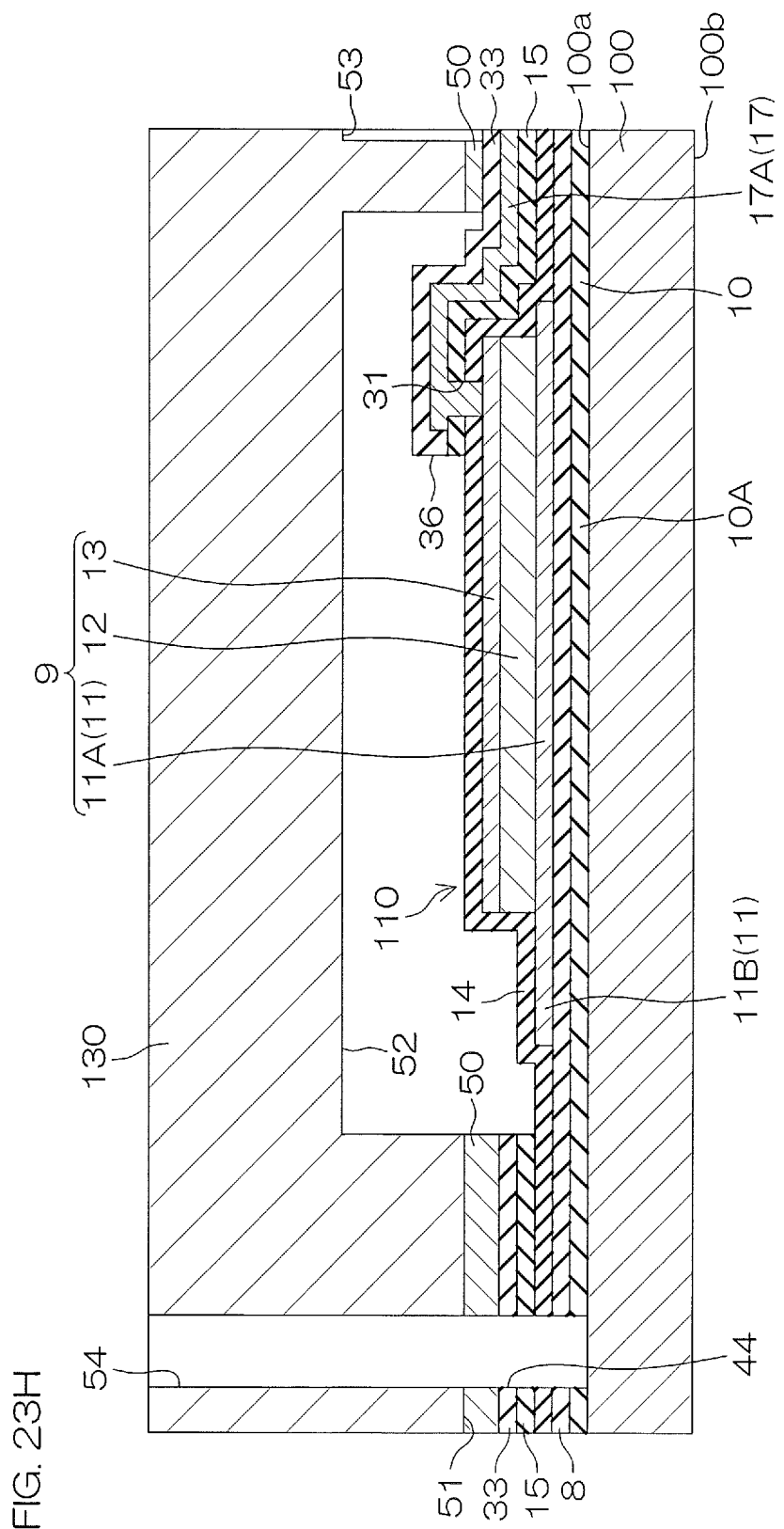
FIG. 23H is a sectional view of a step subsequent to that of FIG. 23G.
Figure 23:
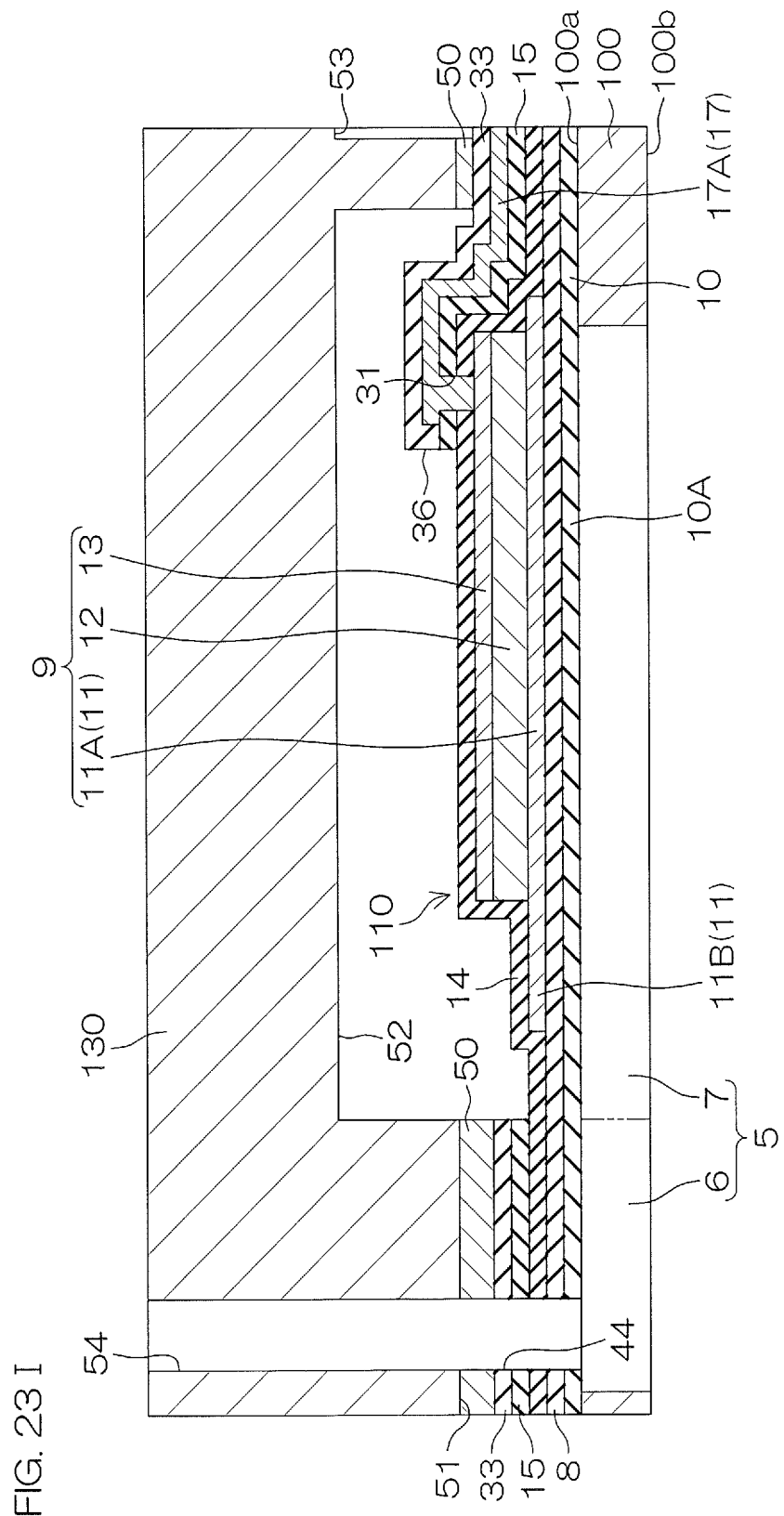
FIG. 23I is a sectional view of a step subsequent to that of FIG. 23H.
FIG. 23J is a sectional view of a step subsequent to that of FIG. 23I.
Figure 24H:
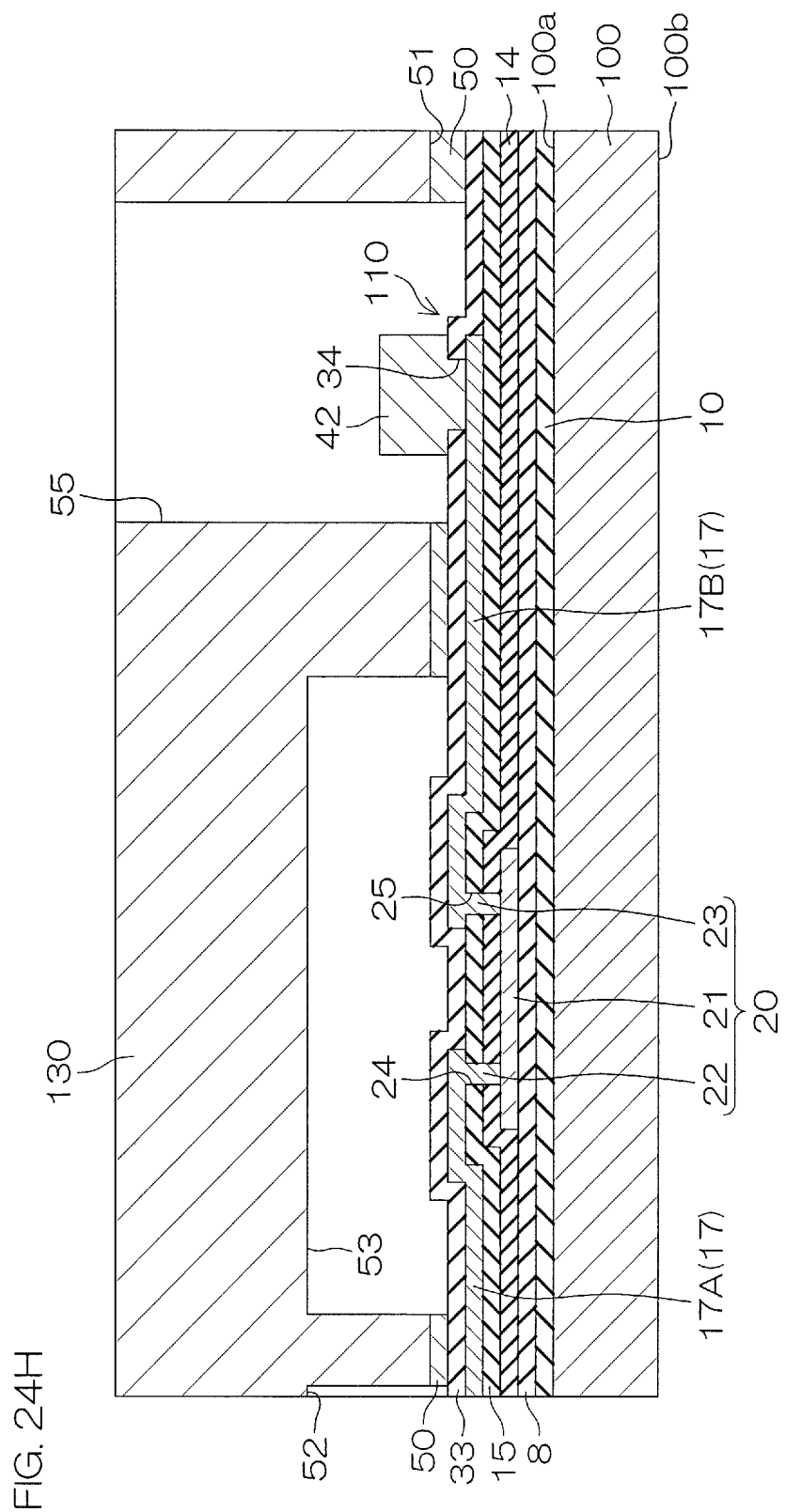
FIG. 24H is a sectional view of a step subsequent to that of FIG. 24G.
Figure 24:
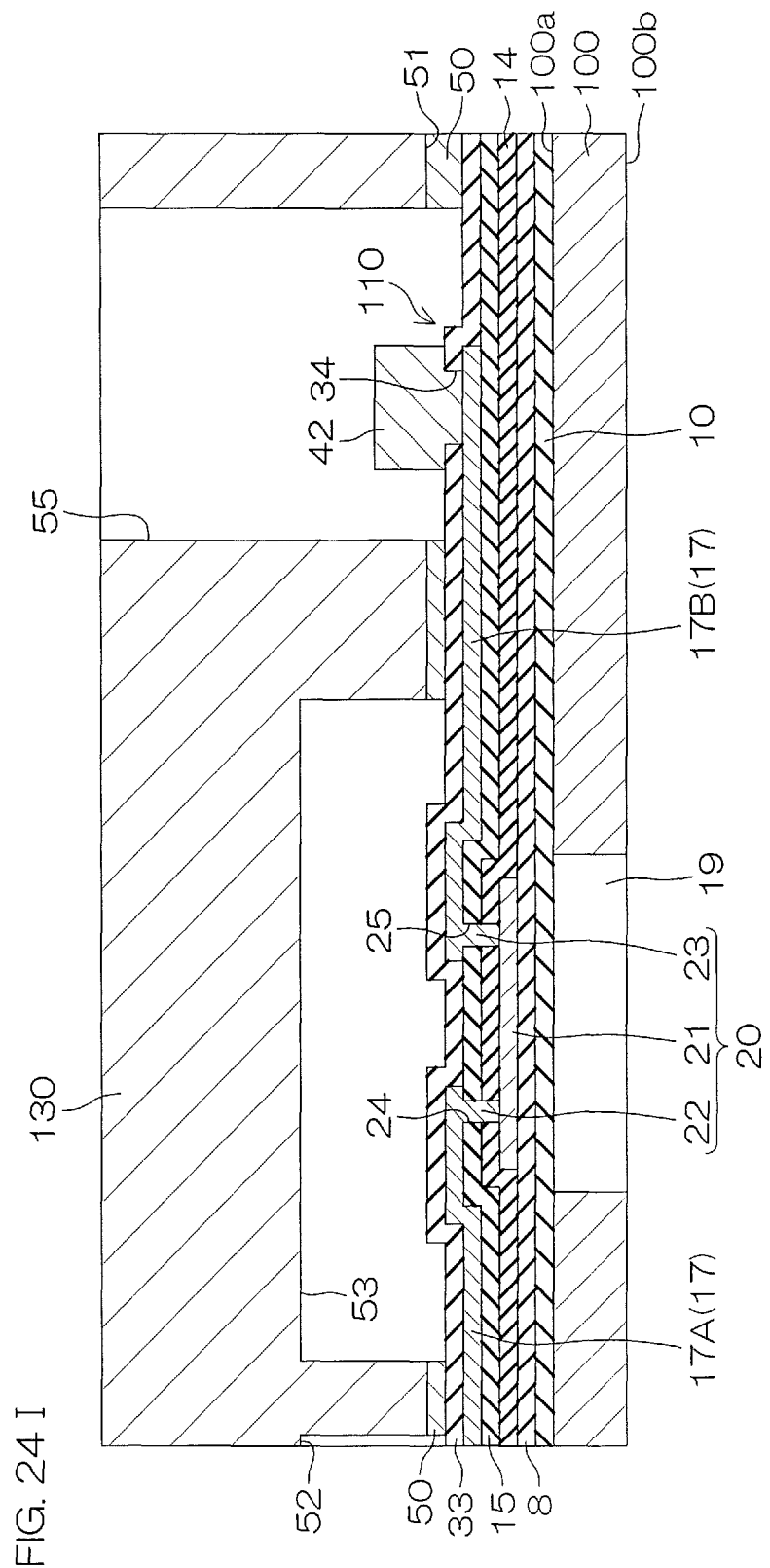
FIG. 24D is a sectional view of a step subsequent to that of FIG. 24C.
FIG. 24E is a sectional view of a step subsequent to that of FIG. 24D.
FIG. 24F is a sectional view of a step subsequent to that of FIG. 24E.
FIG. 24I is a sectional view of a step subsequent to that of FIG. 24H.
FIG. 24J is a sectional view of a step subsequent to that of FIG. 24I.

Next, as shown in FIG. 23H and FIG. 24H, the adhesive 50 is coated on the opposing surface 51 of the protective substrate set 130 and the protective substrate set 130 is fixed on the substrate assembly set 110 such that the ink supply passages 54 and the ink supplying penetrating holes 44 corresponding thereto are matched.

Next, as shown in FIG. 23I and FIG. 24I, rear surface grinding for thinning the actuator wafer 100 is performed. Film-thinning of the actuator wafer 100 is performed by the actuator wafer 100 being ground from the rear surface 100b. Thereafter, a resist mask having openings corresponding to the ink flow passages 5 (ink inflow portions 6 and pressure chambers 7) and openings corresponding to the cavities 19 is formed by photolithography on the rear surface 100b side of the actuator wafer 100 and the actuator wafer 100 is etched from the rear surface 100b using the resist mask as a mask. The ink flow passages 5 (ink inflow portions 6 and pressure chambers 7) and the cavities 19 are thereby formed in the actuator wafer 100.

Figure 23J:
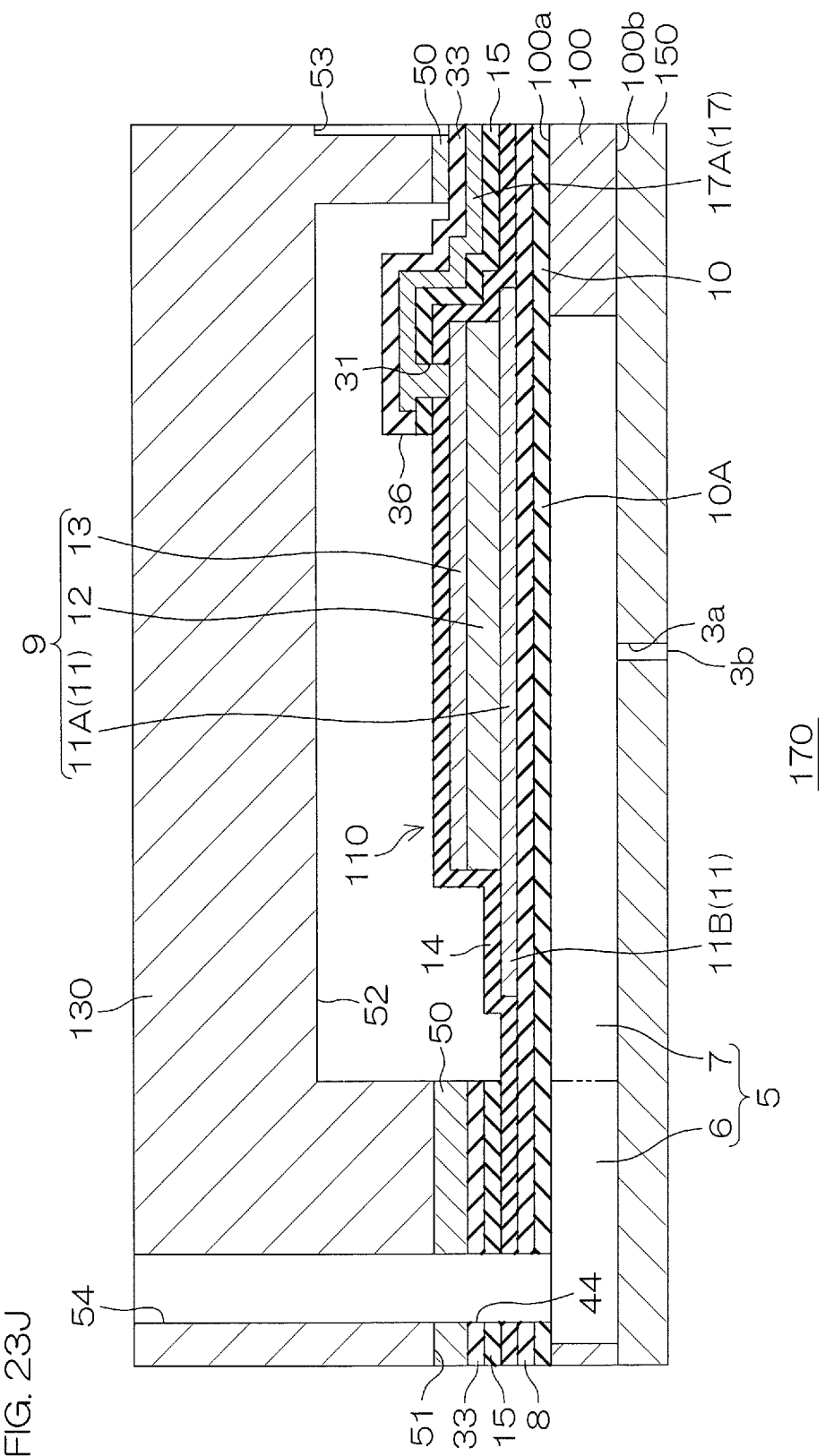
Figure 24J:
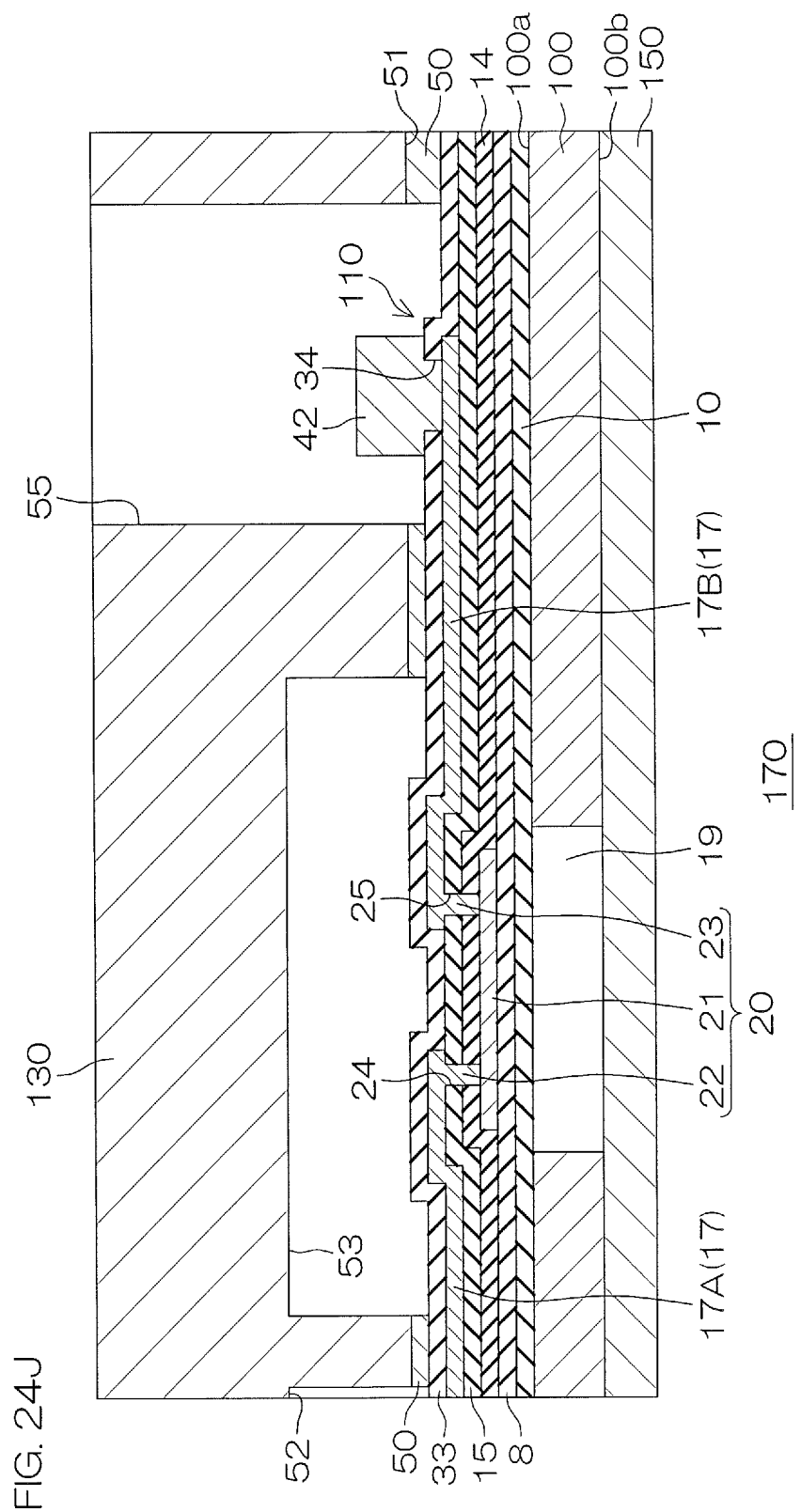

Thereafter, as shown in FIG. 23J and FIG. 24J, the nozzle substrate set 150 is bonded to the rear surface 100b of the actuator wafer 100. The inkjet print head set 170 that is constituted of the substrate assembly set 110, the protective substrate set 130, and the nozzle substrate set 150 is thereby obtained. Thereafter, the inkjet print head set 170 is cut along the intended cutting lines 103 by a dicing blade. That is, a step for cutting out the inkjet print heads 1B individually is performed.

When this step is completed, the actuator wafer 100 in the substrate assembly set 110 becomes the actuator substrate 2 of each individual inkjet print head 1B. Also, the protective substrate set 130 becomes the protective substrate 4 of each individual inkjet print head 1B. Also, the nozzle wafer 140 in the nozzle substrate set 150 becomes the silicon substrate in the nozzle substrate 3 of each individual inkjet print head 1B. Individual pieces of the inkjet print heads 1B, each having the structure shown in FIG. 19 to FIG. 22B, are thereby obtained.

Although the preferred embodiments of the present disclosure have been described above, the present disclosure may be implemented in yet other preferred embodiments. Although in each of the preferred embodiments described above, the actuator substrate 2 is provided with two of the piezoelectric element columns (pressure chamber columns), just one of the piezoelectric element columns (pressure chamber column) may be provided or three or more thereof may be provided instead.

Also, although with each of the preferred embodiments described above, PZT was cited as an example of the material of the piezoelectric film, a piezoelectric material besides this that is constituted of a metal oxide as represented by lead titanate ($PbPO_3$), potassium niobate ($KNbO_3$), lithium niobate ($LiNbO_3$), lithium tantalate ($LiTaO_3$), etc., may be applied instead.

Also, the upper wiring pattern is not restricted to the pattern described above. For example, the upper wiring pattern may be a pattern such that upper wirings pass between piezoelectric elements that are adjacent in the front/rear direction.

Also, a lower wiring may be provided according to each piezoelectric element. In this case, instead of providing the fuse 20 in the intermediate portion of each upper wiring 17, a fuse may be provided in an intermediate portion of each lower wiring.

While preferred embodiments of the present disclosure were described in detail above, these are merely specific examples used to clarify the technical contents of the present disclosure and the present disclosure should not be interpreted as being limited to these specific examples and the scope of the present disclosure is limited only by the appended claims.

The present application corresponds to Japanese Patent Application No. 2020-193728 filed on Nov. 20, 2020 in the Japan Patent Office, and the entire disclosure of this application is incorporated herein by reference.

REFERENCE SIGNS LIST 1, 1A, 1B inkjet print head
2 actuator substrate
2a front surface
2b rear surface
3 nozzle substrate 3a nozzle hole
3b ink discharge port
4 protective substrate
5 ink flow passage
6 ink inflow portion
7 pressure chamber (cavity)
8 first hydrogen barrier film
9 piezoelectric element
10 movable film formation layer
10A movable film
11 lower electrode
11A main electrode portion
11B extension portion
12 piezoelectric film
13 upper electrode
14 second hydrogen barrier film
15 insulating film
17 upper wiring
18 lower wiring
19 cavity
20 fuse
21 conductor
22 first contact
23 second contact
24 contact hole
25 contact hole
26 opening
31 contact hole (upper wiring)
32 contact hole (lower wiring)
33 passivation film
34 pad opening (upper wiring)
35 pad opening (lower wiring)
36 opening (insulating film and passivation film)
41 ink flow direction
42 upper electrode pad
43 lower electrode pad
44 ink supplying penetrating hole
50 adhesive
51 opposing surface
52 first recess
53 second recess
54 ink supply passage
55 opening portion
61 first rectangular region
62 second rectangular region
71 lower electrode film
72 piezoelectric material film
73 upper electrode film
100 actuator wafer
100a front surface
100b rear surface
101 functional element formation region
102 scribe region
103 intended cutting line
110 substrate assembly set
130 protective substrate set
140 nozzle wafer
150 nozzle substrate set
170 inkjet print head set
209 dummy piezoelectric element
211 lower electrode
212 piezoelectric film
213 upper electrode
SA substrate assembly

The invention claimed is:

1. An inkjet print head comprising:
an actuator substrate that has an ink flow passage including a pressure chamber;
a movable film formation layer that includes a movable film disposed on the pressure chamber and demarcating a top surface portion of the pressure chamber;
a piezoelectric element that includes a lower electrode disposed on the movable film, a piezoelectric film formed on the lower electrode, and an upper electrode formed on the piezoelectric film;
a hydrogen barrier film that covers at least entire side surfaces of the upper electrode and the piezoelectric film among surfaces of the piezoelectric element;
an interlayer insulating film that is formed on the movable film formation layer such as to cover the hydrogen barrier film; and
a wiring that is formed on the interlayer insulating film and is connected to the piezoelectric element,
wherein a fuse is inserted in an intermediate portion of the wiring,
wherein the fuse is constituted of a conductor constituted of the same material as the lower electrode and being less in width than the wiring,
wherein the interlayer insulating film is interposed between the wiring and the fuse,
wherein the wiring has a first wiring portion and a second wiring portion that are electrically connected via the fuse; wherein further
the first wiring portion has a first end portion that is connected to the piezoelectric element and a second end portion that is connected to the fuse,
the second wiring portion has a first end portion that is connected to the fuse and a second end portion at an opposite side thereof, and
the fuse is arranged from a conductor, a first contact that penetrates the interlayer insulating film and connects the second end portion of the first wiring portion and a first end portion of the conductor, and a second contact that penetrates the interlayer insulating film and connects the first end portion of the second wiring portion and a second end portion at an opposite side to the first end portion of the conductor.

2. The inkjet print head according to claim 1, wherein the actuator substrate has a cavity below the fuse.

3. The inkjet print head according to claim 1, further comprising:
a passivation film that is formed on the interlayer insulating film and covers the wiring.

4. The inkjet print head according to claim 1, further comprising:
a plurality of the pressure chambers, wherein
the piezoelectric element is provided according to each of the pressure chambers; and
in the actuator substrate, a plurality of pressure chamber columns, each constituted of a plurality of the pressure chambers that are disposed at intervals in a predetermined first direction, are formed at intervals in a second direction orthogonal to the first direction in plan view.

5. The inkjet print head according to claim 1, further comprising:
a protective substrate disposed on the actuator substrate such as to cover the piezoelectric element and the fuse,
wherein the protective substrate has a first cavity above the fuse, and in plan view, the first cavity is larger than the fuse and the fuse is placed inside the first cavity, and wherein further the actuator substrate has a second cavity below the fuse, and in plan view, the second cavity is larger than the fuse and the fuse is placed inside the second cavity.

6. An inkjet print head, comprising:

an actuator substrate that has an ink flow passage including a pressure chamber;

a movable film formation layer that includes a movable film disposed on the pressure chamber and demarcating a top surface portion of the pressure chamber;

a piezoelectric element that includes a lower electrode disposed on the movable film, a piezoelectric film formed on the lower electrode, and an upper electrode formed on the piezoelectric film;

a hydrogen barrier film that covers at least entire side surfaces of the upper electrode and the piezoelectric film among surfaces of the piezoelectric element;

an interlayer insulating film that is formed on the movable film formation layer such as to cover the hydrogen barrier film; and a wiring that is formed on the interlayer insulating film and is connected to the piezoelectric element;

wherein a fuse is inserted in an intermediate portion of the wiring, wherein the wiring has a first wiring portion and a second wiring portion that are electrically connected via the fuse, wherein further the first wiring portion has a first end portion that is connected to the piezoelectric element and a second end portion that is connected to the fuse;

the second wiring portion has a first end portion that is connected to the fuse and a second end portion at an opposite side thereof; and the fuse is arranged from a conductor, a first contact that connects the second end portion of the first wiring portion and a first end portion of the conductor and a second contact that connects the first end portion of the second wiring portion and a second end portion at an opposite side to the first end portion of the conductor, the wiring is an upper wiring with one end connected to the upper electrode of the piezoelectric element, a dummy piezoelectric element that is of the same structure as the piezoelectric element but does not operate as a piezoelectric element is formed on the movable film formation layer, and the conductor is an upper electrode of the dummy piezoelectric element.

7. The inkjet print head according to claim 6, wherein the hydrogen barrier film and the interlayer insulating film cover a surface of the dummy piezoelectric element.

8. The inkjet print head according to claim 7, wherein the hydrogen barrier film and the interlayer insulating film are formed at least on a portion of an upper surface of the upper electrode of the piezoelectric element;

an upper contact hole that exposes a portion of the upper surface of the upper electrode of the piezoelectric element is formed in the hydrogen barrier film and the interlayer insulating film formed on the upper surface of the upper electrode of the piezoelectric element, the first end portion of the first wiring portion enters into the upper contact hole and is connected to the upper electrode inside the upper contact hole;

a first contact hole that exposes a portion of the first end portion of the conductor and a second contact hole that exposes a portion of the second end portion of the conductor are formed in the hydrogen barrier film and the interlayer insulating film formed on the upper surface of the conductor constituted of the upper electrode of the dummy piezoelectric element;

the first contact connects the second end portion of the first wiring portion and the first end portion of the conductor via the first contact hole; and the second contact connects the first end portion of the second wiring portion and the second end portion of the conductor via the second contact hole.

9. The inkjet print head according to claim 8, wherein, if a portion of the first wiring portion that is connected to the upper electrode via the upper contact hole is an upper contact, a transverse cross-sectional area of at least one of the first contact and the second contact is less than a transverse cross-sectional area of the upper contact.

10. The inkjet print head according to claim 6, wherein a width of the conductor is less than a width of the upper wiring.

11. The inkjet print head according to claim 10, wherein the hydrogen barrier film and the interlayer insulating film cover a surface of the conductor.

12. The inkjet print head according to claim 11, wherein the hydrogen barrier film and the interlayer insulating film are formed at least on a portion of an upper surface of the upper electrode of the piezoelectric element;

an upper contact hole that exposes a portion of the upper surface of the upper electrode of the piezoelectric element is formed in the hydrogen barrier film and the interlayer insulating film formed on the upper surface of the upper electrode of the piezoelectric element, the first end portion of the first wiring portion enters into the upper contact hole and is connected to the upper electrode inside the upper contact hole;

a first contact hole that exposes a portion of the first end portion of the conductor and a second contact hole that exposes a portion of the second end portion of the conductor are formed in the hydrogen barrier film and the interlayer insulating film formed on the upper surface of the conductor;

the first contact connects the second end portion of the first wiring portion and the first end portion of the conductor via the first contact hole; and the second contact connects the first end portion of the second wiring portion and the second end portion of the conductor via the second contact hole.

13. The inkjet print head according to claim 12, wherein, if a portion of the first wiring portion that is connected to the upper electrode via the upper contact hole is an upper contact, a transverse cross-sectional area of at least one of the first contact and the second contact is less than a transverse cross-sectional area of the upper contact.

* * * * *